(12) United States Patent
Rossi et al.

(10) Patent No.: US 10,289,796 B2
(45) Date of Patent: May 14, 2019

(54) AUTOMATED PLACE-AND-ROUTE METHOD FOR HBM-BASED IC DEVICES

(71) Applicant: Synopsys, Inc., Mountain View, CA (US)

(72) Inventors: Marco Casale Rossi, Monza (IT); Uri Golan, Ganei Hadar (IL); Francesco Lannutti, Rome (IT); Claudio Rallo, Pavia (IT); Leonid Rabinovich, Tel Aviv (IL); John Chiung-Lung Chen, Mountain View, CA (US); Rajiv H. Dave, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/729,196

(22) Filed: Oct. 10, 2017

(65) Prior Publication Data
US 2018/0157782 A1 Jun. 7, 2018

Related U.S. Application Data

(60) Provisional application No. 62/430,412, filed on Dec. 6, 2016.

(51) Int. Cl.
*G06F 17/50* (2006.01)
*H01L 27/108* (2006.01)
(Continued)

(52) U.S. Cl.
CPC .......... *G06F 17/5077* (2013.01); *H01L 24/00* (2013.01); *H01L 25/0655* (2013.01);
(Continued)

(58) Field of Classification Search
USPC ........................................................ 716/119
See application file for complete search history.

(56) References Cited

U.S. PATENT DOCUMENTS

| 2009/0228857 | A1* | 9/2009 | Kornachuk | ......... G06F 17/5072 |
| | | | | 716/129 |
| 2014/0117552 | A1 | 5/2014 | Qian et al. | |
| 2018/0096931 | A1* | 4/2018 | Huang | .................... H01L 24/08 |

OTHER PUBLICATIONS eSilicon "Expand System Performance with High-Bandwidth Memory: 14-28nm HBM Gen2 Hardened PHY Solutions", pp. 1-2, 2016.
(Continued)

*Primary Examiner* — Eric D Lee
(74) *Attorney, Agent, or Firm* — Bever, Hoffman & Harms, LLP

(57) ABSTRACT

A flexible tile-based place-and-route methodology utilizes pre-generated physical layer (PHY) tiles to greatly simplify the task of automatically generating routing solutions between associated PHYs disposed on a memory device and a corresponding processor for any selected floorplan positioning of the memory device relative to the corresponding processor. The PHY tiles are pre-generated software-based layout descriptions that model the densely-packed 2D contact PHY pad arrays, and also comprise partial layout features including signal line segments that escape routing pins from the 2D contact pads to an orthogonal (straight-line) edge of the PHY tile and disposed in design-rule-compliant spaced-apart arrangements. Optional 45-degree jog line segments are utilized to efficiently correct for alignment offsets between the memory PHY and processor PHY.

17 Claims, 22 Drawing Sheets

(51) Int. Cl.
*H01L 23/00* (2006.01)
*H01L 25/065* (2006.01)

(52) U.S. Cl.
CPC ............ *H01L 27/108* (2013.01); *H01L 24/13* (2013.01); *H01L 24/16* (2013.01); *H01L 24/81* (2013.01); *H01L 2224/13101* (2013.01); *H01L 2224/16225* (2013.01); *H01L 2224/73253* (2013.01); *H01L 2224/81191* (2013.01); *H01L 2924/15192* (2013.01); *H01L 2924/15311* (2013.01)

(56) References Cited

OTHER PUBLICATIONS

K. Tran "Start Your HBM/2.5D Design Today", High-Bandwidth Memory White Paper, pp. 1-6, 2016.

* cited by examiner

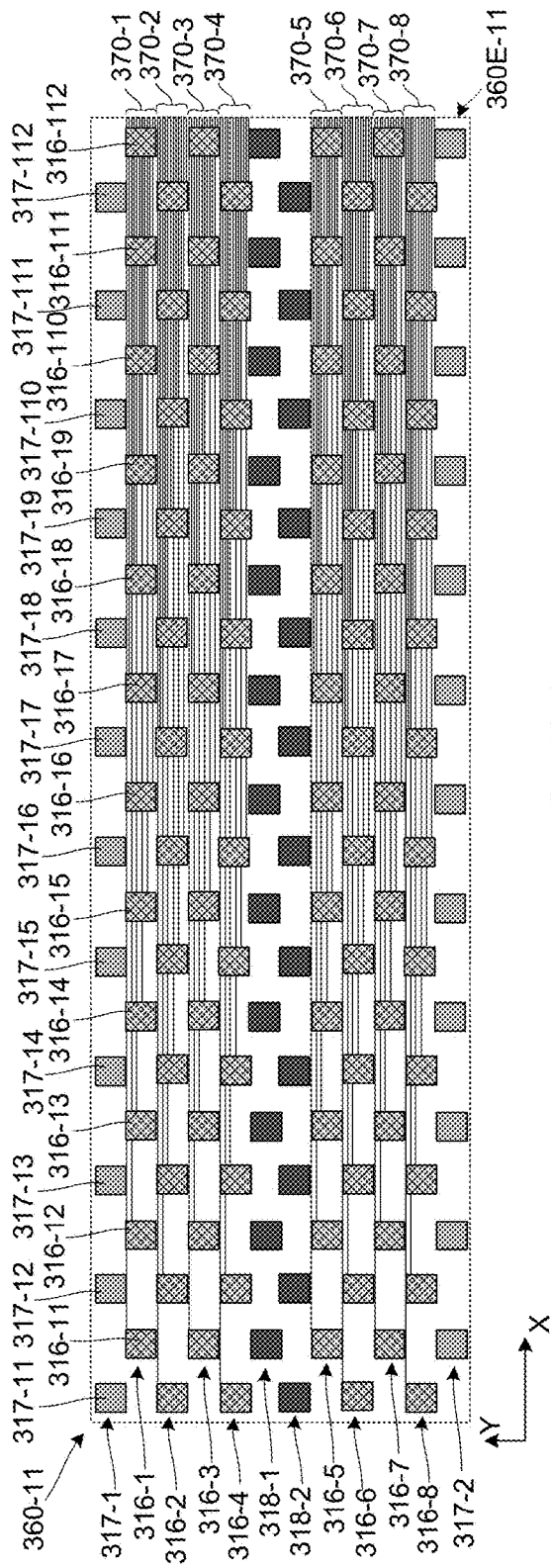
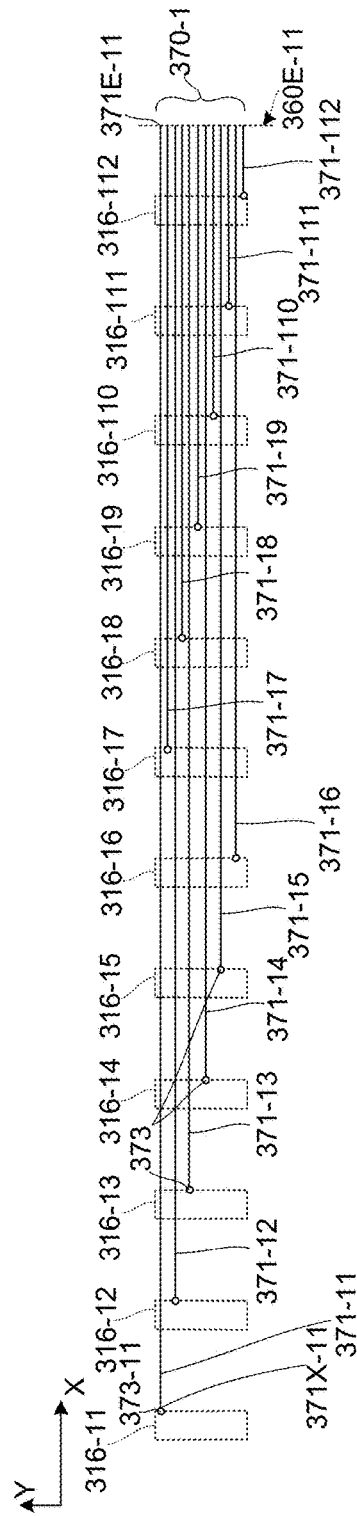
FIG. 6(B)
FIG. 6(C)

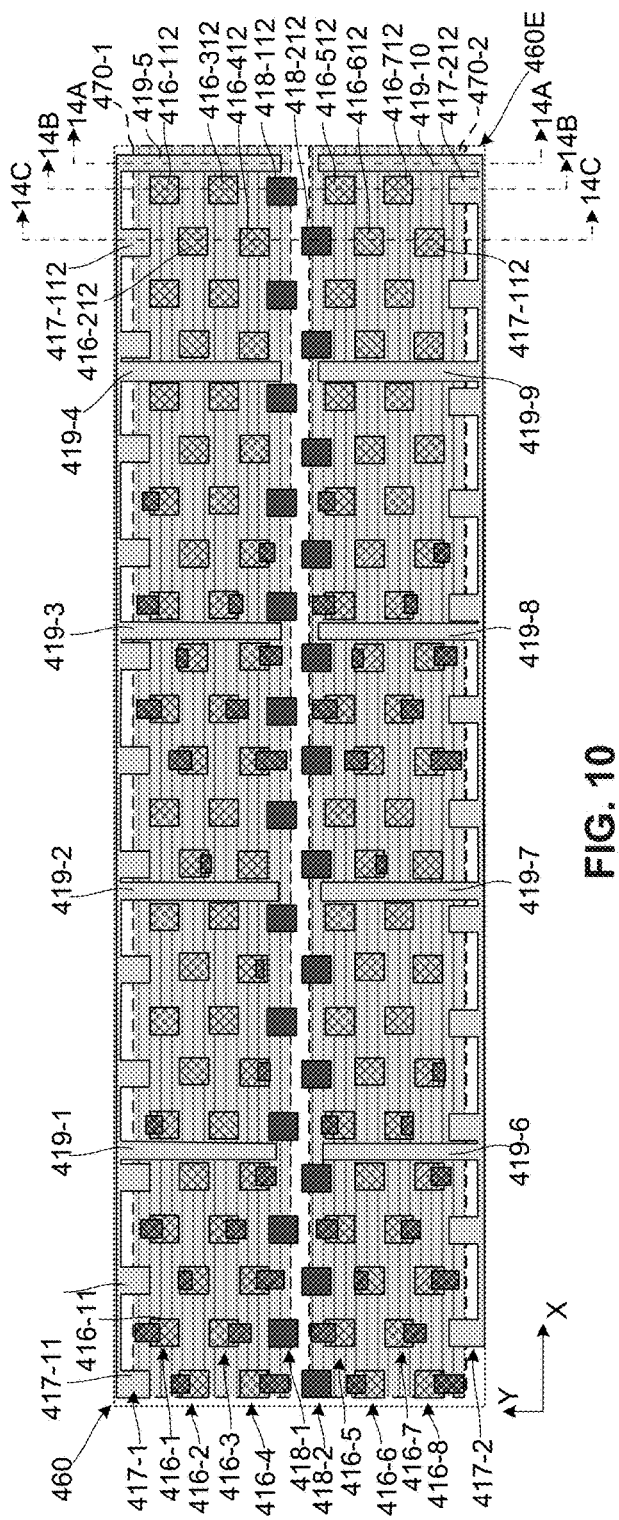
FIG. 10
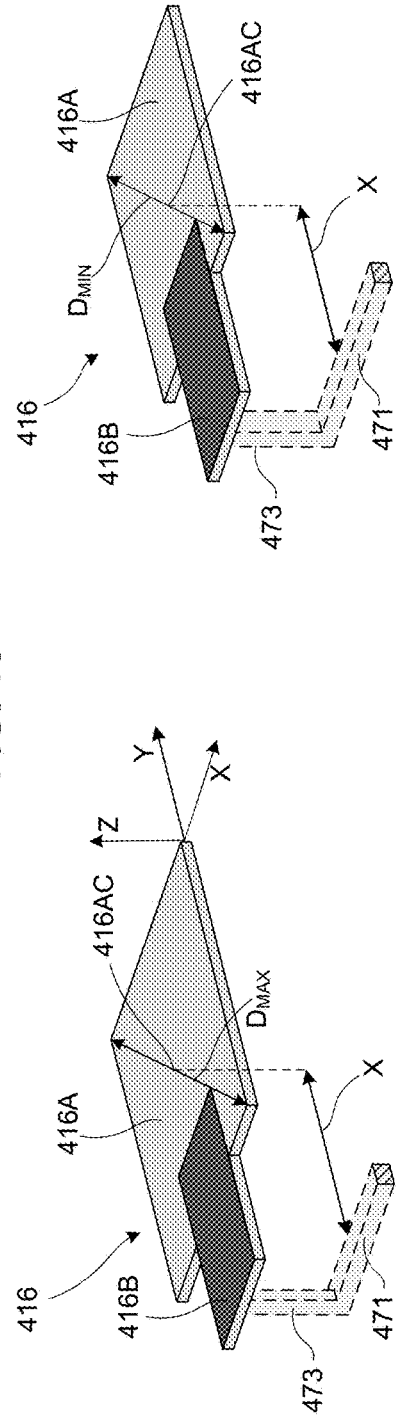
FIG. 11(A)
FIG. 11(B)

AUTOMATED PLACE-AND-ROUTE METHOD FOR HBM-BASED IC DEVICES

RELATED APPLICATIONS

This application claims priority from U.S. Provisional Patent Application 62/430,412, entitled "Method For Automating The Routing Of One Or More HBM PHY To Their Corresponding Processor PHY Onto A Silicon Interposer Awaiting Pre-Ranking", which was filed on Dec. 6, 2016, and is incorporated by reference herein.

FIELD OF THE INVENTION

The present invention relates to multi-chip semiconductor packaging technologies in which two integrated circuit (IC) devices are mounted on associated contact pad arrays that connected by signal lines formed on an interconnect structure, and more particularly to automated place-and-route methodologies utilized to automatically determine a routing pattern for the signal lines between associated contact pads of the two arrays.

BACKGROUND OF THE INVENTION

Current consumer electronic IC devices typically include one or more high-speed memory circuits (e.g., Dynamic Random Access Memory (DRAM) devices) and one or more data processing circuits (e.g., a Central Processing Unit (CPU), a Graphics Processing Unit (GPU), an Application Processor Unit (APU), or a Network Processor Unit (NPU)). The memory and data processing circuits (processors) are typically fabricated on separate semiconductor die (chips) using two different semiconductor fabrication processes in order to minimize overall manufacturing costs, and the separate memory and processor chips communicate with each other by way of signal lines formed on an interconnect structure. In most cases the memory and processor chips are combined in a single multi-chip package, whereby the interconnect structure is implemented using a substrate that is designed and fabricated using techniques similar to those used in the production of printed circuit boards.

Several random-access memory (RAM) interface technologies have been developed to facilitate data transmissions between memory and processor chips. Each of the RAM interface technologies, such as DDR4 or GDDR5, have standardized communication protocols that are implemented by way of interface circuits, typically referred to as physical layers or "PHYs", which are incorporated into (i.e., fabricated as part of) each memory and processor chip and coupled by way of an intervening interconnect structure. For example, data transferred from the memory chip is first transferred to the memory chip's PHY, then from the memory chip's PHY onto signal lines of an intervening interconnect structure, then from the signal lines through the processor chip's PHY, and finally to the processor circuit. Each PHY receives signals from or transmits signals to an array of contact pads that are disposed in a standardized (predetermined) pattern on the external surface of the multi-chip substrate. The interconnect structure (e.g., a multi-chip substrate) typically includes a corresponding set of interconnect contact pads, which are arranged patterns that mirror the contact pads of the memory and processor PHYs, and signal lines that connect corresponding pairs of interconnect contacts pads, whereby operable connection of memory and processor chips is achieved by way of connecting their respective contact pads to the interconnect contact pads using, for example, solder bumps or other known technique. With this arrangement, an IC device producer is able to reliably combine a selected processor chip with memory chips obtained from different sources, provided the memory chips' PHY is configured using the same RAM interface technology as that of the processor's PHY, which can lead to lower manufacturing costs (i.e., by allowing the IC producer to purchase memory chips from one of several suppliers that is offering the lowest per-chip price) and potential supply-chain-related production delays (i.e., by allowing the IC producer to purchase memory chips from a secondary supplier when a main supplier cannot meet current demand).

The ongoing evolution of consumer electronics requires the continuous development of inexpensive IC devices capable of processing ever-increasing amounts of data at ever-faster processing rates. As advances in semiconductor fabrication processes provide memory and processor chips capable of increasingly faster operating speeds, there is a growing consensus that existing RAM interface technologies may cause the main bottleneck to future improvements in IC device performance.

High Bandwidth Memory (HBM) is a relatively new RAM interface technology that was developed to circumvent the anticipated problems presented by established RAM interface technologies. HBM provides access to larger amounts of memory—currently, up to 16 GB—at faster data throughput—currently 1 to 2 TB/s—than current RAM interface technologies. HBM achieves high capacity by way of a stacked memory chip configuration including two or more memory die mounted on a communication die (referred to herein as an "HBM stack"), and achieves high throughput by way of an ultra-wide communication lane (i.e., 1,728 data signal wires connected in parallel between corresponding PHYs provided on each HBM stack and the host processor).

Although HBM promises at least temporary relief from the impending RAM interface technology bottleneck, implementation of HBM's wide ultra-wide communication lane presents both physical implementation challenges and place-and-route challenges to current IC device manufacturing technologies.

The physical implementation challenge presented by HBM technology is typically addressed by utilizing one or more silicon interposers. That is, a typical HBM-based IC device is a multi-chip-package assembly including a centrally positioned host processor die (e.g., a GPU, a CPU, an APU, or an NPU, collectively referred to below as "xPU") and two to eight HBM stacks positioned along opposing side edges of the xPU die. With this arrangement, the required interconnect structure must provide, for each HBM stack, a first set of 1,728 interconnect contact pads configured for connection to the HBM stack's PHY, a second set of 1,728 interconnect contact pads configured for connection to an associated PHY on the xPU, and 1,728 signal lines connected between associated contact pads of the two sets. This arrangement is further complicated by optional ground lines that may be disposed between the signal lines. Because currently available packaging technology does not provide package substrates capable of handling such a large number of signal connections, most current HBM device developments involve the use of silicon interposers. Similar to conventional package substrates, silicon interposers are "passive" substrates that do not include active elements (e.g., transistors), only patterned metal signal lines and contact pads that are formed on opposing (i.e., topside and backside) surfaces of a base substrate (i.e., in the case of silicon interposers, a silicon chip), with through-silicon vias (TSVs) that pass through the silicon chip to connecting selected topside signal lines with selected backside signal lines. Unlike package substrates, silicon interposers are fabricated using the same semiconductor processing techniques utilized in IC devices, whereby the line width and spacing of wires formed on a silicon interposer are substantially smaller than those available on current package substrates, thereby facilitating the implementation of HBM's ultra-wide communication lanes. In HBM-based IC devices, the HBM-to-xPU interconnect is typically implemented using only topside metal layers, and the TSVs are utilized for signals transmitted from, e.g., test circuits of the HBM stack and processed data generated by the xPU to an outside system by way of bumps connected to the backside contact pads.

Although silicon interposers are capable of physically implementing HBM's wide ultra-wide communication lane, a second challenge to producing low-cost HBM-based IC devices is the ability to efficiently achieve an interconnect structure routing solution for a given device configuration (placement) using current commercially available automatic routing tools.

The function of an automatic routing tool during place-and-route challenge is illustrated using a greatly simplified example shown in FIGS. 19(A) and 19(B), which depict two ICs 40-1 and 40-2 and an interposer 50, where IC 40-1 includes a three-by-three array of contact pads 41-1, and IC 40-2 includes a corresponding three-by-three array of contact pads 41-2. To generate a functioning IC device, interposer 50 is fabricated according to a layout arrangement generated by a place-and-route tool such that, when ICs 40-1 and 40-2 are mounted on interposer 50 by way of solder balls/bumps 60-1 and 60-2, circuits 49-1 and 49-2 (shown in FIG. 19(B)) are able to communicate by way of contact pads 41-1 and 41-2. The function of the automatic routing tool during the place-and-route process is to generate a pattern of conductive structures (e.g., metal contact pads 51-1 and 51-2 and intervening signal lines 53, shown in FIG. 19(B)) that operably connect each contact pad 41-1 of IC 40-1 with an associated contact pad 41-2 of IC 40-2. The place-and-route process generally begins with a floorplanning phase during which a mounting locations 50-1 and 50-2 (i.e., a "footprint" regions of upper interposer surface 50U occupied by the physical ICs) are selected for ICs 40-1 and 40-2, respectively. Placement typically involves establishing corresponding arrays of contact pads 51-1 and 51-2 inside footprints 50-1 and 50-2, respectively, where contact pads 51-1 and 51-2 are arranged in a mirror pattern to contacts 41-1 and 41-2, respectively, whereby surface mounting during device production is facilitated by way of solder bumps 60-1 and 60-2 (e.g., as illustrated in FIG. 19(B)). Note that the location and pattern of contact pads 51-1 and 51-2 are determined by locations of footprints 50-1 and 50-2, respectively, and by the corresponding fixed pattern of contact pads 41-1 and 41-2. Referring to FIG. 19(B), at this point the automatic routing tool is utilized to generate signal line paths (referred to as "nets" in the industry) that operably connect associated end points (referred to as "pins" in the industry), where the pins to be connected by each net are defined at one end by a contact pad 51-1, and at the other end by an associated contact pad 51-2.

FIGS. 20(A) to 20(D) illustrate in greatly simplified form a typical problem encountered by current commercially available automatic routing tools when providing a routing solution between two sets of pins 52-1 and 52-2 disposed in two-dimensional (2D) planar arrays with both 2D arrays disposed in the same X-Y plane. FIG. 20(A) is a plan view showing the simplified example introduced above, and illustrates an exemplary pattern of nets 53 that must be provided between pins 52-1 and 52-2 by an automatic routing tool, where pins 52-1 and 52-2 in this case are established by the arrays of contact pads 51-1 and 51-2 disposed in footprint regions 50-1 and 50-2, respectively. Note that the pins 52-1 and 52-2 (i.e., routing end points) are indicated by circles in the middle of each contact pad, and the required nets 53 (i.e., signal line connections between associated pins) to be provided by the automatic routing tool are indicated by curved dashed lines. Note that, for purposes of simplification only, this example assumes that the contact pads and all signal lines must be disposed in a single layer (i.e., on upper surface 50U, shown in FIG. 19(A)). FIG. 20(B) shows exemplary early progress by an automatic routing tool in generating initial signal lines 54 between the nets of associated contact pads in the innermost columns of arrays 50-1 and 50-2, and FIG. 20(C) shows subsequent progress by the routing tool to generate secondary signal lines 55 between the nets of associated contact pads disposed in the central columns of arrays 51-1 and 50-2 such that secondary signal lines 55 do not conflict with signal lines 54. FIG. 20(D) shows in simplified form a conflict that can arise when the routing tool attempts to generate additional signal lines 56 between the nets of contact pads in the outer columns of arrays 50-1 and 50-2. Specifically, due to the earlier assignment of routing resources (space) to signal lines 55, the only space available for generating signal lines 56 may produce offset violations OV (indicated by the dashed-line oval regions) between associated portions of signal lines 55 and 56, where a minimum spacing between two metal structures is established by design rules defined by the selected fabrication process, and each offset violation OV is generated when a spacing between the indicated portions of lines 55 and 56 is less than the minimum spacing. The occurrences of such offset violations and other conflicts are addressed by way of reconfiguring the routing solution (i.e., adjusting or repositioning one or more signal lines) to remove the conflict. However, when the automatic routing tool encounters such conflicts during generation of a routing solution between two densely-packed contact pads arrays, such as in HBM-based devices, such adjustments may generate other conflicts, requiring additional adjustments. As mentioned above, for each HBM stack, the required routing solution must provide 1,728 electrically isolated signal lines (i.e., metal wires entirely separated from adjacent wires by an insulating or dielectric material) that are coupled at opposing ends to two sets of contact pads. According to the JEDEC-established HBM contact pad arrangement, the 1,728 contact pads are arranged in 144 rows (i.e., with twelve contact pads in each row), with vertical spacing between rows of a little over 25 microns±10%. Due to the large number of contact pads closely spaced nets, it is easy to understand how automatic routing tools can require significant amounts of time to generate a routing solution, particularly when conflicts arise between the closely spaced signal lines.

Moreover, the routing solution problem mentioned above is further complicated in HBM-based IC devices by the addition of ground lines that extend in parallel with the signal lines. To provide connections to such a large number of densely-packed contact pads, conventional routing solutions call for relatively narrow signal lines (i.e., to maximize wire-to-wire spacing in order to minimize cross-talk). However, depending on relative placement of the HBM and xPU, the contact-pad-to-contact-pad length of the signal lines can be 5 mm, or even longer, which promotes the use of relatively wide signal lines to reduce resistance and associated signal loss. To facilitate relatively wide signal lines while minimizing cross-talk, current HBM-based IC devices sometimes include ground wires or planes that separate the signal lines. Accordingly, the routing solution may have to accommodate as many as 3,600 wires for each HBM-PHY-to-xPU-PHY connection. Moreover, because each HBM-based IC device can include up to eight HBM stacks, an HBM-PHY-to-xPU-PHY routing solution may be required to provide a total of nearly 29,000 HBM-to-xPU wires in a very small space.

Further, in cases where placement produces Y-axis alignment offsets (i.e., mismatches between the HBM stack and host processor preclude the use of single X-axis signal lines), a Manhattan-distance jog or 45° jog (i.e., a wire section extending 45° to standard orthogonal signal lines) may be required. Although digital-type automatic routing tools are capable of handling the large number of nets required in HBM-based IC devices, currently available digital-type automatic routing tools are only capable of implementing Manhattan-distance jogs, which further complicates finding routing problems when Y-axis alignment offsets are present. That is, FIGS. 21(A) to 21(D) show arrays of contact pads 51-1 and 50-2 from the previous example disposed in corresponding footprints 50-1A and 50-2A, where footprint 50-2A has a Y-axis alignment offset (indicated by arrow Y1) from footprint 50-1A. In this case, the routing tool must generate nets 53A that are adjusted from the earlier example to account for the Y-axis alignment offset when providing a routing solution between pins 52 of associated contact pads 51. FIGS. 21(B), 21(C) and 21(D) show the generation of signal lines 54A, 55A and 56A, respectively, each including a Manhattan-distance jog 57 (i.e., two right-angle bends connected by vertical sections having lengths equal to the distance Y1) in order to account for the Y-axis alignment offset between the two arrays. In addition to generating potential spacing conflicts, a problem with utilizing Manhattan-distance jogs is that this approach requires a substantially larger spacing X1 than that required for 45° jogs. Unfortunately, currently available digital-type routers do not accommodate 45° jogs, and currently available analog routers do not have the capacity to deal with several thousands of signals at a time. As a result, custom, heavily manual routing solutions must be devised for each HBM-based IC device, and each manual routing solution must be re-implemented from scratch every time an even minor/small change in the floorplan (i.e., relative placement positions of the HBM stack and processor) is implemented—repeatedly generating such large scale manual routing solutions takes a heavy toll in terms of resources, and can lead to production delays that reduce profitability.

Published U.S. Patent Application US 2014/0117552 A1 discloses an Embedded Multi-Die Interconnect Bridge (EMIB) including a pre-fabricated, fixed pattern of contact pads and shielded signal lines that can be used to interconnect an HBM PHY and a corresponding xPU PHY. That is, because the positioning of the HBM contact pads relative to the xPU contact pads on an EMIB is pre-set (i.e., fixed, cannot be changed), the placement of each HBM stack relative to a host xPU is strictly determined by the EMIB. This inflexibility may become a problem in some applications where a minor shift in the relative placement of one or more HBM stacks might significantly enhance an overall IC device routing solution. That is, there is no way to shift the position of the HBM stack relative to the host processor even a minute amount to utilize package substrate area occupied by the EMIB. Therefore, while the use of EMIBs may provide a suitable interconnect solution in some HBM-based IC device configurations, a device manufacturer cannot use EMIBs when the pre-set HBM-to-processor placement restriction does not meet a desired place-and-route solution, which requires the device manufacturer to implement the time consuming manual routing approach described above.

What is needed is a place-and-route methodology capable of automatically generating routing solutions between two arrays of densely-packed contact pads, such as those found in HBM-based IC devices. In particular, what is needed is a place-and-route methodology capable of automatically generating routing solutions for any placement position of the two densely-packed arrays of contact pads using currently commercially available routing tools, thereby overcoming the deficiencies of the conventional approaches set forth above.

SUMMARY OF THE INVENTION

The present invention is directed to a flexible tile-based place-and-route methodology that utilizes pre-generated physical layer (PHY) tiles to greatly simplify the task of automatically generating routing solutions between associated PHYs disposed on a memory device and a corresponding processor for any selected floorplan positioning of the memory device relative to the corresponding processor. The PHY tiles are pre-generated software-based layout descriptions that model one or more rows of the densely-packed two-dimensional (2D) contact pad arrays required to operably connect to the memory/processor PHYs, and also comprise invariant (fixed, not changeable) partial layout features including signal line segments that escape (i.e., effectively reposition) routing pins from the 2D contact pads to an orthogonal (straight-line) edge of the PHY tile. That is, each signal line segment has a fixed end coupled to one of the interconnect contact pads, and a free end disposed on the tile edge, whereby each signal line segment provides a conductive path from the associated contact pad to the tile's edge. According to an aspect of the invention, the contact pads are configured according to established standards (e.g., JEDEC HBM standards), and the line segments are configured to comply with predetermined design rules established by the interconnect structure manufacturing facility (i.e., such that the line segments and other interconnecting structures of the PHY tiles are disposed in design-rule-compliant spaced-apart arrangements). According to another aspect, the tile edge is aligned orthogonal (perpendicular) to the row of interconnect contact pads (e.g., when the interconnect contact pads are aligned parallel to an X-axis, the tile edge is aligned in a corresponding Y-axis direction), and the line segments are further configured such that their free ends are evenly spaced and arranged in a predefined order along the tile's edge. This tile arrangement greatly simplifies routing processes because the signal line segments provide pre-routed conductive paths that effectively escape (i.e., relocate or reposition) all routing pins from the 2D contact pad arrays to the free ends of the signal line segments, which are aligned in a spaced-apart arrangement on the orthogonal tile edge in a form that can be processed quickly by existing routing tools. The pre-generated PHY tiles are saved in a known standard-cell or parameterized-cell (P-cell) format such that the PHY tiles can be subsequently stored in a library used by an electronic design automation (EDA) software tool during an IC design flow process. The automatic place-and-route methodology includes placing PHY tiles into designated corresponding memory and processor footprint regions, with the contact pads of each tile positioned to occupy corresponding portions regions of the 2D contact pad arrays. The PHY tiles are also cooperatively placed such that the free ends (routing pins) of the signal line segments disposed in the memory footprint region are arranged in a mirrored order to the free ends (routing pins) of the signal line segments disposed in the associated processor footprint region. By providing two substantially mirrored tile sets in this manner, the subsequently performed routing process is greatly simplified by merely requiring the generation of parallel signal lines that connect the mirror ordered routing pins (i.e., such that the uppermost free end/pin of one tile set is connected to the uppermost free end/pin of the other set by a first signal line, the next sequential free ends/pins in the two sets are connected by a second signal line that is parallel to the first signal line, etc.), which can be performed relatively quickly by current commercially available automatic routing tools, or may be performed using a custom routing tool configured to implement a pre-designed parallel signal line routing solution. Accordingly, the modified place-and-route methodology of the present invention enhances computer processing efficiency (i.e., reduces processing time) by way of greatly simplifying the task of generating a routing solution that interconnects two 2D arrays of densely-packed contact pads.

According to another embodiment of the present invention, the present invention is also directed to PHY tiles configured in accordance with the above description, and to a modified EDA software tool configured to implement the above-mentioned tile-based place-and-route methodology using a software library including one or more of the PHY tiles. In a practical embodiment of the present invention, the EDA tool is configured for use during the design of IC devices, and in particular to generate an interconnect structure capable of facilitating massively parallel communications between a PHY disposed on a memory device and an xPU PHY disposed on a processor (xPU) chip using a selected RAM interface technology (e.g., HBM1 or HBM2). As set forth above, the PHY tiles are pre-generated for selected RAM interface technology, and also to comply with established design rules that are determined by the fabrication process used to fabricate interconnect structures from the completed interconnect layout. For example, for an HBM-based IC device in which the interconnect structure will be produced using a selected silicon interposer fabrication process (e.g., a process including four topside metal layers and design rules including 0.4 µm (micron) minimum feature widths and 1 µm minimum gap spacing), the PHY tiles are generated with contact pads arranged in accordance with JEDEC-established HBM standards, and the interconnect line segments are sized and spaced in a manner that conforms with the selected silicon interposer fabrication process's design rules. The PHY tiles are then stored in a standard cell or other software library in a format that is usable by an EDA tool. The EDA tool includes design planning and physical implementation tools that automate the design and fabrication of an interconnect structure layout capable of supporting communications between a selected memory device(s) (e.g., one or more HBM stacks) and a selected processor chip using the selected RAM interface technology. Specifically, the EDA tool includes a floorplanning tool that enables a circuit designer to select optimal footprint locations for the memory devices(s) and the processor chip, a placement tool that automatically retrieves tiles from the library and places two sets of tiles in memory and processor PHY regions (i.e., portions of the two spaced-apart footprint regions of the interposer that are located directly below the PHY circuits respectively disposed on the memory device(s) and processor chip), and a routing tool that automatically generates a routing solution including signal lines connecting associated pairs of pins disposed along the facing edges of the two PHY regions. Once the tile-based place-and-route process is completed, the EDA tool completes the interconnect structure layout, then tests and corrects/refines the completed layout. The finalized completed interconnect structure layout is then stored using known techniques such that it can be subsequently utilized to generate photolithographic masks (reticles). The masks are then utilized to fabricate an actual (physical) interconnect structure using the selected silicon interposer fabrication process, and then the memory devices(s) and the processor chip are operably interconnected by way of mounting/connection to the contact pad arrays disposed in corresponding footprint regions of the physical interconnect structure. The assembly including the interconnect structure, memory devices(s) and the processor chip is then optionally mounted on a substrate.

According to another embodiment, the present invention is directed to HBM-based PHY tiles generated in a manner consistent with that described above, and stored in a form that is usable by EDA software tools to generate layout descriptions for silicon interposer-type interconnect structures utilized in production of HBM-based IC devices. In a presently preferred embodiment, each tile is configured to include 96 contact pads and 96 signal line segments, whereby each PHY tile implements and escapes one eighteenth of the 1,728 contact pads established by the current JEDEC-defined HBM standards to a corresponding tile edge. In addition, each PHY tile implements two rows of VSS contact pads and two rows of VDD contact pads, whereby each tile includes a total of twelve rows of contact pads (i.e., two VSS rows, two VDD rows, and eight data rows). With this arrangement, when eighteen PHY tiles are placed in a HBM PHY footprint region and eighteen identical PHY tiles are placed in a corresponding xPU PHY footprint region with all routing pins aligned along facing edges, all 1,728 contact pads in each of the two PHYs are relatively easily interconnected during the subsequent routing process using the parallel signal line configuration explained above. Consistent with the description set forth above, twelve signal line segments are respectively coupled to the twelve data contact pads disposed in each of the eight data contact pad rows, with each signal line segment implemented using a sub-surface metal layer and coupled to an associated contact pad by way of one or more metal via structures. In one embodiment, the six signal lines respectively coupled to the six contact pads located furthest from the tile edge are formed using a lower sub-surface metal layer than that used to form the six signal lines respectively coupled to the six contact pads located closest to the tile edge in order to avoid metal via formation conflicts while facilitating mirror ordered interconnections between a memory PHY tile and an associated xPU PHY tile. In one embodiment the two sets of signal line segments are positioned in a vertically offset arrangement to minimize capacitive coupling and cross-talk. In another embodiment, line channels containing the signal line segments are expanded to extend under adjacent VSS and VDD rows in order to accommodate shield line segments between each adjacent pair of signal line segments. To accommodate connection to signal line segments disposed outside the peripheral footprint area of a given data contact pad, at least some of the data contact pads are configured to include step-like extensions that extend the required distance from contact pad base structures, where the step-like extensions are stored as invariant features that make reliable connection to the contact pad base structure when the contact pad base structure is fabricated using any standard-compliant diameter. That is, when the PHY tiles are stored as parameterized cells (P-cells), the step-type contact pad extensions, metal vias and signal line segments are stored as invariant (fixed, not changeable) layout features, with the only variable parameter being the contact pad/microbump diameter. In addition, one or more VSS mesh structures extend from associated rows of VSS contact pads between the rows of data contact pads, and are coupled to the shield line segments by way of associated metal via structures. In a disclosed embodiment, the shield line segments facilitate both co-axial shielding (i.e., by being located between each adjacent pair of signal line segments), and also partial sandwich shielding due to an offset arrangement in which each signal line segment is disposed above/below a shield line segment, and between two shield line segments). In an alternative embodiment, four-sided shielding is implemented by way of forming additional shield line segments in the offsetting pattern respectively above and below the two layers of signal line segments.

In accordance with a practical embodiment of the present invention, the HBM-based PHY tiles described above are implemented during the design of an HBM-based IC device as follows. The process begins with a floorplanning process during which the device designer selects locations of an interposer layout for the xPU and the HBM stack(s) using a suitable place-and-route environment (e.g., such as that provided by Synopsys' IC Compiler™). Once floorplanning is completed, the floorplanned interposer layout is transferred to a custom layout environment (e.g., such as that provided by Synopsys' Custom Compiler™), where an automated procedure is executed that properly instantiates the PHY tiles into PHY footprint sub-regions of the selected xPU and HBM stack footprint regions. Routing is performed then performed between the two PHYs using one or both of a shape-based router and a Redistribution-Layer (RDL) router. In one embodiment, the shape-based router is implemented to generate a full wiring pattern required to connect the two PHYs (i.e., a complete set of parallel signal and shield lines connecting the mirror ordered routing pins disposed on the edges of the two sets of PHY tiles). In another embodiment, the shape-based router may be used to generate only a portion of the wiring (e.g., line segments that extend from the tile edges to the edges of the xPU and PHY footprint regions). For example, in cases where Y-axis alignment offsets are produced between the two PHYs by a selected floorplan, the shape-based router may be used to generate 45-degree jogs having lengths that are required to align the HBM and xPU PHYs. In other cases, modification by the shape-based router may be omitted entirely. The modified interposer layout is then transferred back into the place-and-route environment for further place and route processing (e.g., to provide interconnection paths for the Power/Test and I/O contact pads of the HBM stack and xPU) using the RDL router. In addition, in cases where the shape-based router generates only a partial routing solution between the HBM and xPU PHYs, the RDL router may be utilized to generate the required signal lines. In yet another embodiment two alternative scenarios are implemented: the first time the flow is executed it may be convenient to perform the routing in the custom layout environment using the shape-based router; however, subsequent refinement may just remove the existing routing, and re-implementing it in the place-and-route environment, using the RDL router.

BRIEF DESCRIPTION OF THE DRAWINGS

These and other features, aspects and advantages of the present invention will become better understood with regard to the following description, appended claims, and accompanying drawings, where:

FIG. 6(B) is an enlarged plan view showing an exemplary HBM PHY tile of the interposer of FIG. 6(A);

FIG. 6(C) is a simplified diagram depicting generalized contact-pad-to-wire-segment connections for one row of signal lines of the HBM PHY tile of FIG. 6(B);

FIG. 10 is a plan view showing an HBM PHY tile configured to include shield lines according to another embodiment of the present invention;

FIGS. 11(A) and 11(B) are partial perspective views depicting exemplary contact-pad-to-signal-line connections utilized in the HBM PHY tile of FIG. 10;

DETAILED DESCRIPTION OF THE DRAWINGS

Figure 1:
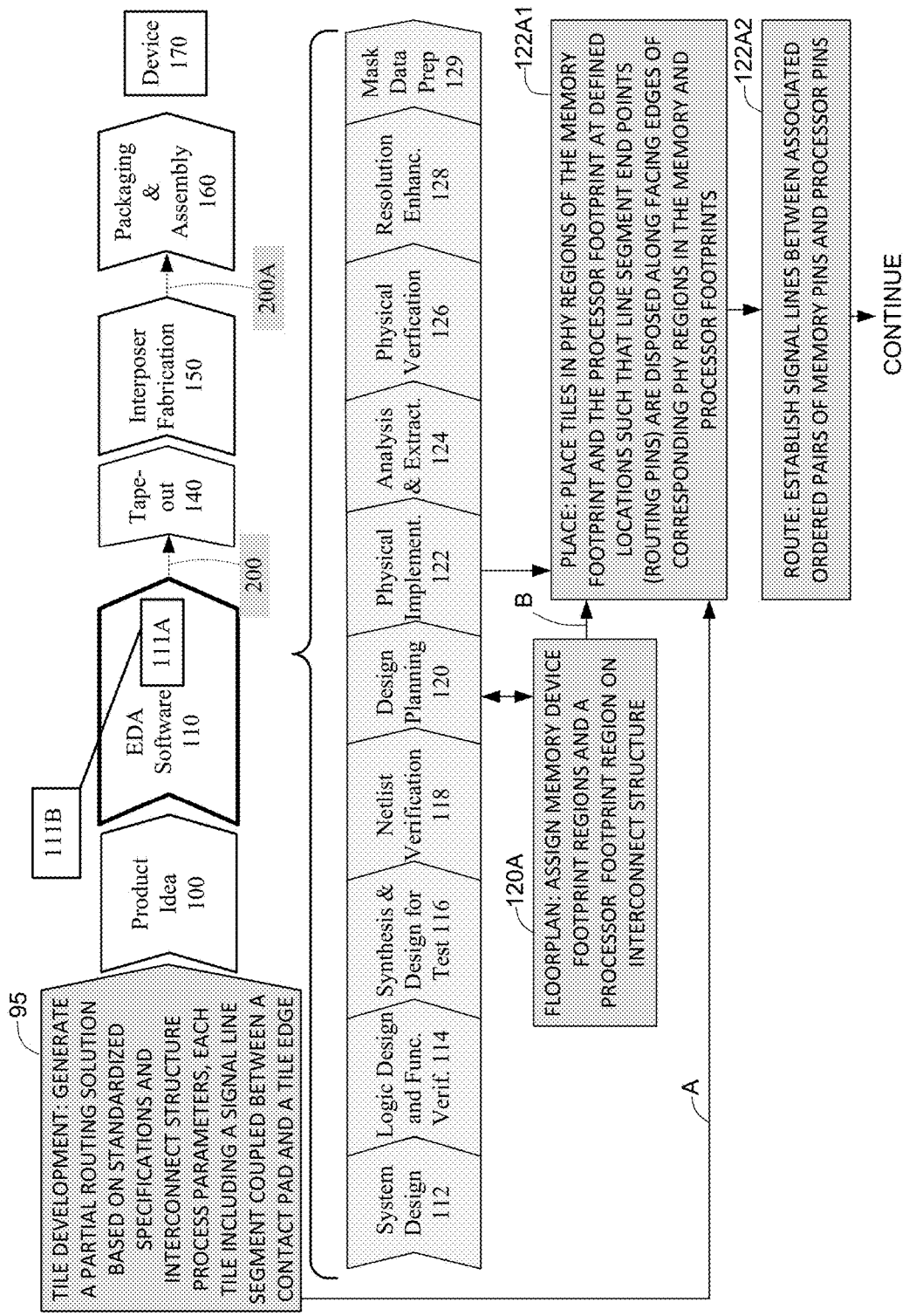
FIG. 1 shows a simplified representation of an exemplary digital IC design flow that is utilized to produce HBM-based IC devices using the tile-based place-and-route method of the present invention.

The present invention relates to an improvement in place-and-route methods for interconnecting memory and processor devices using RAM interconnect technologies that utilize massively parallel signal line busses. The following description is presented to enable one of ordinary skill in the art to make and use the invention as provided in the context of a particular application and its requirements. As used herein, directional terms such as "above", "below", "upper", "uppermost", "lower", "lowermost", "right", "rightmost", "left" and "leftmost" are intended to provide relative positions for purposes of description, and are not intended to designate an absolute frame of reference. In addition, the phrase "integrally connected" is used herein to express a connective relationship between two portions of a structure patterned or otherwise formed from a single deposited material (e.g., a single metal layer), and is distinguished from the term "connected" (i.e., without the modifier "integrally"), is used to describe a direct connection between two circuit elements or conductive structures, for example, either directly or by way of a single integral metal structure (e.g. patterned line/wire or metal via structure) that formed in accordance with normal integrated circuit fabrication techniques. In contrast, the term "coupled" is used to broadly describe either two abutting structures, a direct connection by way of a single metal structure, or an indirect connection by two or more metal structures. For example, when a single metal structure extends between two nodes, the two nodes may be referred to as either coupled or connected. In contrast, when two or more metal structures are connected in series between two nodes, then the two nodes are coupled but not connected. As used herein, the term "tile" refers to a layout design abstraction (i.e., software-based description) that, when assigned to a layout region during the generation of an interconnect structure layout, describes specific patterned metal structures (e.g., contact pads and signal line segments having specified dimensions and locations) that occupy the assigned layout region. That is, when actual (physical) interconnect structures are fabricated using a completed interconnect structure layout that was generated using one or more tiles, the actual interconnect structure includes patterned metal structures that are consistent with those defined by the one or more tiles in the layout. As such, tiles are not distinct physical structures (i.e., having discernible boundaries), but exist solely as unit layout design abstractions that, when realized in physical form, are seamlessly integrated into each fabricated interconnect structure. A simplified tile is described in graphical form with reference to FIGS. 2(A) and 2(B), and more complex exemplary tiles suitable for use in HBM-based IC devices are described in subsequent figures. In addition, various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 1 shows a simplified representation of an exemplary digital IC design flow that is utilized to produce HBM-based IC devices using the tile-based place-and-route method of the present invention. Referring to the upper portion of FIG. 1, at a high level the digital IC design process flow starts with the product idea (step 100), and then the product idea is realized using an EDA software design process (step 110), which produces a layout description 200 of the final IC or interconnect structure design to be fabricated. When the design is finalized, it can be taped-out (event 140). After tape out, the fabrication process (step 150) and packaging and assembly processes (step 160) occur resulting, ultimately, in finished devices (result 170).

As indicated to the left of block 100 in FIG. 1, a tile development process (block 95, described below) is performed at least once to provide suitable tiles that can be utilized during the EDA software design process (step 110) in the manner described below. That is, the tiles generated during tile development (block 95) may be used by the EDA software tool (block 110) to generate any number of IC devices. As explained in the description below, tiles are configured in accordance with industry standard layout specifications that are established for RAM interface technologies. Therefore, tile development may be periodically re-performed to provide tiles conforming to newly introduced RAM interface technologies, or to address updates to older RAM interface technologies.

The tile development process (block 95) is typically performed by a software tool provider as part of the development of the provider's proprietary EDA software design tool, and in particular to the portion of the design tool utilized to generate interconnect structures using the tile-based place-and-route process of the present invention. The tile development process typically involves one or more layout designers utilizing known software development tools to design one or more custom tiles for each specified RAM interface technology. Once a complete set of tiles are developed for a selected RAM interface technology (e.g., HBM1), the tiles are stored in a library that is accessible by the proprietary EDA software design tool during the development of IC devices that implement memory-to-processor communications using the selected RAM interface technology.

Figure 2A:
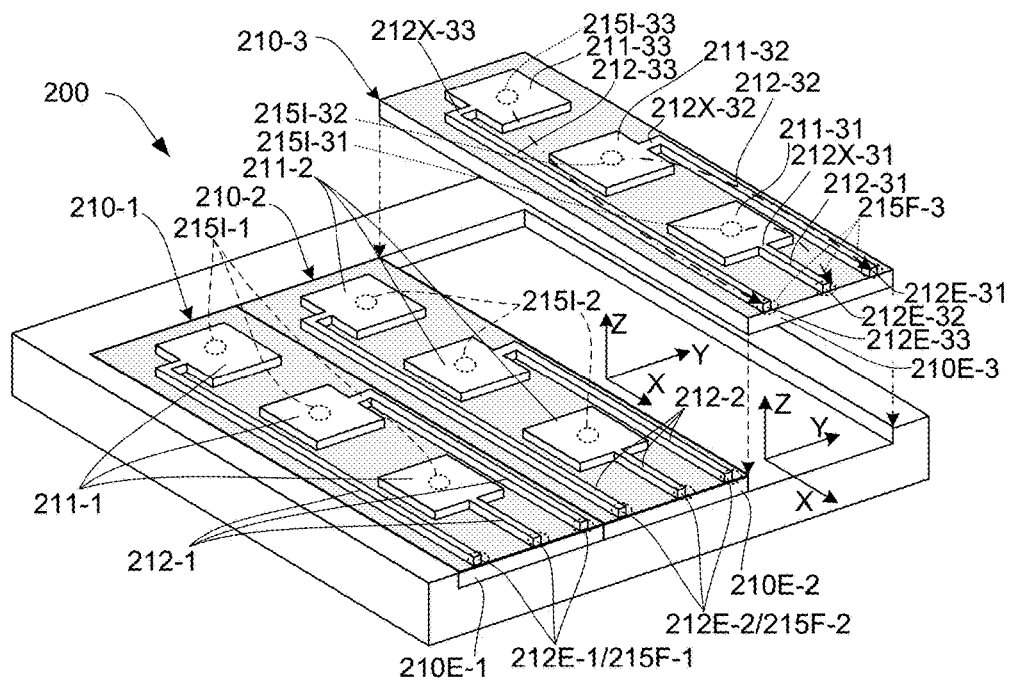
FIGS. 2(A) and 2(B) are exploded perspective views illustrating simplified tiles and the role of tile development in the tile-based place-and-route methodology of the present invention.
Figure 2B:
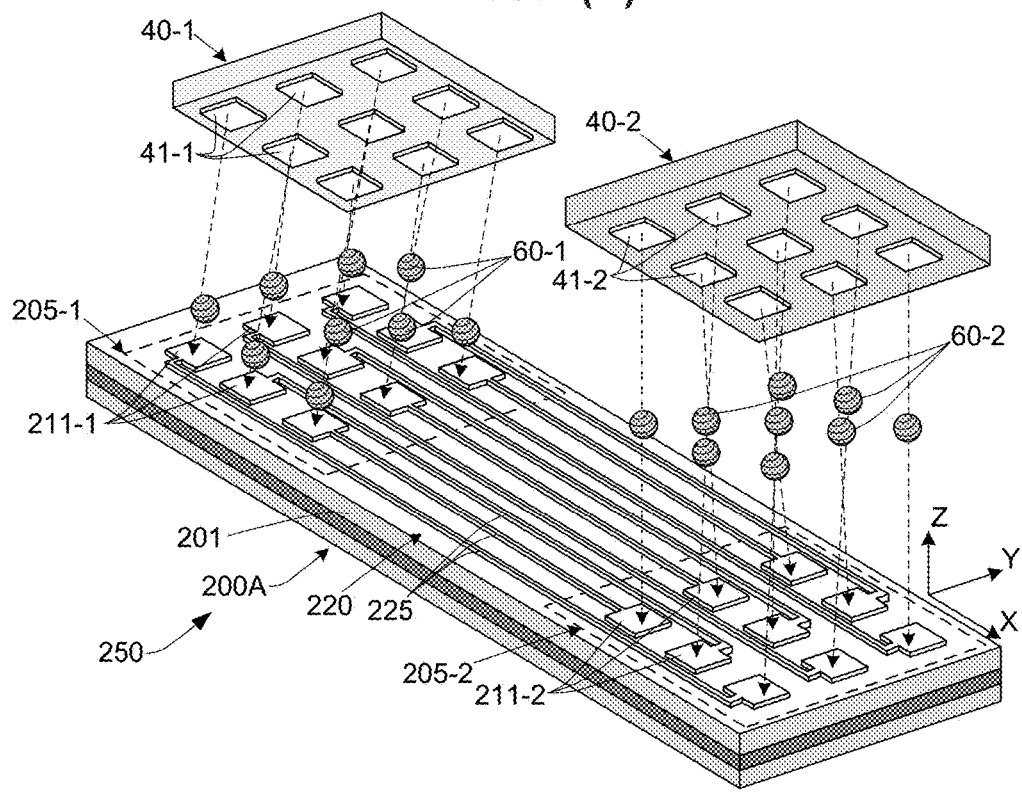
Figure 19A:
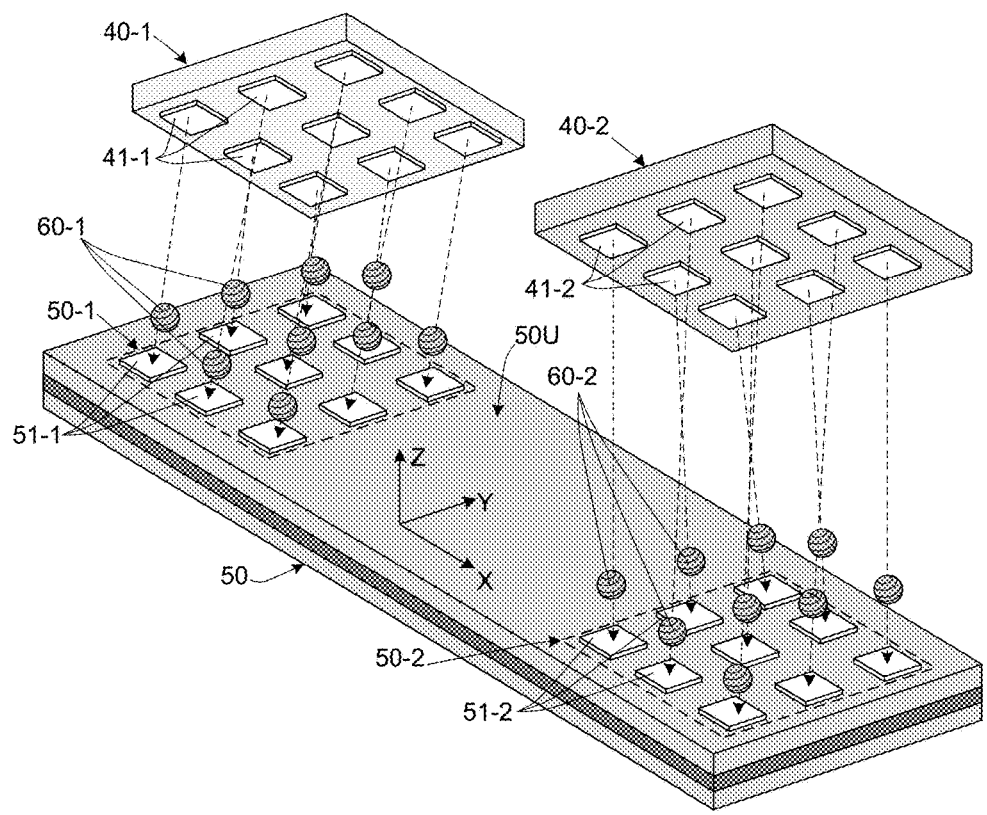
FIGS. 19(A) and 19(B) are exploded perspective and cross-sectional side views, respectively, showing a conventional interposer configuration.
Figure 19B:
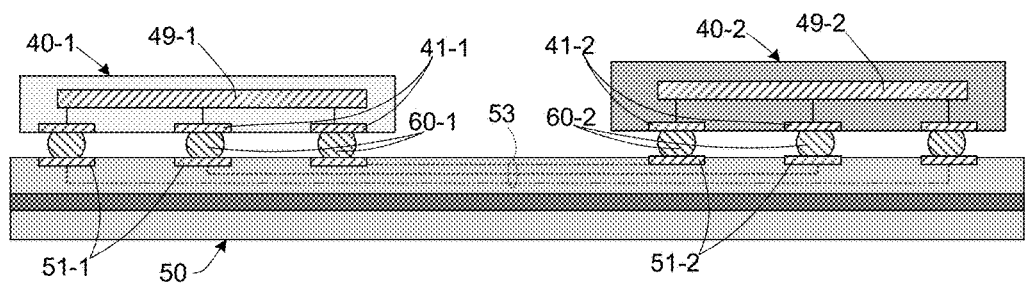
Figure 20A:
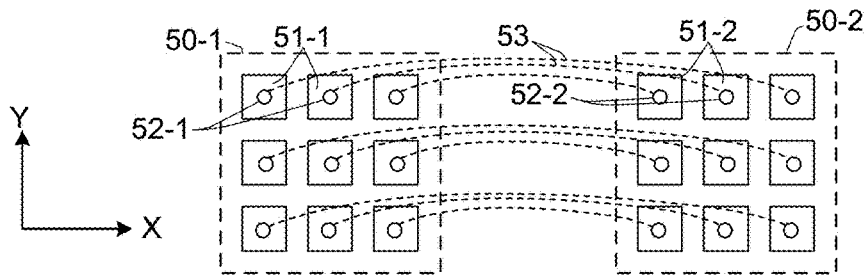
FIGS. 20(A), 20(B), 20(C) and 20(D) are simplified plan views illustrating typical problems encountered by current commercially available automatic routing tools.
Figure 20B:
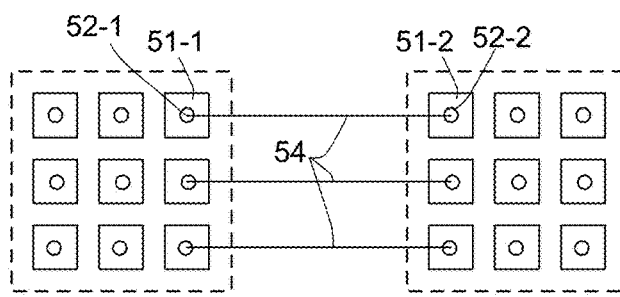
Figure 20C:
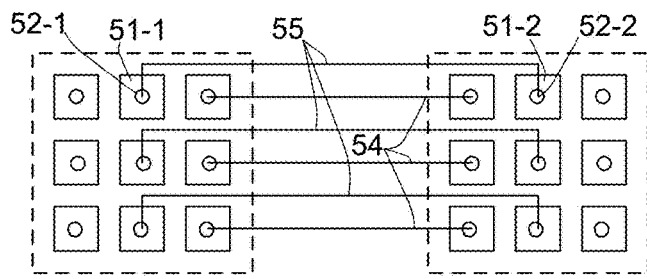
Figure 20D:
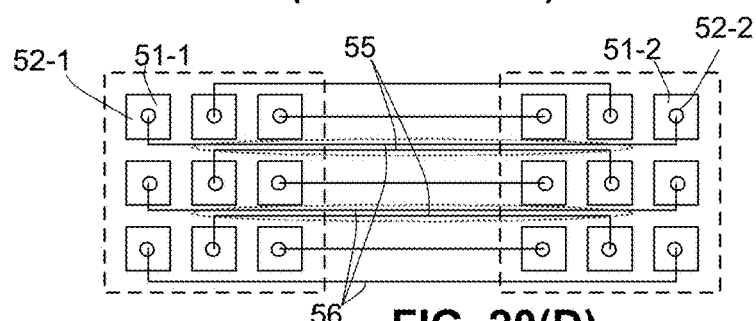

FIGS. 2(A) and 2(B) provide a greatly simplified example that illustrates both key aspects of the tiles and the role of tile development in the tile-based place-and-route methodology of the present invention. FIG. 2(A) depicts a partial interconnect structure layout 200 including three tiles 210-1 to 210-3 that include key aspects of the present invention based on the details and constraints associated with the hypothetical three-by-three (3×3) array pattern introduced above with reference to FIG. 19(A). FIG. 2(B) depicts a partially formed IC device 250 including an actual (physical) interconnect structure 200A that has been fabricated using an exemplary completed interconnect structure layout generated using the place-and-route methodology, and illustrates how the corresponding physical structures described below with reference to the generation of layout 200 are implemented in physical form and utilized during the assembly of a physical IC device 250. For purposes of utilizing the established hypothetical to describe the exemplary embodiments set forth below, IC device 40-1 represents a memory device including a first PHY that transmits data by way of a PHY contact pad array 41-1, and IC device 40-2 represents a processor device (xPU) including a second PHY contact pad array 41-2.

Referring to FIG. 2(A), the present invention differs from conventional approaches in that, instead of performing the contact-pad-to-contact-pad routing, tiles 210-1 to 210-3 are developed in accordance with the tile development process (block 95, FIG. 1), and utilized by an EDA software tool to provide partial layout solutions that are implemented during a subsequent placement process. As mentioned above, each tile 210-1 to 210-3 is a software-based layout description including one row of three interconnect contact pads, and includes three signal line segments connected between the interconnect contact pads and a designated edge of the tile. For example, tile 210-3 includes contact pads 211-31, 211-32 and 211-33 that comprise one row of the 3×3 array, and signal line segments 212-31, 212-32 and 212-33 that respectively include fixed ends 212X-31, 212X-32 and 212X-33 connected to contact pads 211-31, 211-32 and 211-33, and respectively include fixed ends 212E-31, 212E-32 and 212E-33 disposed along orthogonal (i.e., straight line) tile edge 210E-3 of tile 210-3. Similarly, tile 210-1 includes a second row of three contact pads 211-1 and associated signal line segments 212-1 that are connected between contact pads 211-1 and tile edge 210E-1 of tile 210-1, and tile 210-2 includes contact pads 211-2 and associated signal line segments 212-2 that are connected between contact pads 211-1 and tile edge 210E-2. Note that tiles 210-1 to 210-3 are configured such that, when operably combined, the size of the contact pads and the spacing between adjacent contacts pads conforms with a selected RAM interface technology. For example, referring briefly to FIG. 2(B), tiles 210-1 to 210-3 are developed based on the hypothetic 3×3 array pattern such that the size of and spacing between contacts pads 211-1, 211-2 and 211-3 are configured to accommodate flip-chip connection to (first) PHY contact pad array 41-1 disposed on memory IC 40-1 by way of microbumps/balls 60-1, and flip-chip connection to (second) PHY contact pad array 41-2 disposed on xPU 40-2 by way of microbumps/balls 60-2.

Referring again to FIG. 1, according to an aspect of the present invention, each tile 210-1 to 210-3 escapes (relocates) three routing pins from initial pin locations aligned in the row (Y-axis) direction to final pin locations aligned in the (column) X-axis direction. Specifically, as indicated by the dashed-line circles and dash-dot-lined arrows, tile 210-3 effectively relocates three routing pins from initial pin locations 2151-31, 2151-32 and 2151-33, which correspond to the locations of contact pads 211-31, 211-32 and 211-33, respectively, to final pin locations 215F-31, 215F-32 and 215F-33 disposed in a one-dimensional pattern along tile edge 210E-3. Similarly, tile 210-1 effectively relocates three routing pins from respective initial pin locations 2151-1 on contact pads 211-1 to final pin locations 215F-1 on tile edge 210E-1, and tile 210-2 effectively relocates three routing pins from respective initial pin locations 2151-2 on contact pads 211-2 to final pin locations 215F-2 on tile edge 210E-2. As explained below, relocating the routing pins in this manner greatly simplifies the routing process.

During the placement process, which is described in additional detail below, tiles 210-1 to 210-3 are placed (assigned) to corresponding regions of interconnect structure layout 200A such that tiles 210-1 to 210-3 collectively provide a layout description of the required 3×3 contact pad array. In addition, each tile provides additional layout description in the form of signal line segments that couple each interconnect contact pad to a side edge of the tile. As explained in additional detail below, the tiles effectively provide complete (fixed) layout descriptions for the regions of layout 200A that are occupied by the tiles by way of escaping all routing pins to the edges of the tiles.

As mentioned above with reference to FIG. 1, tile generation (step 95) involves generating software-based layout portions that may be instantiated an interconnect structure by an EDA software tool. The simplified tiles described above with reference to FIGS. 2(A) and 2(B) are introduced solely to explain key concepts of the present invention in a simplified form. That is, although more complicated tile arrangements (i.e., including a substantially larger number of densely packed contact pads, and including interconnect structures that are fabricated using more than one metal layer) are introduced below that are suitable for use in HBM-based IC devices, the basic configuration repositioning routing pins from the contact pads to an orthogonal tile edge, which is explained in simplified form in the example described above, applies equally to these more complicated tile arrangements. Moreover, note that all three tiles 210-1 to 210-3 with reference to FIG. 2(A) comprise substantially identical layout descriptions, which reduces data storage requirements and facilitates the use of a custom shape-based routing tool (i.e., because a single tile description stored in the library may be utilized three times by the EDA software tool to generate the required partial layout description covering each three-by-three array of contact pads 211). In other embodiments, tiles having different configurations may be utilized to populate a given footprint region, provided the different tile configurations meet the tile definition requirements set forth herein.

Referring again to FIG. 1, once tile generation (step 95) is completed for a given RAM interface technology, the tiles are then stored in a library, and then utilized by the EDA design process (block 110) in the manner described below. The EDA software design process (step 110) is actually composed of a number of steps 112-130, shown in linear fashion for simplicity. In an actual IC design process, the particular design might have to go back through steps 112-130 until certain tests are passed. Similarly, in any actual design process, these steps may occur in different orders and combinations. The following description is therefore provided by way of context and general explanation rather than as a specific, or recommended, design flow for an IC device based on a particular RAM interface technology. In one embodiment, one or more steps of the EDA software design process (step 110) can be implemented using a computer-readable medium 111A, which is read by a computer 111B. Note that CustomSim, ESP, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

Referring to the central portion of FIG. 1, during system design (step 112) the circuit designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 114) is then performed. At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 116) is performed next. Here, the VHDL/Verilog is translated to a netlist. The netlist can be optimized for the target technology. Additionally, the design and implementation of tests to permit checking of the finished device occurs. Exemplary EDA software products from Synopsys, Inc. that can be used at this step include Design Compiler®, Power Compiler™, Tetramax®, and DesignWare® products.

Netlist verification (step 118) is performed next. At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 120): Here, an overall floorplan for the IC device is constructed and analyzed for timing and top-level routing. Floorplanning typically involves rough placement of the IC device's functional blocks (e.g., major circuit components, such as memory arrays, processing circuits, etc.). As indicated in block 120A, in specific cases involving the design of interconnect structures for HBM-based IC devices, floorplanning includes determining and assigning areas (herein "footprint regions" or "footprints") of the interconnect structure (e.g., silicon interposer) that will be occupied by the processor chip and each HBM stack (i.e., the size of a given footprint region is determined by the peripheral dimensions of the physical chip/stack that will occupy the given footprint region). Additional information regarding floorplanning is provided below. Exemplary EDA software products from Synopsys, Inc. that can be used to implement floorplanning include and IC Compiler™ products.

Physical implementation (step 122): Placement (positioning of circuit elements) and routing (connection of the same) occurs at this step, and are performed as described below using the tile-based place-and-route methodology of the present invention.

Analysis and extraction (step 124): At this step, the circuit function is verified at a transistor level, this in turn permits what-if refinement. Exemplary EDA software products from Synopsys, Inc. that can be used at this step include PrimeRail™, Primetime®, and Star RC products.

Physical verification (step 126): At this step various checking functions are performed to ensure correctness for: manufacturing, electrical issues, lithographic issues, and circuitry. Exemplary EDA software products from Synopsys, Inc. that can be used at this step include the IC Validator product.

Resolution enhancement (step 128): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 130): This step provides the "tape-out" data for production of masks for lithographic use to produce finished chips and corresponding interconnect devices, such as silicon interposers. Exemplary EDA software products from Synopsys, Inc. that can be used at this step include the CATS® family of products.

The tile-based place-and-route methodology described herein can be implemented advantageously in one or more component software tools (computer programs) that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices configured to store data files such as the pre-designated tile descriptions mentioned above, and layout data describing the place-and-route solution generated at least in part by the tile-based place-and-route methodology described herein; such devices include magnetic disks, such as internal hard disks and removable disks, magneto-optical disks, and optical disks. Note that the layout data is stored in a manner that can be utilized during subsequent stages of the EDA design process, including generation of masks (step 130) that are subsequently used to fabricate silicon interposers (step 150). Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks.

As indicated in the lower-right portion of FIG. 1, the tile-based place-and-route methodology includes placing tiles into PHY footprint regions (step 122A1), and then routing is performed to generate a signal line layout (routing solution) that provides the contact-pad-to-contact-pad interconnections needed to provide the required PHY-to-PHY interconnection (step 122A2). As indicated by arrows A and B in FIG. 1, the placement process (step 122A1) utilizes tile information generated and stored during tile generation (step 95), is performed in accordance with floorplan information established during design planning (step 122), and involves placing tiles into designated footprint regions that would otherwise be occupied solely by the two 2D contact pad arrays. As explained above, the tile-based approach of the present invention greatly simplifies the task of generating the required contact-pad-to-contact-pad interconnections by way of designing the tiles such that all routing pins are relocated from the contact pad locations to locations along the tile edges. With tiles configured in this manner, placing (step 122A1) includes assigning the tiles into the corresponding PHY footprint regions such that all routing pins (i.e., free ends of the line segments) of the memory PHY footprint region face the routing pins of the xPU PHY footprint region (i.e., the two sets of tiles are disposed in a substantially mirrored arrangement), and with all associated pins (signal line segment free ends) arranged in the same predetermined order along the facing edges. With the tiles placed in this manner, the subsequently performed routing process (step 122A2) is greatly simplified by way of providing parallel signal lines that connect the two parallel sets of ordered routing pins, which can be performed relatively quickly by current commercially available automatic routing tools, or may be performed using a custom routing tool configured to specifically address this routing situation. Once routing is completed, control of the place-and-route process returns to step 122 (FIG. 1) for placement and routing of other signals and connections supported on the interconnect structure.

Figure 3A:
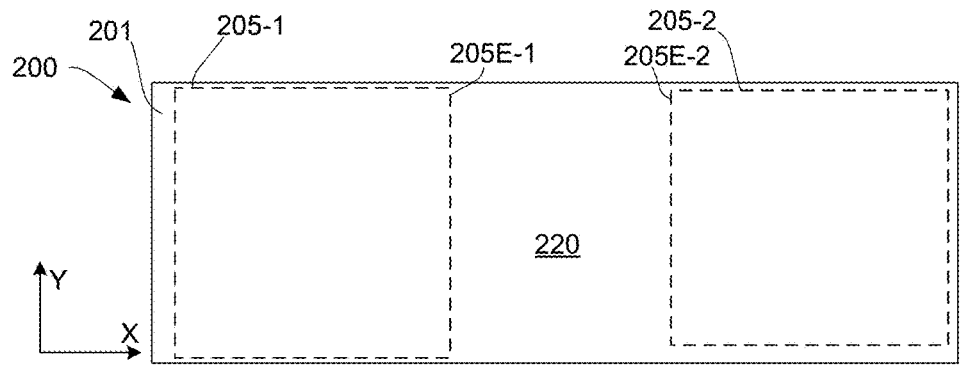
FIGS. 3(A), 3(B) and 3(C) are plan views depicting aspects of the tile-based place-and-route methodology using the simplified tiles of FIG. 2(A)
Figure 3B:
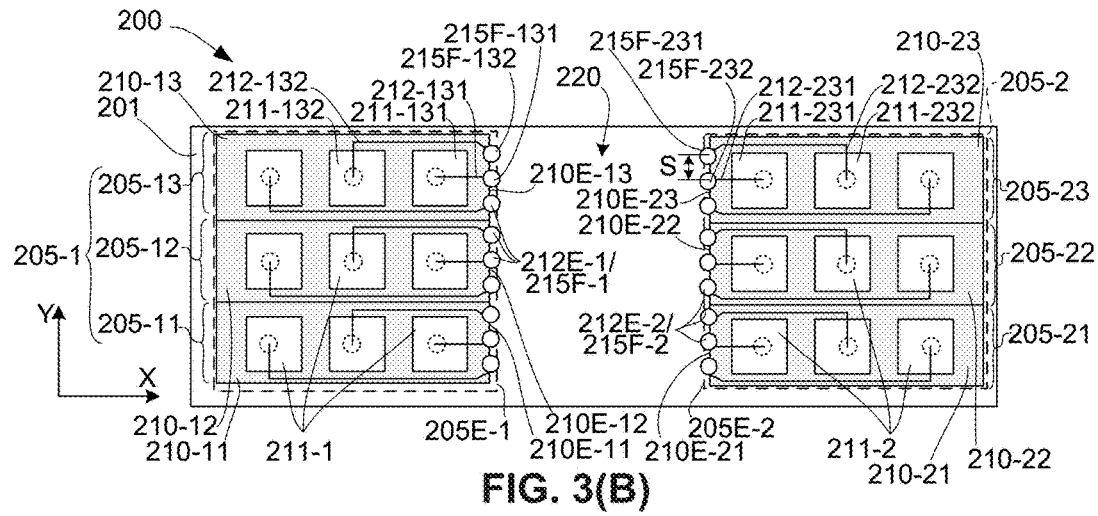
Figure 3C:
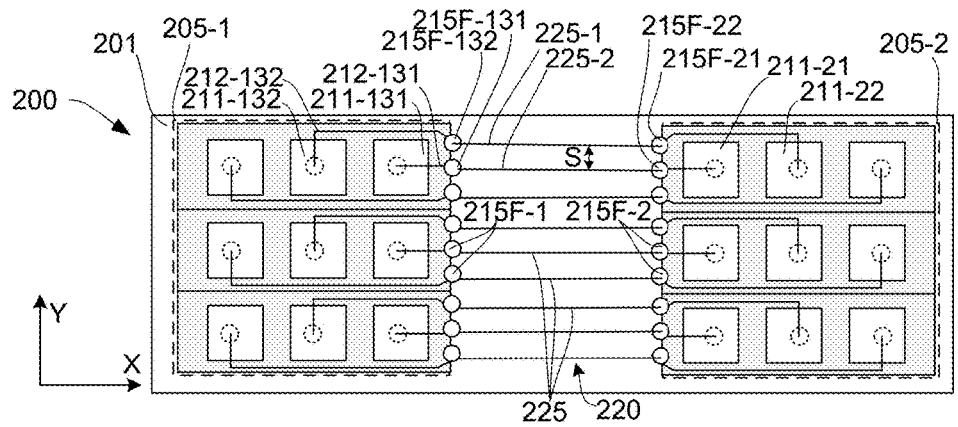

FIGS. 3(A) to 3(C) illustrate the tile-based place-and-route methodology using the simplified tiles introduced above with reference to FIG. 2(A).

FIG. 3(A) illustrates interconnect structure layout 200 after floorplanning (block 120A) is performed during which a memory (first) footprint region 205-1 is assigned (i.e., selected and reserved) for occupation by a memory device (e.g., memory device 40-1, shown in FIG. 2(B)), and an xPU (second) footprint region 205-2 is selected and reserved for occupation by a processor device (e.g., xPU 40-2, shown in FIG. 2(B)). As indicated in FIG. 2(B), footprint regions 205-1 and 205-2 are sized and positioned such that, when the corresponding devices 40-1 and 40-2 are mounted onto a corresponding region of a completed interconnect structure 200A (i.e., as depicted in FIG. 2(B)), peripheral edges of the devices generally align with the peripheries of footprint regions 205-1 and 205-2. Floorplanning also involves orienting footprint regions 205-1 and 205-2 such that side edges 205E-1 and 205E-2 of footprint regions 205-1 and 205-2 face each other and are separated by an intervening section 220 of interconnect structure layout 200. That is, footprint regions 205-1 and 205-2 are oriented during floorplanning such that, when tiles are subsequently placed in footprint regions 205-1 and 205-2, all line segment free ends (i.e., routing pins) will be aligned parallel to side edges 205E-1 and 205E-2, and are separated by a lateral (X-axis) distance corresponding to intervening section 220 and any lateral offset distance between the tile edges and side edges 205E-1 and 205E-2.

FIG. 3(B) depicts interconnect structure 200 after tiles are placed in footprint regions 205-1 and 205-2 (i.e., according to block 122A1 in FIG. 1). In the exemplary embodiment, placement includes assigning three first tiles 210-11, 210-12 and 210-13 in corresponding sub-regions 205-11, 205-12 and 205-13 of memory footprint region 205-1 in a non-overlapping side-by-side arrangement, and assigning three second tiles 210-21 to 210-23 in corresponding sub-regions 205-21 to 205-23 of xPU footprint region 205-2 in a non-overlapping side-by-side arrangement. According to an aspect of the present invention, the placement process is performed such that second tiles 210-21 to 210-23 are disposed in a substantially mirrored (i.e., opposite) orientation relative to first tiles 210-11 to 210-13 such that the routing pins of the two tile sets are arranged parallel to and facing each other. That is, first tiles 210-11 to 210-13 are oriented during placement such that tile edges 210E-11, 210E-12 and 210E-13 are aligned parallel to a rightward-facing (first) side edge 205E-1 of footprint region 205-1, and oriented such that free ends 212E-1 (i.e., routing pins 215F-1) of all of line segments 212-1 are disposed between contact pads 211-1 and side edge 205E-1. Similarly, second tiles 210-21 to 210-23 are oriented during placement such that tile edges 210E-21, 210E-22 and 210E-23 are aligned parallel to a leftward-facing (second) side edge 205E-2 of footprint region 205-2, and oriented such that free ends 212E-2 (i.e., relocated routing pins 215F-2) of all of line segments 212-2 are disposed between contact pads 211-2 and side edge 205E-2. That is, because footprint regions 205-1 and 205-2 are oriented during floorplanning such that side edges 205E-1 and 205E-2 face each other, first tiles 210-11 to 210-13 and second tiles 210-21 to 210-23 are automatically oriented during placement such that relocated routing pins 215F-1 and 215F-2 face each other across intervening section 220. Because relocated routing pins 215F-1 and 215F-2 are disposed parallel to facing edges 205E-1 and 205E-2, the length of signal lines to be generated during routing that will be required to couple associated routing pins is minimized.

According to a feature of the invention, tiles 210-11 to 210-13 and 210-21 to 210-23 are configured and oriented during placement such that contact pads 211-1 and 211-2 are properly positioned for connection to associated devices in the actual interconnect structures generated in accordance with layout 200. That is, as indicated in FIG. 2(B), when physical interconnect structure 200A is fabricated using layout 200, physical contact pads 211-1 are operably positioned to connect with memory (first) PHY contact pad array 41-1 (i.e., by way of bumps/balls 60-1) when memory device 40-1 is mounted in first footprint region 205-1, and physical contact pads 211-2 are operably positioned to connect with xPU (second) PHY contact pad array 41-2 (i.e., by way of bumps/balls 60-2) when xPU 40-2 is mounted in second footprint region 205-2.

According to another aspect, all of the tiles are configured such that a minimum spacing between adjacent signal line segment free ends (i.e., routing pins) is set at a distance that complies with design rule requirements set by the interconnect structure fabrication process. For example, referring again to the central region of FIG. 3(B), routing pins 215F-21 and 215F-22 are separated by a spacing distance S, where distance S is equal to or greater than the minimum gap spacing allowed by design rules of the fabrication process to be utilized during the fabrication of physical interconnect structures (e.g., structure 200A, FIG. 2(B)) based on interconnect structure layout 200 (i.e., after generation of layout 200 is completed). As set forth below, by providing spacing distance S between all adjacent pairs of routing pins, signal lines generated during the routing process are reliably automatically generated with proper (rule compliant) gap spacing distances.

According to another aspect of the present invention, tiles 210-21 to 210-23 are configured and/or oriented relative to tiles 210-11 to 210-13 such that associated routing pins are arranged in a mirrored order, thereby facilitating the connection of associated contact pads by way of parallel signal lines. As set forth above, to facilitate proper communication between the memory and processor, a routing solution is required that provides signal lines coupled between associated contact pads. This routing solution is achieved in the tile-based place-and-route methodology by configuring and orienting (second) tiles 210-21 to 210-23 relative to (first) tiles 210-11 to 210-13 such that relocated routing pins 215F-2 (i.e., free ends 212E-2 of line segments 212-2) are arranged in a mirrored order relative to relocated routing pins 215F-1 (i.e., free ends 212E-1 of line segments 212-1). For example, to achieve the required routing solution, a (first) signal line must be provided that couples contact pad 211-132 (disposed on tile 210-13) and its associated contact pad 212-232 (disposed on tile 210-23), and (second) signal line must be provided that couples contact pad 211-131 (disposed on tile 210-13) and its associated contact pad 212-231 (disposed on tile 210-23). As indicated at the top of FIG. 3(B), relocated routing pin 215F-131 is coupled to contact pad 212-131 by way of signal line segment 212-131, relocated routing pin 215F-132 is coupled to contact pad 212-132 by way of signal line segment 212-132, relocated routing pin 215F-231 is coupled to contact pad 212-231 by way of signal line segment 212-231, and relocated routing pin 215F-232 is coupled to contact pad 212-232 by way of signal line segment 212-232. In accordance with the mirrored order arrangement, the routing pins coupled to associated contact pads 211-132 and 211-232 (i.e., routing pins 215F-132 and 215F-232) are disposed as the uppermost pair of routing pins disposed along side edges 205E-1 and 205E-2, and the routing pins coupled to associated contact pads 211-131 and 211-231 (i.e., routing pins 215F-131 and 215F-231) are disposed as the second-to-top (next-down) pair of routing pins disposed along side edges 205E-1 and 205E-2. In a similar manner, the order in which routing pins coupled to contact pads 211-1 are arranged along side edge 205E-1 matches (mirrors) the order in which routing pins coupled to associated contact pads 211-2 are arranged along side edge 205E-2. As explained below, this mirrored order arrangement greatly simplifies the routing process.

Although multiple tiles (i.e., tiles 210-11, 210-12 and 210-13) are collectively required to generate the specified 3×3 array of contact pads 211-1, and three more tiles (i.e., tiles 210-21, 210-22 and 210-23) are collectively required to generate the specified 3×3 array of contact pads 211-2, in other embodiments (not shown) the array of contact pads may be divided into any number of tile regions, or implemented using a single tile that includes all nine contact pads and other features included on the tiles of the exemplary embodiment.

In the exemplary embodiment, tiles 210-11 to 210-13 and tiles 210-21 to 210-23 are configured to include substantially identical layout descriptions, where 210-21 to 210-23 comprise mirror-image versions of tiles 210-11 to 210-13. For example, each of tiles 210-11, 210-12 and 210-13 includes substantially identical layout descriptions such that tiles 210-11, 210-12 and 210-13 could be interchanged (e.g., tile 210-11 moved into sub-region 205-12 and tile 210-12 moved into sub-region 205-11) without changing the resulting combined layout description of the three-tile assembly disposed in footprint region 205-1. In addition, second tiles 210-21 to 210-23 are mirror-image versions of first tiles 210-11 to 210-13 in that second tiles 210-21 to 210-23 could be generated using known mirroring techniques (i.e., by effectively "flipping" (rotating 180°) first tiles 210-11 to 210-13 around the Y-axis). The use of multiple identical tile configurations and mirror-imaged tile configurations substantially reduces tile development time over non-identical tile configuration and non-mirror options, and also reduces processing time during place-and-route by way of allowing the same tile description data to be utilized during processing in different layout regions. However, the tile-based place-and-route methodology may be beneficially implemented without one or both of these features. That is, in alternative embodiments (not shown), tiles having different (non-identical or non-mirror-image) layout configurations may be utilized in a single footprint region, provided the resulting tile assembly provides all contact pads and relocated routing pin features similar to those provided by the tiles of the exemplary embodiments.

FIG. 3(C) depicts a simplified routing process that performed after placement of tiles 210-11 to 210-13 and 210-21 to 210-23. Note that the objective of the routing process performed during the tile-based place-and-route process is substantially the same as that applied to the prior art example (described above). That is, a single metal layer must be used to generate a routing solution such that, when the completed interconnect structure layout is subsequently utilized to fabricate physical interconnect structure 200A (FIG. 2(B)), the routing solution operably supports parallel data transmissions between each contact pad 41-1 of the first PHY contact pad array of memory device 40-1 and corresponding contact pads 41-2 in the second PHY contact pad array of xPU 40-2 using the hypothetical (3×3 array) RAM interface technology. As indicated in FIG. 3(C), due to the relocation and mirror ordering of routing pins 215F-1 and 215F-2, a compliant routing solution is easily achieved by way of generating parallel signal lines 225 that respectively extend across intervening section 220 between footprint regions 205-1 and 205-2, and are coupled at each end to associated pairs of routing pins 215F-1 and 215F-2 (i.e., to the signal line segment end points that form routing pins 215F-1 and 215F-2), thereby operably coupling associated pairs of contact pads 211-1 and 211-2 by way of the signal lines generated by the routing process and the signal line segments provided with tiles 210-11 to 210-13 and 210-21 to 210-23. For example, signal line 225-1 is coupled at one end to routing pin 215F-132, which is coupled to contact pad 211-132 by way of signal line segment 212-132, and signal line 225-1 is coupled at its opposite end to routing pin 215F-232, which is coupled to contact pad 211-232 by way of signal line segment 212-232, whereby associated contact pads 211-132 and 211-232 are coupled by way signal line 225-1 and corresponding first and second line segments 212-132 and 212-232. Similarly, signal line 225-2, which is parallel to signal line 225-1, is coupled at one end to routing pin 215F-131, which is coupled to contact pad 211-131 by way of signal line segment 212-131, and is coupled at its opposite end to routing pin 215F-231, which is coupled to contact pad 211-231 by way of signal line segment 212-231, whereby associated contact pads 211-131 and 211-231 are coupled by way signal line 225-2 and corresponding first and second line segments 212-131 and 212-231. In a similar manner, due to the relocation and mirror ordering of routing pins 215F-1 and 215F-2, parallel signal lines 225 operably couple all nine associated pairs of contact pads 211-1 and 211-2. Accordingly, parallel signal lines 225 enable parallel data transmission between associated pairs of contact pads 211-1 and 211-2. By arranging the associated pairs of routing pins 215-1 and 215-2 in the mirror order arrangement mentioned above, and by spacing the adjacent pairs of routing pins 215F-1 and 215F-2 at a proper spacing distance S (shown in FIG. 3(B)) that satisfies the minimum wire spacing requirements set by the fabrication process utilized to produce interconnect structures based on layout 200, the tile-based place-and-route methodology significantly reduces computer processing time by simplifying the routing process (i.e., reducing the time required for the routing tool to generate a viable solution). That is, because the mirror-ordered routing pins are properly spaced, adjacent pairs of parallel signal lines 225 (e.g., signal lines 225-1 and 225-2) generated during routing are also properly spaced at predefined spacing S. Accordingly, the routing tool is unlikely to encounter offset violations or other conflicts when generating a routing solution, thereby avoiding time-consuming rework processes that are needed to correct flawed routing solutions generated using conventional approaches.

Note that, given the task of routing mirror-order, properly spaced routing pins located on facing side edges of two footprint regions, both currently available analog and currently available digital routing tools are capable of quickly generating a routing solution that couples associated contact pads by way of sequentially generating parallel signal lines between the mirror-ordered routing pins. However, in one embodiment a custom layout tool is utilized in which the tiles are placed, and then a routing solution is generated using a shape-based routing tool. Shape-based routers are ideally suited for "custom" layout. The offer the possibility to manually/automatically route one bit of the bus, and then "copy" the routing for the remaining bits; they also offer the possibility to treat a bus, even a very wide one, as if it was a single net: all the bits "behave" in the same manner. Shape-based routers interactively comply with design rules (width, spacing, etc.) implementing a correct by construction routing, and, most importantly, can handle 45-degree. Unfortunately, there are limitations in their capacity (thousands of nets) and number of layers supported (usually one, or two). RDL routers are conceived to "escape" or "disentangle" the point-to-point connections between an I/O buffer and a C4. RDL routers are typically used for flip-chip IC packaging. In digital place-and-route, RDL routers are the only ones able to deal with 45-degree in a digital place-and-route environment. Unfortunately, there are limitations in their capacity (thousands of nets) and number of layers supported (usually one, or two). When we use the shape-based router of Custom Compiler, we essentially implement a full 1,800 "bits" bus (864 signals+936 "shields") as a single "entity". When the RDL router of IC Compiler is used, we essentially implement one "bit" (or "group" of "bits", where "group" means, as an example", all the "bits" of one "tile) at a time; we use the RDL router as if it was a river router to implement 1,800 2-pin nets, one (or a "group") at a time. What has been devised is: first, a method for creating an identical interface on the two sides of a facing HBM/xPU PHY pair, that enables the use of the simplest routing algorithm (river routing); and second, a method for driving a shape-based or an RDL router to implement an ultra-wide bus (overall, signal and shielding, 3,600 wires, split between two layers), accounting for both physical (e.g. tight microbumps pitch) and electrical (e.g. matched wires length, and RC values) constraints. The use of 45-degree jogs (as opposed to Manhattan ones) allows to minimize the amount of silicon real estate toll, as well as to comply with the manufacturing rules.

Referring again to FIG. 2(B), actual interconnect structure 200A is fabricated in accordance with layout 200 (i.e., routing solution) that is depicted in FIG. 3(C). As mentioned above and depicted in FIG. 2(B), although contact pads 211-1 and 211-2 and the associated signal line segments defined by tiles 210-11 to 210-13 and 210-21 to 210-23 in layout 200 (FIG. 3(C)) are present in the physical structure, the physical structure fails to include discernible features corresponding to the tile boundaries, and connections between the signal line segments and signal lines 225 are seamlessly integrated into the fabricated interconnect structure. Accordingly, after mounting memory device 40-1 and xPU 41-1 into footprint regions 205-1 and 205-2 as indicated in FIG. 2(B), parallel signal lines 225 enable parallel data transmissions between memory contact pads 41-1 and associated processor contact pads 41-2.

Figure 4A:
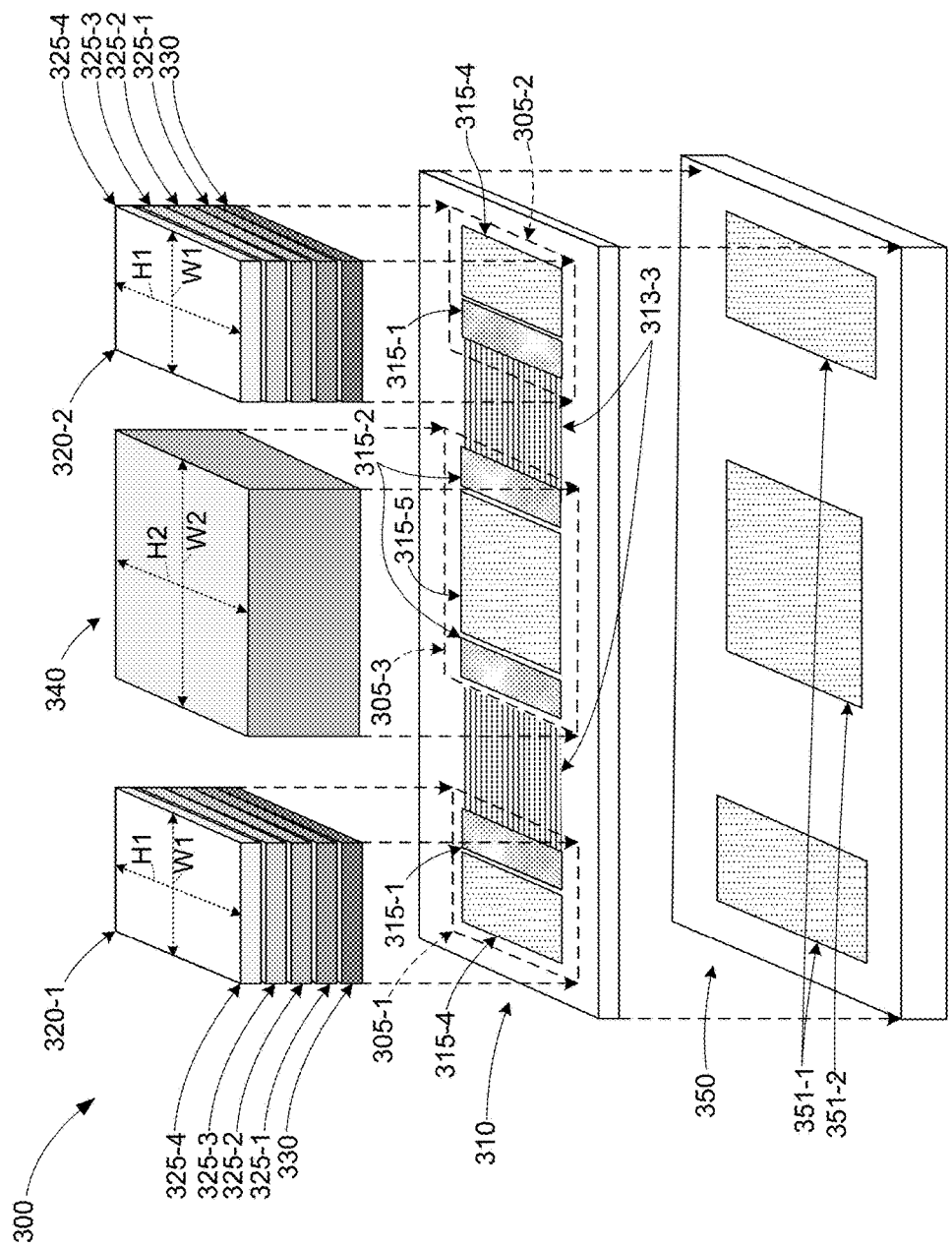
FIG. 4(A) is an exploded perspective view showing a simplified exemplary silicon-interposer-based, two-stack HBM-based IC device produced in accordance with the tile-based place-and-route methodology of the present invention.
Figure 4B:
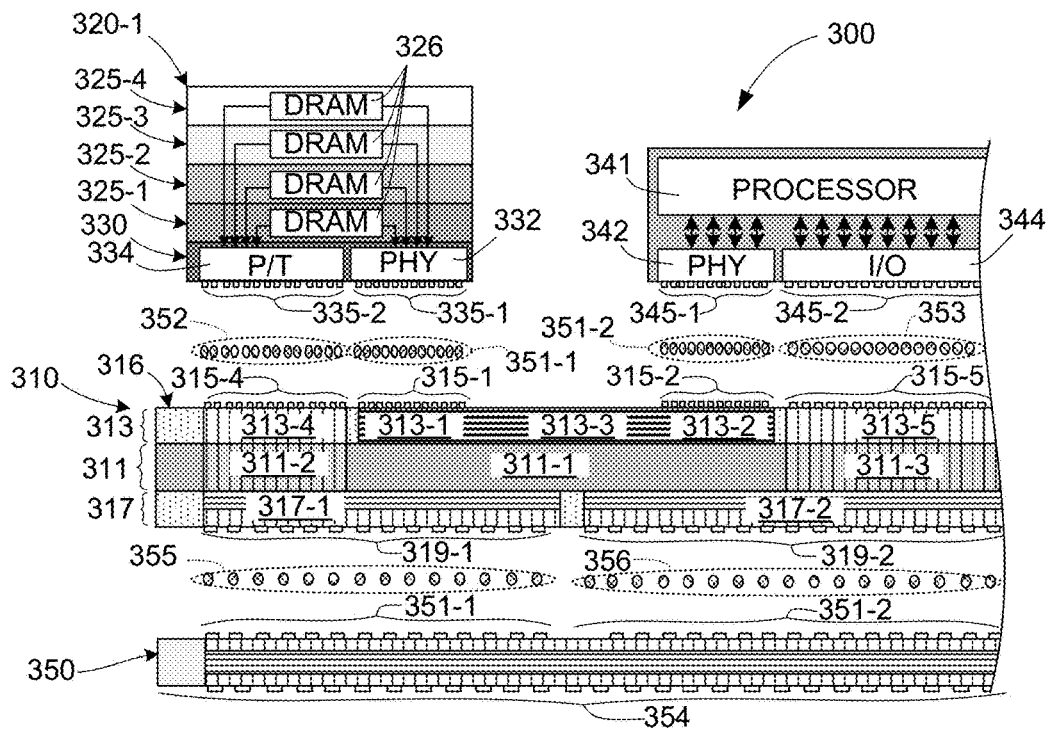
FIGS. 4(B) and 4(C) show the IC device of FIG. 4(A) in exploded and assembled cross-sectional side views.
Figure 4C:
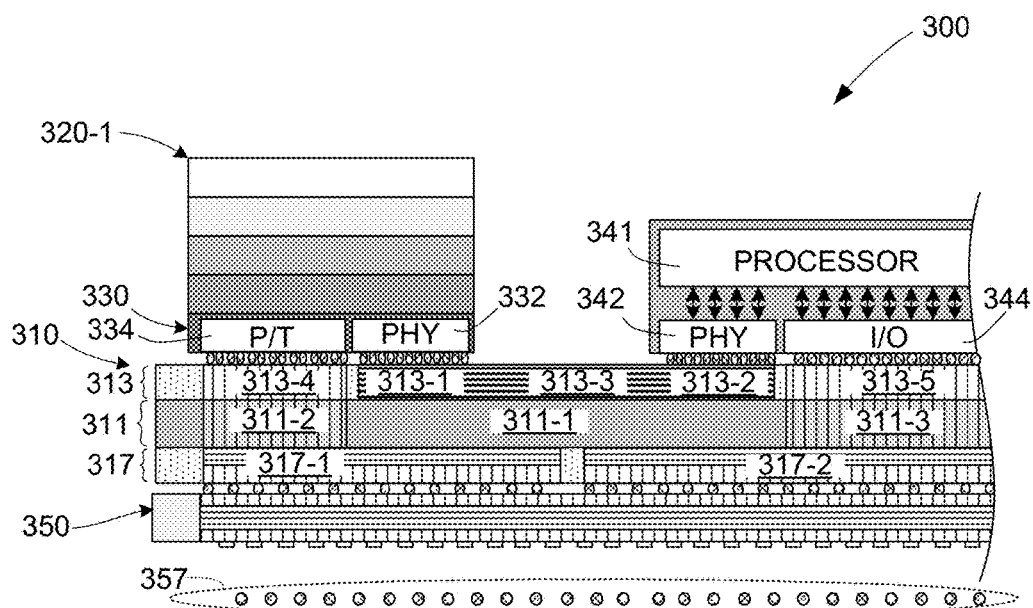

The tile-based place-and-route methodology of the present invention will now be described in additional detail with specific reference to the development of exemplary silicon-interposer-based, two-stack HBM-based IC devices, such as HBM-based IC device 300 shown in FIGS. 4(A) to 4(C), where FIG. 4(A) shows device 300 in an exploded perspective view, and FIGS. 4(B) and 4(C) show device 300 in exploded and assembled cross-sectional side views. Those skilled in the art will recognize that the specific methodology described below may be utilized to develop HBM-based IC devices using either of the current HBM standards (i.e., HBM1 or HBM2) and including any compliant number of HBM stacks (e.g., four, six or eight) by way of repeating the tile-based place-and-route process described below for each HBM-stack-to-processor connection. Moreover, although the methodology is described with specific reference to a single silicon interposer having four topside metal layers, the methodology may be utilized to generate two separate interposers (i.e., each connecting one HBM stack to the processor), or to generate silicon interposers having a different number of topside metal layers, or to generate interconnect structures using a suitable non-silicon-interposer technology. Further, at least some of the features described below with specific reference to interconnect structures developed for HBM-based IC devices may be utilized in the development of interconnect structures for IC devices that require signal lines between two densely-packed contact pads arrays. That is, the tile-based place-and-route methodology of the present invention provides a flexible place-and-route strategy that can be easily expanded to accommodate next-generation RAM interface technologies having massively parallel communication busses that include even more parallel signal lines than those utilized by HBM2. In fact, a 2,048 bits HBM interface is already under development. Today PHY implements a 1,024-bit bus+704 "control" signals. Soon each PHY shall implement a 2,048-bit bus plus several hundreds of "control" signals, for a grand total possibly exceeding 3,000 signals, along with shielding. Not a problem for the methodology of the present invention, but arguably not feasible for any manual approach.

Referring to FIG. 4(A), IC device 300 generally includes interconnect structure (interposer) 310, two (or more) HBM stacks 320-1 and 320-2, an xPU (processor) 340, and a package substrate 350 that are separately fabricated (i.e., per step 150, FIG. 1), and then assembled in the manner indicated in FIGS. 4(A) to 4(C) (i.e., per step 160 in FIG. 1). As indicated in FIG. 4(A), each HBM stack 320-1 and 320-2 typically has substantially identical lateral dimensions H1 and W1, and each includes a depicted with four core DRAM dies 325-1 to 325-4 that are connected using known through-silicon vias techniques to a base logic die 330. In other embodiments each stack may include between one and eight DRAM cores according to current HBM standards. As indicated in FIG. 4(B), each base logic die 330 includes an HBM physical layer (PHY) 332 and a power/test (P/T) circuit 334 that are operably configured to communication with DRAM memory circuits 326 formed on core DRAM die 325-1 to 325-4. HBM PHY 332 is configured to transmit data signals from core DRAM die 325-1 to 325-4 to xPU 340 by way of a first array of HBM PHY contact pads 335-1 formed on a lower surface of base logic die 330, and P/T circuit 332 receives power and transmits test signals by way of a second array of P/T contact pads 335-2 to an outside system (not shown) by way of interposer 310 and package substrate 350. Additional details regarding HBM PHY 332 are provided below with reference to FIG. 5(A).

Referring again to FIG. 4(A), xPU (processor) 340 has lateral dimensions H2 and W2 sufficiently large enough to accommodate two xPU PHY circuits, with one xPU PHY circuit 342 configured to communicate with HBM stack 320-1, and the other xPU PHY (not shown) configured to communicate with HBM stack 320-2. As indicated in the upper right portion of FIG. 4(B), xPU 340 generally includes a processor circuit 341 that communicates with HBM stack 320-1 by way of xPU PHY 342, and communicates with the outside system by way of an input/output (I/O) circuit 344. xPU PHY 342 is configured to receive data signals from HBM stack 320-1 by way of a contact pad array 345-1 formed on a lower surface of xPU 340, and I/O circuit 332 communicates by way of a contact pad array 345-2. xPU PHY 342 and contact pad array 345-1 are configured and arranged according to HBM standards. Processor circuit 341 and I/O circuit 344 are configured and arranged according to known techniques to implement a predetermined function. Additional details regarding HBM PHY 342 are provided below with reference to FIG. 5(B).

As indicated in FIG. 4(B), interposer 310 includes a silicon substrate 311, topside metal layers 313 formed on an upper surface of substrate 311, and backside metal layers 317 formed on a lower surface of substrate 311. Topside metal layers 314 includes multiple (e.g., four) patterned metal layers separated by electrically insulating material layers and interconnected by metal via structures formed in accordance with known metallization techniques, where the multiple metal layers are patterned according to a layout design that is generated in part based on HBM standards, and at least in part using the tile-based place-and-route methodology of the present invention. Specifically, an uppermost (e.g., fourth) metal layer of topside metal layers 313 is to provide contact pad arrays that facilitate electrical connection to HBM stack 320-1 and xPU 340. Specifically, the uppermost metal layer includes an HBM PHY region 315-1 including contact pads patterned according to JEDEC-established HBM standards to match HBM PHY contact pads 335-1 of HBM stack 320-1, an xPU PHY region 315-2 including contact pads patterned according to JEDEC-established HBM standards to match xPU PHY contact pads 345-1 of xPU 340, an P/T region 315-4 including contact pads arranged in a pattern that matches P/T contact pads 335-2 of HBM stack 320-1, and an I/O region 315-5 including contact pads arranged in a pattern that matches I/O contact pads 345-2 of xPU 340. As set forth below, additional metal structures (e.g., shield lines) may also be patterned using the uppermost topside metal layer. One or more sub-surface metal layers of topside metal layers 313 are patterned either to provide electrical connections between associated contact pads disposed on the uppermost topside metal layer, or to facilitate electrical connections to an outside system (not shown) by way of package substrate 350. As explained in additional detail below, a sub-surface metal layer regions 313-1 and 313-2 and intervening region 313-3 are patterned according to the tile-based place-and-route methodology of the present invention to facilitate the transmission of electrical signals between associated contact pads disposed in HBM PHY region 315-1 and xPU PHY region 315-2. Sub-surface metal layer regions 313-4 and 313-5 are patterned in a manner that facilitates signal transmissions between the contact pads of P/T region 315-4 and I/O region 315-5, respectively, and the outside system (not shown) by way of substrate 311 and backside metal layers 317. Substrate 311 is fabricated using known techniques to provide both a base for topside metal layers 313, and also includes through-silicon vias (TSVs) configured to pass signals between topside metal layers 313 and backside metal layers 317. As indicated in FIG. 4(B), a region 311-1 of substrate 311 is illustrated as having no TSVs because substantially all communications performed by the metal signal lines disposed in regions 313-1, 313-2 and 313-3 of topside metal layers 313 involve communications between HBM stack 320-1 and xPU 341. Conversely, because both HBM P/T 334 and I/O circuit 344 communicate with an outside system, TSVs are formed in region 311-2 to pass signals between region 314-4 of topside metal layers 313 and corresponding conductive lines formed in region 317-1 of backside metal layers 317, and TSVs are formed in region 311-3 to pass signals between region 314-5 of topside metal layers 313 and corresponding conductive lines formed in region 317-2 of backside metal layers 317. Backside metal layers 317 also include contact pad arrays 319-1 and 319-2 that are respectively configured to pass signals to HBM stack 320-1 and xPU 340.

As indicated below interposer 310 in FIG. 4(B), package substrate 350 is configured and fabricated according to known techniques to pass signals between HBM stack 320-1 and xPU 340 and a host system (not shown) by way of upper contact pad arrays 351-1 and 351-2 and a lower contact pad array 354.

As mentioned above, interposer 310, HBM stack 320-1, xPU 340 and package substrate 350 are designed and fabricated separately, and then assembled/packaged to produce completed HBM-based IC device 300 (shown in FIG. 4(C)). As described in additional detail below with reference to FIGS. 8(A) to 8(C), an interposer layout design is generated using the tile-based place-and-route methodology of the present invention, and then actual (physical) interposer 310 is fabricated, e.g., according to a known silicon interposer fabrication process. HBM stacks 320-1 and 320-2, xPU 340 and package substrate 350 are separately designed and fabricated (i.e., either prior to or in parallel with the fabrication of interposer 310) using associated fabrication processes that are typically different from those used to fabricate interposer 310.

Referring to FIG. 4(A), assembly/packaging involves mounting HBM stacks 320-1 and 320-2 and xPU 340 onto pre-designated footprint regions of interposer 310. Because contact pad array locations are permanently fixed during interposer 310 fabrication, the final (secured) locations of HBM stacks 320-1 and 320-2 and xPU 340 is determined before fabrication of interposer 310 (e.g., using floorplanning process 120A described above with reference to FIG. 1), and then interposer 310 is fabricated according to the selected floorplan. In this example, interposer 310 is fabricated according to a floorplan such that HBM PHY regions 315-1 and P/T regions 315-4 are disposed in pre-designated HBM footprint regions 305-1 and 305-2, and xPU PHY region 315-1 and P/T regions 315-4 disposed in pre-designated xPU footprint region 305-3. The process of operably securing HBM stacks 320-1 and 320-2 and xPU 340 onto interposer 310 involves precise alignment of the contact pads of each device with corresponding contact pads formed on interposer 310, which is achieved by positioning HBM stacks 320-1 and 320-2 over designated HBM footprint regions 305-1 and 305-2, respectively, and positioning xPU 340 over xPU footprint region 305-3.

Assembly/packaging also including securing HBM stacks 320-1 and 320-2 and xPU 340 to interposer 310 using known flip-chip assembly techniques. As indicated in FIG. 4(B), HBM stack 320-1 is mounted/secured to interposer 310 such that HBM PHY contact pads 335-1 are connected to matching contact pads disposed in HBM PHY region 315-1 by way of microbumps/balls 351-1, and such that P/T contact pads 335-2 are connected to corresponding contact pads disposed in P/T region 315-4 by way of bumps/balls 352. Similarly, xPU 340 is flip-chip mounted/secured to interposer 310 by way of connecting xPU PHY contact pads 345-1 to matching contact pads disposed in xPU PHY region 315-2 by way of microbumps/balls 351-2, and connecting I/O contact pads 345-2 to contact pads disposed in I/O region 315-5 by way of bumps/balls 353.

Once HBM stack 320-1 and xPU 340 are mounted and secured on interposer 310, the assembly is mounted onto package substrate 350 and then optionally covered by a protective covering. As indicated in FIG. 4(B), this part of the assembly/packaging process is performed by way of connecting contact pads 319-1 (disposed on the lower surface of interposer 310) to contact pads 351-1 (formed on the upper surface of substrate 350) by way of bumps/balls 355, and connecting contact pads 319-2 to contact pads 351-2 by way of bumps/balls 356. A protective covering may then be formed over the assembly using techniques known in the art to further secure and protect the various devices. Finally, the assembled HBM-based IC device 300 (shown in FIG. 4(C)) is mounted onto a host system by way of bumps/balls 357.

Referring again to FIG. 4(B), the tile-based place-and-route methodology of the present invention is primarily directed to the production of interposer 310, and more particularly to the generation of a layout design for the portions of interposer 310 including the contact pad arrays formed in HBM PHY region 315-1 and xPU PHY region 315-2, and the various metal lines formed in topside metal regions 313-1, 313-2 and 313-3. All other layout portions utilized in the fabrication of interposer 310 may be generated using known place-and-route techniques, and therefore will not be discussed in further detail below.

Figures 5A, 5B:
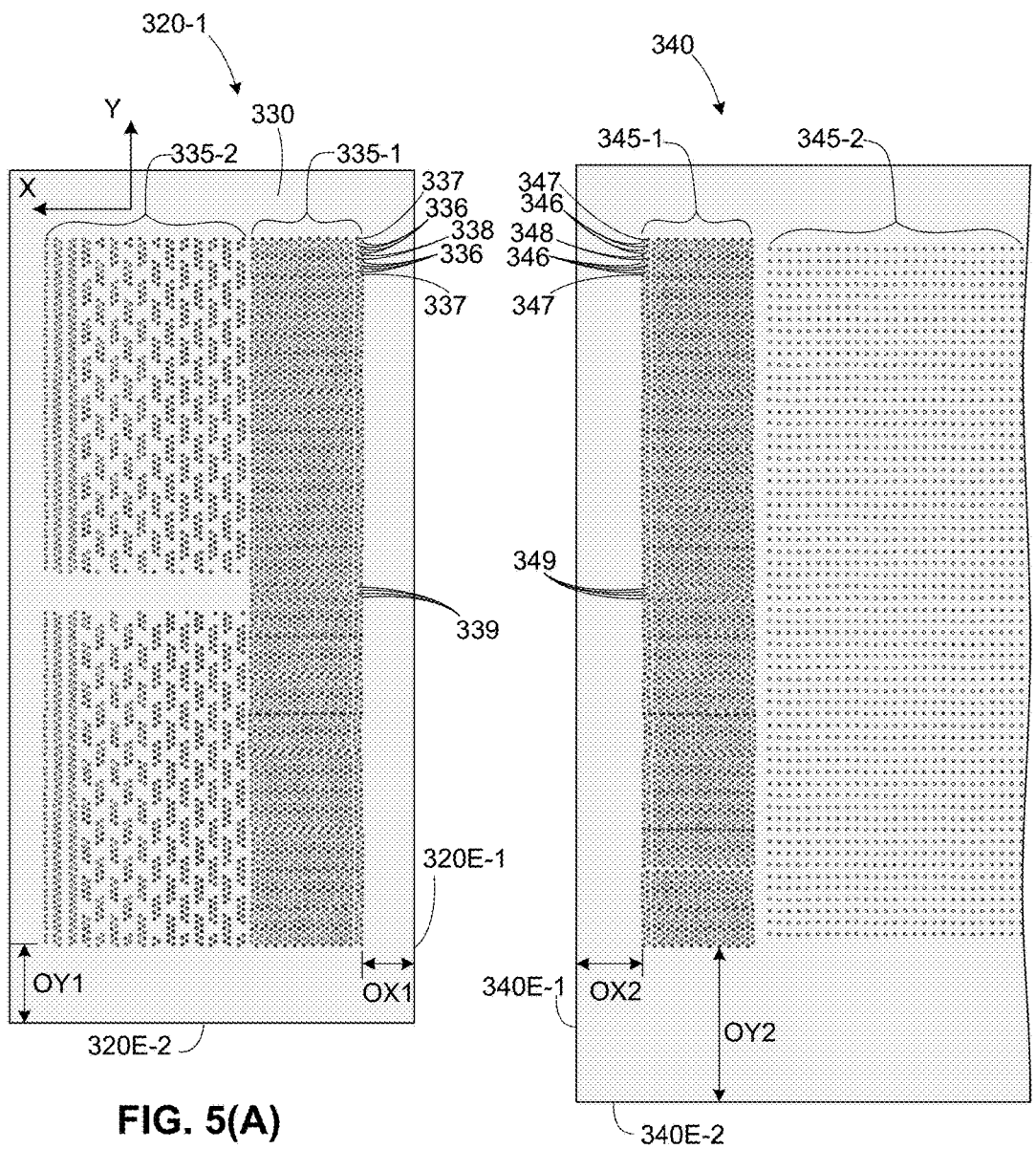
FIGS. 5(A) and 5(B) are bottom plan views showing contact pad array patterns respectively formed on an HBM stack and a microprocessor unit, respectively.

FIGS. 5(A) and 5(B) are bottom plan views showing accurately proportioned contact pad array patterns respectively formed on HBM stack 320-1 and xPU 340 in accordance with HBM standards. As set forth in the background section (above), the contact pad arrays utilized by HBM-based PHYs include 1,728 data contact pads (bumps) and 864 VSS/VDD/test contact pads, each having a maximum size of 25±2.5 microns, that are arranged in 220-by-twelve pattern disposed in an area defined by a height equal to 6,132.5 microns (330 microns times 18 tiles plus 192.5 microns for the "test" area in the middle) and a width of 1,129±2.5 microns, depending on the size of the bumps (i.e., 1,129 microns for a 25-micron bump, 1,126.5 microns for a 22.5-micron bump, and 1,131.5 microns for a 27.5-micron bump. A 1,131.5-micron by 330-micron "boundary" tile, which serves all the possible bump variants.

As set forth above, the tile-based place-and-route methodology of the present invention is especially beneficial when utilized to provide parallel connections between PHY contact pad arrays generated in accordance with RAM interface technologies, such the HBM-based PHYs illustrated in FIGS. 5(A) and 5(B).

Referring to FIG. 5(A), HBM PHY contact pads 335-1 are formed in a HBM-standard-designated region on an underside surface of base logic die 330, and P/T contact pads 335-2 are formed in an adjacent second region of base logic die 330. HBM PHY contact pads 335-1 are disposed in 220 rows aligned in the X-axis direction, and generally form twelve columns aligned in the Y-axis direction. According to JEDEC defined standards, the designated region occupied by HBM PHY contact pads 335-1 is disposed a distance OX1 from adjacent side edge 320E-1 of base logic die 330 (i.e., 1.132 microns for HBM1, and 2.267 microns for HBM2), and disposed a distance OY1 from a lower edge 320E-2 of base logic die 330. Also according to JEDEC defined standards, HBM PHY contact pads 335-1 are operably coupled to portions of HBM PHY 332 (shown in FIG. 4(B)) such that each row includes twelve contact pads receives either a designated fixed voltage or data signals, with the signal type applied to the sequentially arranged rows being set in a pattern that is repeated every twelve rows. That is, according to HBM standards, the uppermost (first) row contact pads 335-1 includes twelve contact pads 337 that are coupled to a VSS voltage source, the next four rows (i.e. rows two to five) include contact pads 336 that are coupled to data transmission sources, the next two rows (i.e., rows six and seven) include contact pads 338 coupled to a VDD voltage source, the next four rows (i.e., rows eight to eleven) include contact pads 336 that are coupled to data transmission sources, and the next row (i.e., row twelve) including contact pads 337 that are coupled to the VSS voltage source. This twelve-row pattern (i.e., VSS (one row), data (four rows), VDD (two rows), data (four rows), and VSS (one row)) is repeated eighteen times below the uppermost twelve rows, whereby contact pads 335-1 include eighteen twelve-row groups arranged in the column (Y-axis) direction, with four rows of temperature/test contact pads 339 disposed between the upper nine twelve-row groups and the lower nine twelve-row groups. P/T contact pads 335-2 are formed in adjacent second region of base logic die 330 in a pattern that is determined, for example, by the HBM stack manufacturer, and generally include contact pads that carry test and power signals.

As shown in FIG. 5(B), xPU PHY contact pads 345-1 are formed in a second HBM-standard-designated region on an underside surface of xPU 340, and I/O contact pads 345-2 (which are only partially shown) are formed in an adjacent region of xPU 340. In one embodiment, xPU PHY contact pads 345-1 are arranged rows and columns that match HBM PHY contact pads 335-1, and are disposed a distance OX2 from adjacent side edge 340E-1 of xPU 340, and are disposed a distance OY2 from a lower edge 340E-2 of xPU 340. According to JEDEC defined standards similar to those applied to HBM PHY contact pads 335-1, xPU PHY contact pads 345-1 are operably coupled to portions of xPU PHY 342 (shown in FIG. 4(B)) and arranged in the same twelve-row pattern as that described above with reference to HBM PHY contact pads 335-1 (i.e., the uppermost twelve row group includes VSS contact pads 347 (one row), signal contact pads 346 (four rows), VDD contact pads 348 (two rows), signal contact pads 346 (four rows), then VSS contact pads 347 (one row)). As with HBM PHY contact pads 335-1, this twelve-row group pattern is repeated eighteen times in the designated PHY area, with four central rows 349 being included for temperature/test functions. I/O contact pads 345-2 are formed in adjacent second region of xPU 340 in a pattern that is determined, for example, by the xPU manufacturer.

Figure 6A:
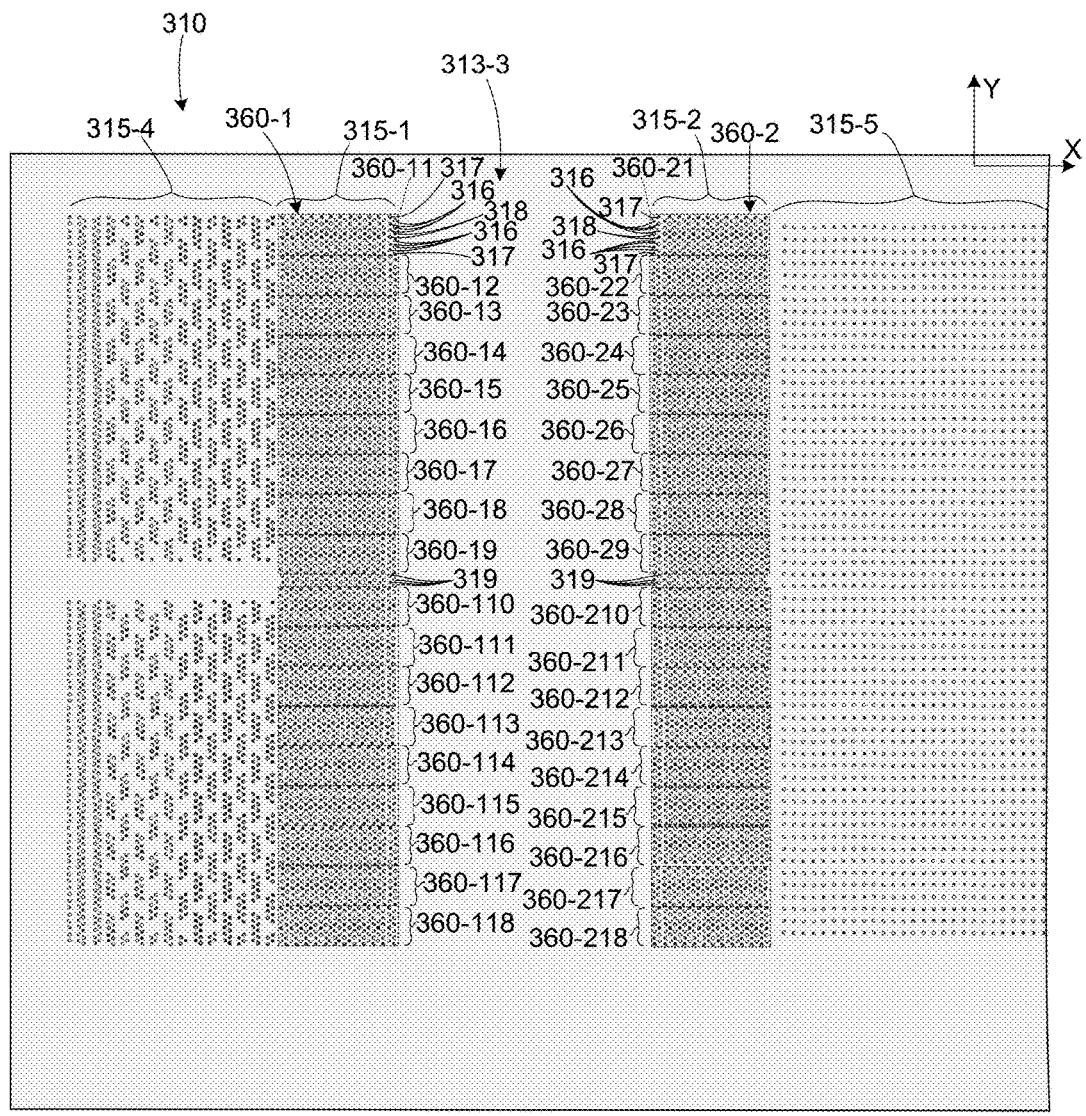
FIG. 6(A) is a plan view showing an interposer including contact pads that are arranged and configured in accordance with an embodiment of the present invention to connect with the contact pad arrangements depicted in FIGS. 5(A) and 5(B)

FIG. 6(A) is a plan view showing interposer 310 including contact pads that are arranged and configured to connect with the contact pad arrangements depicted in FIGS. 5(A) and 5(B). In one embodiment, interposer layout 310 includes 2,640 contact pads disposed in HBM PHY region 315-1 in an array pattern that mirrors HBM PHY contact pads 335-1, and also includes interconnect xPU PHY contact pads 315-2 that mirror xPU PHY contact pads 345-1. Interposer layout 310 also includes contact pads disposed in P/T region 315-4 that mirror P/T contact pads 335-2 on HBM stack 320-1, and contact pads disposed in I/O region 315-5 that mirror I/O contact pads 345-2 on xPU 340. In an alternative embodiment (not shown), one or both of P/T region 315-4 and I/O region 315-5 may be implemented on a separate interconnect structure. Moreover, because the tile-based place-and-route methodology is primarily directed to the development of a routing solution that interconnects HBM PHY region 315-1 with xPU PHY region 315-2, the development of a routing solution pertaining to P/T region 315-4 and I/O region 315-5 are omitted for brevity.

As indicated at the top of FIG. 6(A), according to a presently preferred embodiment, each twelve-row group of contact pads disposed in HBM PHY region 315-1 and 315-2 is assigned to an associated PHY tile region 360-1, and corresponding twelve-row groups of contact pads disposed in xPU PHY region 315-2 are assigned to PHY tile regions 360-2. That is, HBM PHY region 315-1 includes eighteen HBM PHY tiles 360-11 to 360-118 arranged vertically in two sections, with an upper section including HBM PHY tiles 360-11 to 360-118 separated from a lower section including HBM PHY tiles 360-10 to 360-118 by four rows of temperature/test contact pads 319. Similarly, xPU PHY region 315-2 includes eighteen xPU PHY tiles 360-21 to 360-218 arranged vertically in two sections, with an upper section including xPU PHY tiles 360-21 to 360-218 separated from a lower section including xPU PHY tiles 360-20 to 360-218 by four rows of temperature/test contact pads 319. Note that the two groups of temperature/test contact pads 319 in HBM PHY region 315-1 and xPU PHY region 315-2 are not interconnected, and therefore are omitted from further consideration below for brevity.

FIG. 6(B) shows HBM PHY tile 360-11 in additional detail. HBM PHY tile 360-11 includes twelve rows of contact pads including, in descending order, uppermost row 317-1, second to fifth rows 316-1 to 316-4, sixth and seventh rows 318-1 and 318-2, eighth to eleventh rows 316-5 to 316-8, and a twelfth row 317-2. The reference numbers assigned to the twelve rows reflects the designated signal type received from corresponding rows of HBM PHY contact pads 335-1 or xPU PHY contact pads 345-1 (see FIGS. 5(A) and 5(B)). That is, uppermost row 317-1 receives VSS, second to fifth rows 316-1 to 316-4 receive data signals, sixth and seventh rows 318-1 and 318-2 receive VDD, eighth to eleventh rows 316-5 to 316-8 receive data signals, and twelfth row 317-2 receives VSS. Each of these rows includes twelve contact pads, and sequentially arranged rows are offset. For example, uppermost row 317-1 includes contact pads 317-11 to 317-118, and second row 316-1 includes contact pads 316-11 to 316-118, where contact pads 316-11 to 316-118 are offset (shifted to the right) relative to contact pads 317-11 to 317-118. Note that remaining HBM PHY tiles 360-12 to 360-118 and xPU PHY tiles 360-21 to 360-218 are configured substantially identically to HBM PHY tile 360-11, and therefore the depiction and description of HBM PHY tile 360-11 is understood to apply to any of these other PHY tiles.

As indicated on the right side of FIG. 6(B), PHY tile 360-11 also includes eight sets of signal line segments 370-1 to 370-8 that extend under the contact pads in data rows 316-1 to 316-8 to side edge 360E of PHY tile 360-11, where each signal line segment extends from a corresponding contact pad to side edge 360E. As depicted in simplified form in FIG. 6(C), signal line segment set 370-1 includes twelve line segments 371-11 to 371-112 that respectively have fixed ends coupled to corresponding contact pads 316-11 to 316-112, respectively, and a free end disposed on tile edge 360E. For example, line segments 371-11 has a fixed end 371X-11 coupled to contact pad 316-11 and a free end 371E-11 disposed on side edge 360E-11. As explained above, contact pads 316-11 to 316-112 are formed by patterning an uppermost topside metal layer, and line segments 371-11 to 371-112 are formed using one or more sub-surface topside metal layers. As such, the fixed ends of line segments 371-11 to 371-112 are coupled to corresponding contact pads 316-11 to 316-112 by way of metal via structures 393 formed using known techniques. For example, fixed end 371X-11 of line segments 371-11 is coupled to contact pad 316-11 by way of a metal via 373-111. Note that, because line segments 371-11 to 371-112 are formed using one or more sub-surface topside metal layers, routing involves coupling associated signal line segments using parallel signal lines that are also patterned in the one or more sub-surface topside metal layers.

Figure 7A:
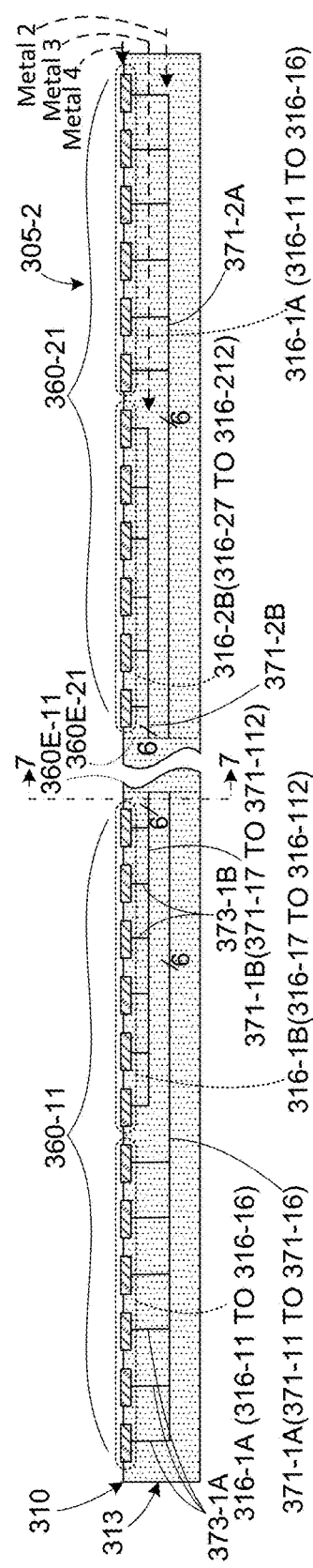
FIGS. 7(A) and 7(B) are simplified side and end cross-sectional views, respectively, showing a portion of topside metal layers of the interposer of FIG. 6(A)
Figure 7B:
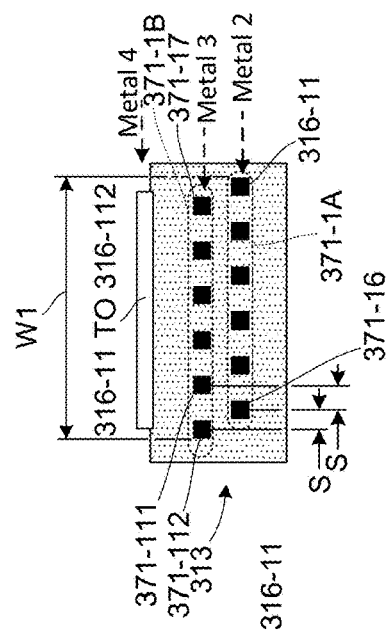

FIGS. 7(A) and 7(B) are simplified side and end cross-sectional views, respectively, showing a portion of topside metal layers 313. In particular, these figures show row 316-1 of PHY tile 360-11 in additional detail, and FIG. 7(A) also shows a corresponding row 316-1 of associated PHY tile 360-21 disposed in xPU PHY region 305-2 (see FIG. 6(A) for reference).

Referring to the right side of FIG. 7(A), contact pads 316-11 to 316-112 are separated into two groups including a left side (first) group 316-1A including contact pads 316-11 to 316-16, and a rightside (second) group 316-1B including contact pads 316-17 to 316-112, where rightside group 316-1B is disposed between left side group 316-1A and tile edge 360E-11. As mentioned above, contact pad group 316-1A is coupled to a first signal line segment group 371-1A including signal line segments 371-11 to 371-16, by way of metal vias 373-1A, and contact pad group 316-1B is coupled to a second signal line segment group 371-1B including signal line segments 371-11 to 371-16 by way of metal vias 373-1B. As indicated in FIGS. 7(A) and 7(B), signal line segment group 371-1A is implemented by patterned metal structures disposed in a (first) sub-surface metal layer Metal 2, and signal line segment group 371-1B is implemented by patterned metal structures disposed in a (second) sub-surface metal layer Metal 3, where metal layer Metal 3 is disposed between metal layer Metal 2 and contact pads 316-11 to 316-112, which are disposed in an uppermost (surface level) metal layer Metal 4. Moreover, as indicated in FIG. 7(B), in one embodiment the signal line segments of signal line segment group 371-1A are laterally offset from the signal line segments of signal line segment group 371-1B by spacing distance S (e.g., line segment 316-16 is laterally offset from line segment 316-112 by distance S, and laterally offset from line segment 316-111 by the same distance S), where distance S is equal to or greater than the minimum gap spacing allowed by design rules of the fabrication process to be utilized during the fabrication of physical interconnect structures. As indicated in FIG. 7(B), all twelve signal line segments of groups 371-1A and 371-1B are disposed in a lateral width distance W1 that is slightly larger than a corresponding width of contact pads 316-11 to 316-112.

Referring to the left side of FIG. 7(A), contact pads 316-21 to 316-212 are also separated into two groups including a rightside (first) group 316-2A including contact pads 316-21 to 316-26, and a left side (second) group 316-2B including contact pads 316-27 to 316-212, where left side group 316-2B is disposed between rightside group 316-2A and tile edge 360E-21. Contact pad group 316-2A is coupled to a signal line segment group 371-2A and contact pad group 316-2B is coupled to a signal line segment group 371-1B by associated metal vias, where signal line segment group 371-2A is implemented in (first) sub-surface metal layer Metal 2, and signal line segment group 371-2B is implemented in (second) sub-surface metal layer Metal 3. As set forth below, during the routing process, signal lines that are generated to couple contact pad groups 316-1A and 316-2A are formed using metal layer Metal 3, and signal lines that are generated to couple contact pad groups 316-1B and 316-2B are formed using metal layer Metal 2. Considering the high speed (i.e., up to 2 GHz), the length of the signal wires (i.e., up to several millimeters), and the need to route all 1,728 signal lines between xPU 340 and each HBM stack 320-1 and 320-2 as evenly as possible, the implementation of two line segment groups (i.e., 371-1A and 371-1B, and 371-2A and 371-2B) serves to halve the distance between the furthest and the closest pairs of associated contact pads (otherwise 2.2 millimeters).

Figure 8A:
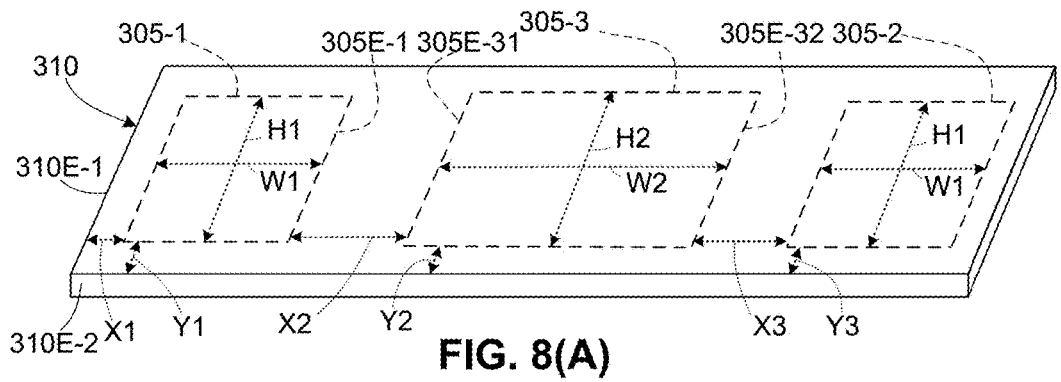
FIGS. 8(A), 8(B) and 8(C) are simplified perspective views depicting an exemplary tile-based place-and-route process utilized to generate an interposer for a HBM-based IC device according to an embodiment of the present invention.
Figure 8B:
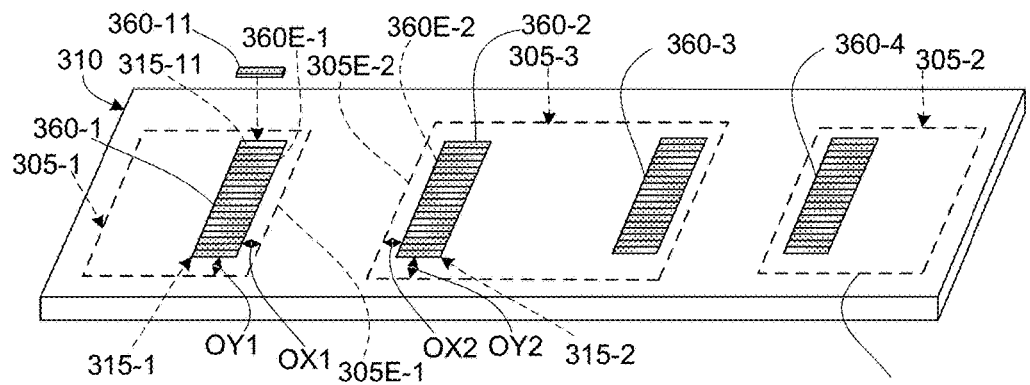
Figure 8C:
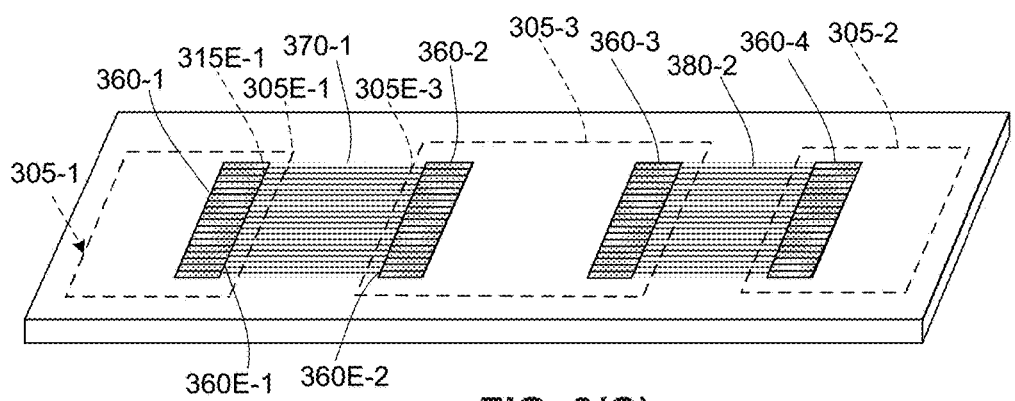

FIGS. 8(A) to 8(C) are simplified perspective views depicting an exemplary tile-based place-and-route process utilized to generate interposer 310 for the HBM-based IC device described above.

FIG. 8(A) illustrates interposer layout 310 after floorplanning (block 120A, FIG. 1) is performed during which HBM stack footprint regions 305-1 and 305-2 are assigned for occupation by HBM stacks 320-1 and 320-2, respectively, and an xPU footprint region 305-3 is selected and reserved for occupation by xPU 340. As indicated in FIG. 8(A), footprint regions 305-1 and 305-2 are sized using dimensions H1 and W1 of HBM stacks 320-1 and 320-2, and footprint region 305-3 is sized using dimensions H2 and W2 of xPU 340 (see FIG. 4(A), described above). Footprint regions 305-1 to 305-3 are positioned at specified locations of interposer layout 310 (e.g., footprint region 305-1 is located distances X1 and Y1 from boundary edges 310E-1 and 310E-2 of interposer 310, footprint region 305-3 is located distances X2 from side edge 305E-1 of footprint 305-1 and distance Y1 from boundary edge 310E-2, and footprint region 305-2 is located distances X3 from side edge 305E-32 of footprint 305-3 and distance Y3 from boundary edge 310E-2).

FIG. 8(B) depicts interposer 310 during placement of tiles 360-1, 360-2, 360-3 and 360-4 into footprint regions 305-1, 305-2 and 305-3. In particular, tiles 360-1 are placed in HBM PHY region 315-1, whose location inside HBM footprint region 305-1 is determined by JEDEC standards (e.g., using spacing distances OX1 and OY1 associated with the location of HBM PHY contact pads 335-1 on HBM stack 320-1; see FIG. 5(A)). Similarly, tiles 360-2 are placed in xPU PHY region 315-2, whose location inside xPU footprint region 305-2 is determined by spacing OX2 and OY2 associated with the location of xPU PHY contact pads 345-1 on xPU 340 (see FIG. 5(B)). Tiles 360-3 and 360-4 are positioned inside xPU footprint region 305-2 and HBM PHY footprint region 305-3 in a similar manner. Note that placing tiles 360-1, 360-2, 360-3 and 360-4 includes placing eighteen identical tile configurations into eighteen sub-regions of each PHY region (e.g., tile 360-11 is placed into sub-region 315-11 of HBM PHY region 315-1, and seventeen tiles identical to tile 360-11 are placed in adjacent sub-regions of HBM PHY region 315-1). As set forth above, placement involves orienting the tiles such that the free ends of all 1,728 line segments on the eighteen tiles of tile set 360-1 are aligned along tile edge 360E-1, which is parallel to side edge 305E-1 of HBM footprint region 305-1, and the free ends of all 1,728 line segments on the eighteen tiles of tile set 360-2 are aligned along tile edge 360E-2, which faces tile edge 360E-1. Note also that the HBM-based tile configuration set forth with reference to FIGS. 6(A) to 7(B) provides all 1,728 line segments of tile set 360-1 in a mirrored order relative to all 1,728 line segments of tile set 360-2.

Figure 9A:
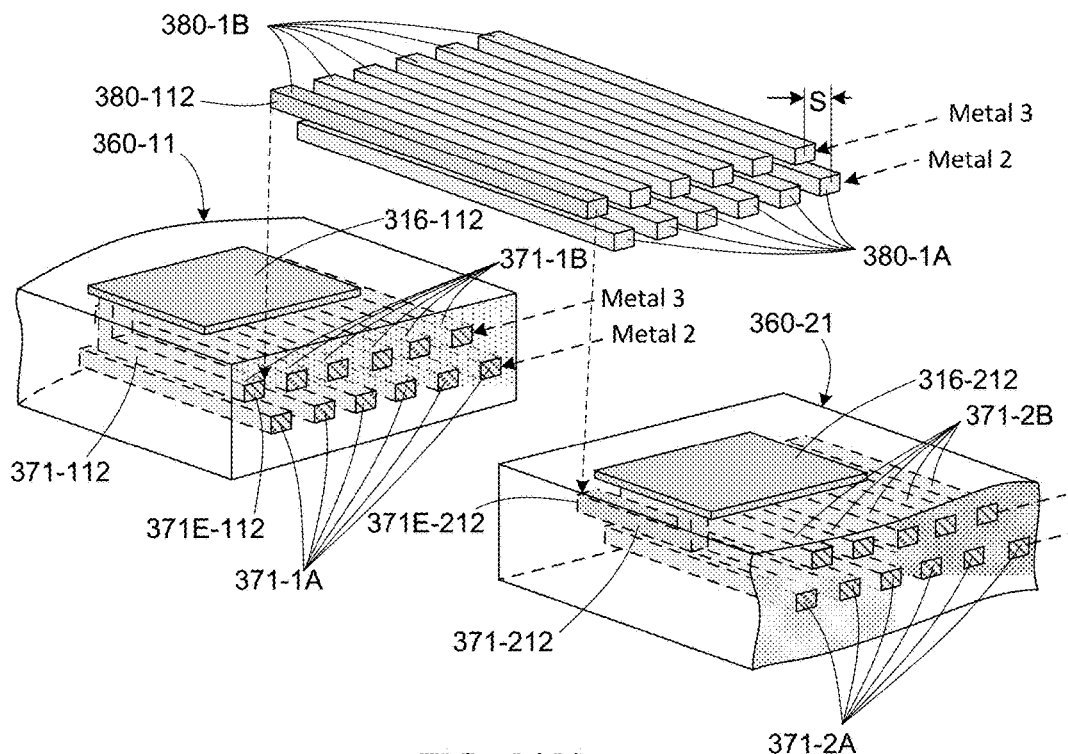
FIGS. 9(A) and 9(B) are partial exploded and assembled perspective views, respectively, showing a routing process for one row of an HBM tile according to an aspect of the present invention.
Figure 9B:
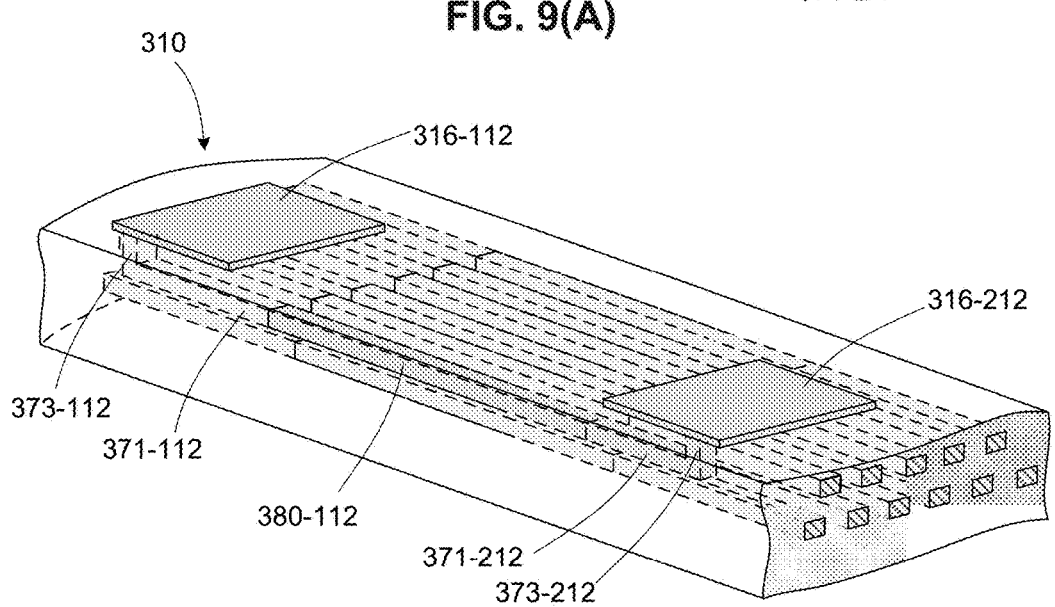

FIG. 8(C) depicts interposer 310 after a routing process including generating parallel signal lines 380-1 between HBM tile sets 360-1 and 360-2, and generating parallel signal lines 380-2 between HBM tile sets 360-3 and 360-4. Consistent with the routing process described with reference to the earlier embodiments, parallel signal lines 380-1 extend between side edge 305E-1 of HBM footprint region 305-1 and side edge 305E-2 of xPU footprint region 305-2, whereby parallel signal lines are coupled between free ends of line segments formed by tile set 360-1 and free ends of associated line segments formed by tile set 360-2, whereby parallel signal lines couple each contact pad disposed in tile set 360-1 with an associated contact pad disposed on tile set 360-2 by way of the corresponding line segments, thereby enabling parallel data transmission between tiles sets 360-1 and 360-2. As indicated in FIGS. 9(A) and 9(B), in the case of HBM tiles such as those described above with reference to FIGS. 6(A) to 7(B), routing requires configuring the parallel signal lines using multiple sub-surface metal layers. That is, parallel signal line group 371-1A of tile 360-11 is coupled to parallel signal line group 371-2A of tile 360-21 by way of providing signal line group 380-1A formed in sub-surface metal layer Metal 2, and parallel signal line group 371-1B of tile 360-11 is coupled to parallel signal line group 371-2B of tile 360-21 by way of providing signal line group 380-1B formed in sub-surface metal layer Metal 2. As indicated in FIG. 9(B), the result of this routing process is coupling of each contact pad in tile 360-11 to an associated contact pad in tile 360-21 (e.g., contact pad 316-112 is connected to contact pad 316-212 by the series connection metal via 373-112, line segment 371-112, signal line 380-112, line segment 371-212 and metal via 373-212). Note that parallel signal line groups 380-1A and 380-1B are configured using the same lateral offset as that utilized by the signal line segment groups (e.g., with parallel signal lines 380-1B offset from parallel signal lines 380-1B by spacing distance S).

Although the basic HBM tiles described above (e.g., tile 360-11 in FIG. 6(B)) can be utilized to greatly simplify place-and-route of the large number of signal lines (i.e., 1,728 signal lines per HBM stack) during the development of a given HBM-based IC device, in practical applications these signal lines require shielding to achieve maximum data transmission rates. That is, HBM is rapidly emerging as the ideal RAM interface technology for integrating vast amounts of memory (currently, up to 16 GB) that can be delivered at throughput rates on the order of terabytes per second. The drawback to the HBM configuration is that the 1,728 signal lines connecting each HBM PHY to an associated processor PHY can be up to several millimeters long, resulting in crosstalk and other capacitive coupling issues.

The following embodiments expand on the tile-based place-and-route methodology (i.e., as applied to the development of HBM-based IC devices) by providing HBM PHY tiles that include pre-routed shielding line segments that extend parallel to the signal line segments, and having free ends that terminate at the same vertical plane tile edge as the signal line segments. By utilizing matching HBM PHY tiles configured in this manner, generating a routing solution for the increased number of total signal lines (i.e., up to approximately 3,600 wires per HBM stack) is relatively easily achieved by way of generating parallel shield lines between associated shield line segments during generation of the parallel signal lines, whereby the parallel shield lines are effectively interspersed within the parallel signal lines.

FIG. 10 is a plan view showing an HBM PHY tile 460 configured to include shield lines according to another embodiment of the present invention. Similar to HBM PHY tile 360-11 (FIG. 6(B)), HBM PHY tile 460 includes twelve rows of contact pads configured according to JEDEC standards that include, in descending order, first (VSS) row 417-1, second to fifth (data) rows 416-1 to 416-4, sixth and seventh (VDD) rows 418-1 and 418-2, eighth to eleventh (data) rows 416-5 to 416-8, and twelfth (VSS) row 417-2. The reference numbers assigned to the twelve rows are similar to those utilized by HBM PHY 360-11 to reflect the designated signal type (VSS, data or VDD) received from corresponding contact pad rows on an HBM or xPU PHY. Each of these rows includes twelve contact pads, and sequentially arranged rows are offset as in the previous embodiment.

HBM PHY 460 differs from basic HBM PHY tile 360-11 (see FIG. 6(B)) in the following ways that facilitate the addition of shield line segments.

First, in order to provide sufficient space in the Y-axis direction to accommodate the shield line segments, the widths of line channels 470-1 and 470-2 (i.e., the sub-surface regions of each tile that are occupied by signal and shield line segments, and are generally indicated by rectangular shaded regions in FIG. 10) are widened in the Y-axis direction to extend under the rows of VSS and VDD contact pads that are disposed above/below each group of four rows of data contact pads. As explained below with reference to FIGS. 13(A) to 13(C), each channel 470-1 and 470-2 includes four sets of parallel signal/shield lines (i.e., one set for each row of data contact pads), where each of the four sets is configured in the manner described below with reference to FIG. 12. That is, line channel 470-1 includes the four sets of parallel signal line segments coupled to the contact pads of second to fifth (data) rows 416-1 to 416-4, and line channel 470-2 includes the four sets of parallel signal line segments coupled to the contact pads of eighth to eleventh (data) rows 416-5 to 416-8. As indicated by the shaded region in FIG. 10, the Y-axis width of line channel 470-1 extends from an uppermost signal line that is disposed under first (VSS) row 417-1 to a lowermost signal line that is disposed under sixth (VDD) row 418-1, where the uppermost signal line is coupled to a contact pad of second (data) row 416-1, and the lowermost signal line is coupled to a contact pad of fifth (data) row 416-4. Similarly, the Y-axis width of line channel 470-2 extends from an uppermost signal line that is disposed under sixth (VDD) row 418-2 and a lowermost signal line that is disposed under twelfth (VSS) row 417-2, where the uppermost signal line is coupled to a contact pad of eight (data) row 416-5, and the lowermost signal line is coupled to a contact pad of eleventh (data) row 416-8.

Second, at least some of the contact pads of each data row are modified to includes step-like extensions to facilitate reliable connect to the wider sets of signal line segments. That is, the JEDEC specified size of each contact pad is a maximum of 25 microns±10%, and in some applications it is desirable to use a smaller contact pad size (e.g., 23 microns). As indicated in FIG. 11(A), at least some contact pads 416 include a base pad 416A and a step-like extension 416B that extends from a central point 416AC of base pad 416A by a distance X determined by the location of an associated signal line 471 to which contact pad 416 must be connected by way of an associated metal via 473. Because the size of contact pad base 416A may be selected by a device developer, each step-like extension 416B is configured to reliably connect base 416A to metal via 473 whether the device developer designates a maximum base size (e.g., size $D_{MAX}$, as depicted in FIG. 11(A)) or a minimum base size (e.g., size $D_{MIN}$, as depicted in FIG. 11(B)). Referring again to FIG. 10, the step-like extensions are depicted on relevant contact pads by darkened rectangular blocks. Note that, although the step-like extensions are depicted using a darker shade that that of the contact pad base to provide visual contrast, both the contact pad bases and the step-like extensions are formed using the same (e.g., Metal 4) material, and are integrally connected in physical interposers fabricated using HBM PHY tile 460. Note also that some of the contact pads shown in FIG. 10 do not include step-type extensions—this indicates that step-like extensions may not be required where signal lines pass directly under the associated contact pads (i.e., where metal vias are positioned inside the minimum base size area). In a practical embodiment, each tile 460 is stored as a parameterized cell (P-cell) in which these step-like extensions, metal vias and signal line segments stored as invariant (fixed, not changeable) layout features, and the only variable parameter is the contact pad base size.

A third way HBM PHY 460 differs from basic HBM PHY tile 360-11 is that each row of VSS contact pads (i.e., first row 417-1 and twelfth row 417-2) is coupled to one or more VSS mesh structures that extend between the rows of data contact pads to facilitate transmission of VSS to each of the shield line segments. In the embodiment depicted in FIG. 10, five VSS mesh structures 419-1 to 419-5 extend downward from first (VSS) row 417-1 and extend entirely across second to fourth (data) rows 416-1 to 416-4, and five VSS mesh structures 419-6 to 419-10 extend upward from twelfth (VSS) row 417-2 and across eighth to eleventh (data) rows 416-5 to 416-8. VSS mesh structures 419-1 to 419-10 are coupled to the same VSS source as that applied to the contact pads of first (VSS) row 417-1 and twelfth (VSS) row 417-2, and are coupled to the shield line segments as described below with reference to FIG. 12.

Figure 12:
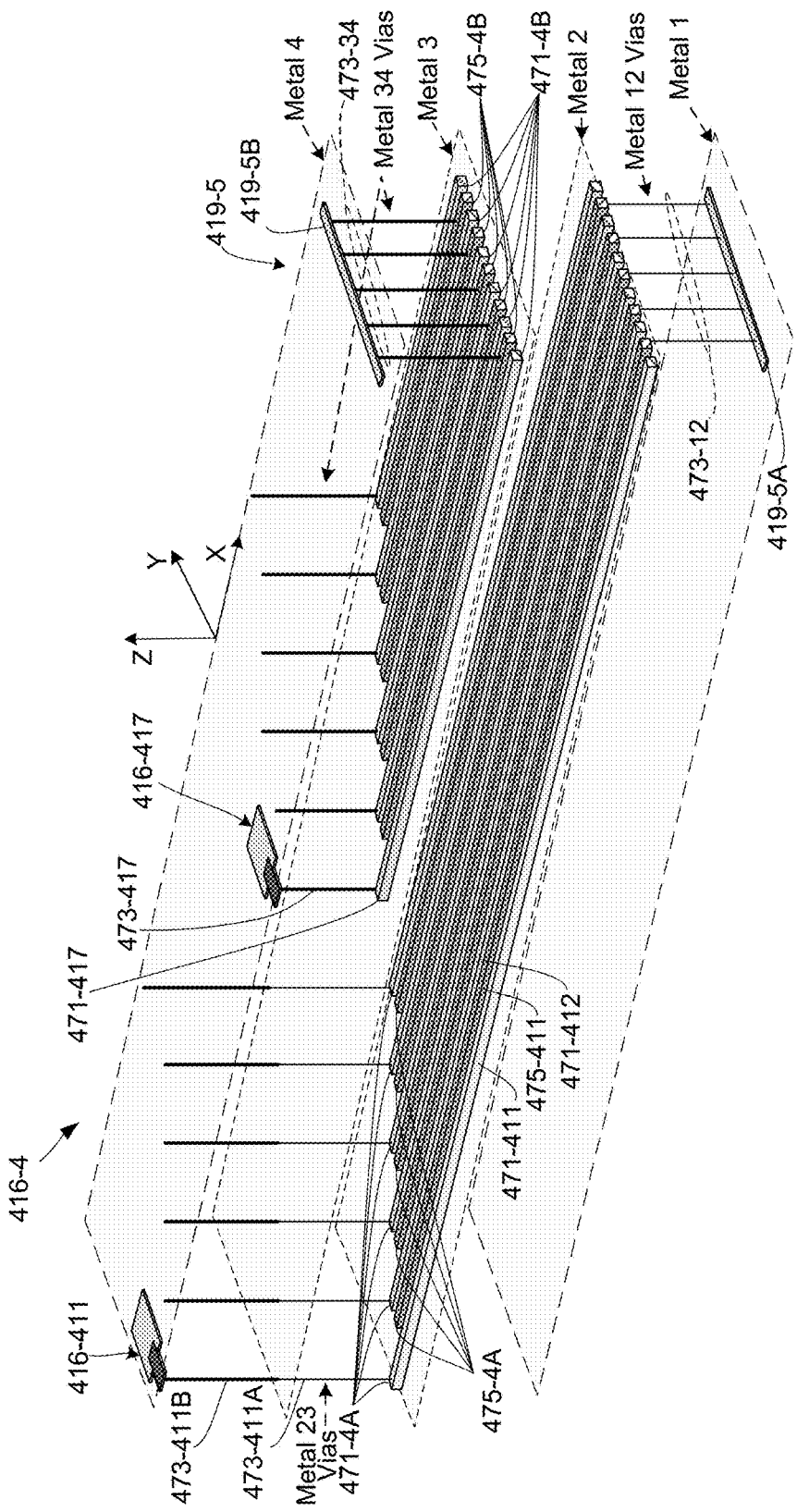
FIG. 12 is a partial exploded perspective diagram depicting one set of signal and shield line segments corresponding to an exemplary row of the HBM PHY of FIG. 10.

FIG. 12 is a partial exploded perspective diagram depicting one set of signal and shield line segments corresponding to fifth (data) row 416-4 of HBM PHY 460 (FIG. 10). Note that several of the structures shown in FIG. 10 are omitted in FIG. 12 for clarity (e.g., only two of the twelve contact pads forming fifth row 416-4, i.e., 416-411 and 416-417, are depicted in FIG. 12), and that the various depicted structures are not drawn to scale. The various metal layers and vias utilized to form the depicted structures are indicated for reference. For example, contact pads 416-411 and 416-417 are formed from patterned portions of uppermost metal layer Metal 4, first signal segment group 471-4A includes signal line segments formed using sub-surface metal layer Metal 2 that are coupled to associated contact pads by way of two series connected metal via structures passing between the Metal 2 and Metal 4 layers (e.g., signal line 475-411 is coupled to contact pad 416-411 by a Metal 23 via 473-411A and a Metal 34 via 473-411B), and second signal segment group 471-4B includes signal line segments formed using sub-surface metal layer Metal 3 that are coupled to associated contact pads by way of a single metal via structure passing between the Metal 3 and Metal 4 layers (e.g., signal line 475-417 is coupled to contact pad 416-417 by a Metal 34 via 473-417).

HBM tile 460 also differs from HBM tile 360-11 in that HBM tile 460 includes shield line segments respectively disposed between adjacent pairs of signal line segments. As indicated on the right side of FIG. 12, the shield line segments of fifth row 416-4 include a first shield line segment group 475-4A and a second shield line segment group 475-4B. First shield line segment group 475-4A includes parallel metal lines that are formed/pattered using metal layer Metal 2, with each shield line segment of group 475-4A being disposed between two adjacent signal line segments of first signal segment group 471-1A (e.g., shield line segment 475-411 is disposed between signal line segments 471-11 and 471-12). Similarly, second shield line segment group 475-4B includes parallel metal lines that are formed/pattered using metal layer Metal 3, with each shield line segment of group 475-4B being disposed between two adjacent signal line segments of second signal segment group 471-1B. In one embodiment the length of each shield line segment is substantially equal to the shorter of the two adjacent shield segments separated by the shield line segment (e.g., the length of shield line segment 475-411 is substantially equal to that of signal line segment 471-12).

To facilitate transmitting VSS to shield line segments formed in the Metal 2 and Metal 3 layers, each of the ten VSS mesh structures 419-1 to 419-10 depicted in FIG. 10 includes two sections respectively extending above and below the signal line segments, where the two sections are respectively coupled to the two groups of shield line segments by associated metal vias. For example, as indicated in FIG. 12, VSS mesh structure 419-5 includes a lower section 419-5A formed using a lowermost metal layer Metal 1, and an upper section 419-5B formed using uppermost (surface) metal layer Metal 4, where lower section 419-5A is coupled to the shield line segments of group 475-4A by way of associated Metal 12 vias 473-12 (i.e., via structures passing between Metal 1 and Metal 2), and upper section 419-5B is coupled to the shield line segments of group 475-4B by way of associated Metal 34 vias 473-34.

Figure 13A:
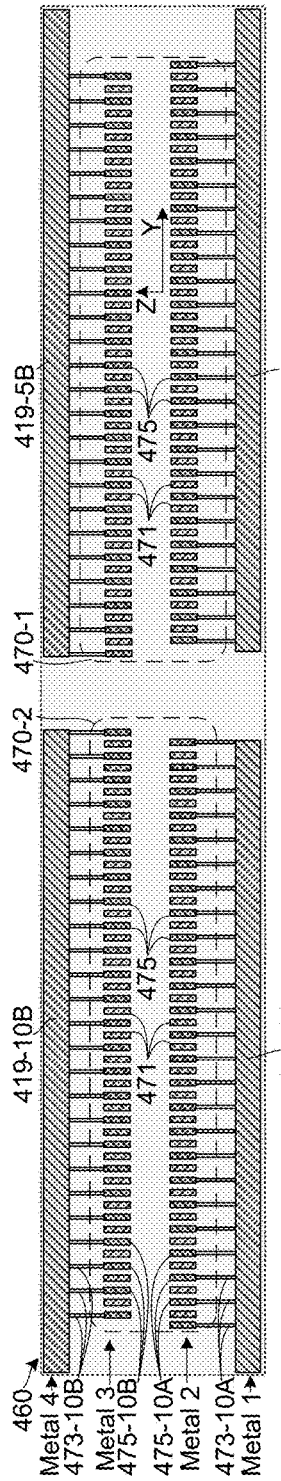
FIGS. 13(A), 13(B) and 13(C) are modified cross-sectional end views showing exemplary signal line segment patterns that collectively form corresponding end points (routing pins) at an edge of the HBM PHY tile of FIG. 10 tile.
Figure 13B:
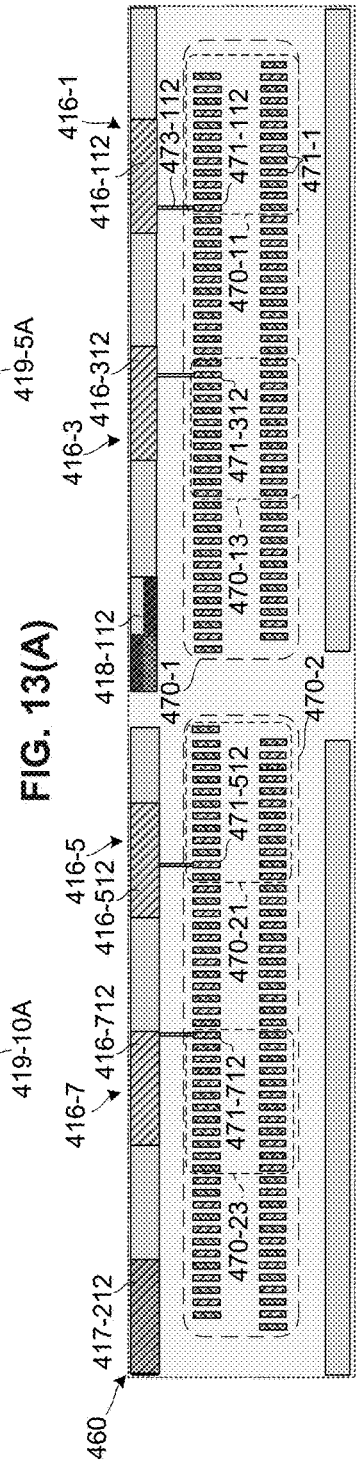
Figure 13C:
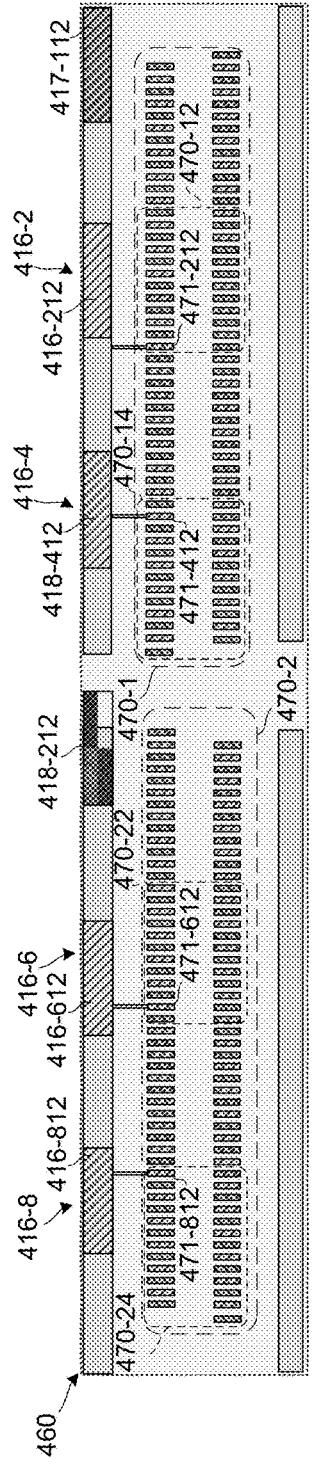

FIGS. 13(A), 13(B) and 13(C) are modified cross-sectional end views of HBM PHY tile 460 taken along section lines 13A-13A, 13B-13B and 13C-13C (see FIG. 10) showing an exemplary pattern of 96 signal line segments 471 and 100 shield line segments 475 that are collectively disposed in line channel 470-1 and 470-2 and form corresponding end points (routing pins) at the edge of tile 460 (i.e., at tile edge 460E, shown in FIG. 10). That is, referring to FIG. 13(A), line channel 470-1 includes a first group of ninety-six line segments (i.e., forty-six signal lines 471 and fifty shield line segments 475), and line channel 470-2 includes a second group of ninety-six line segments (i.e., forty-six signal lines 471 and fifty shield line segments 475). As indicated in FIG. 13(A), half of the signal line segments 471 and half of the shield line segments 475 of each line channel are formed in a lower sub-surface metal layer (i.e., Metal 2), and half of the shield line segments 475 of each line channel are formed in an upper sub-surface metal layer (i.e., Metal 3). Referring to FIGS. 13(B) and 13(C), the signal and shield lines of each line channel 470-1 and 470-2 are effectively divided into four sets 470-11 to 470-14 and 470-21 to 470-24, where each of these sets including a group of shield lines and twelve signal lines that are coupled to an associate row of data contact pads, and where each of the four sets is configured in the manner described above with reference to FIG. 12. During the routing portion of the tile-based place-and-route process, end points (i.e., routing pins) of these 196 line segments located at tile edge 460E (shown in FIG. 10) are connected to a mirror ordered group of associated line segment end points in a corresponding PHY tile.

In accordance with the arrangement shown in FIG. 12, all shield line segments in line channels 470-1 and 470-2 are coupled to the VSS mesh structures 419-5 and 419-10 by way of corresponding metal via structures. For example, as indicated in FIG. 13(A), line channel line channel 470-2 includes twenty-five shield line segments 475-10A formed in metal layer Metal 2 that are coupled to lower VSS mesh structure section 419-10A by way of Metal 12 via structures 473-10A, and also includes twenty-five shield line segments 475-10B formed in metal layer Metal 3 that are coupled to upper VSS mesh structure section 419-10B by way of Metal 34 via structures 473-10B. Similarly, line channel line channel 470-1 includes twenty-five lower shield line segments formed in metal layer Metal 2 that are coupled to lower VSS mesh structure section 419-5A by way of corresponding Metal 12 via structures, and twenty-five upper shield line segments formed in metal layer Metal 3 that are coupled to upper VSS mesh structure section 419-5B by way of Metal 34 via structures 473-10B.

Referring to FIGS. 13(B) and 13(C), the four line segment sets 470-11 to 470-14 of line channel 470-1 include parallel signal line segments 471 respectively coupled to the contact pads of second to fifth (data) rows 416-1 to 416-4, and the four line segment sets 470-21 to 470-24 of line channel 470-2 parallel signal line segments respectively coupled to the contact pads of eighth to eleventh (data) rows 416-5 to 416-8. Specifically, as depicted in the right side of FIG. 13(B), set 470-11 of line channel 470-1 includes twelve signal line segments 471 coupled to the contact pads of second (data) row 416-1 (e.g., data contact pad 416-112 is coupled to signal line segment 471-112 by way of Metal 34 via structure 473-112). In a similar manner, the signal line segments of sets 470-12 to 470-14 of line channel 470-1 are coupled to the contact pads of (data) rows 416-2 to 416-4, respectively (e.g., data contact pad 416-312 is coupled to signal line segment 471-312 (FIG. 13(B), and data contact pads 416-212 and 416-412 are respectively coupled to signal line segments 471-212 and 471-412 (FIG. 13(C)), and the signal line segments of sets 470-21 to 470-24 of line channel 470-2 are coupled to the contact pads of (data) rows 416-5 to 416-8, respectively (e.g., referring to FIG. 13(B), data contact pads 416-512 and 416-712 are coupled to signal line segments 471-512 and 471-712, respectively, and in FIG. 13(C), data contact pads 416-612 and 416-812 are respectively coupled to signal line segments 471-612 and 471-812).

As mentioned above with reference to FIG. 10, Y-axis width of line channel 470-1 extends from an uppermost signal line that is disposed under first (VSS) row 417-1 to a lowermost signal line that is disposed under sixth (VDD) row 418-1, and the Y-axis width of line channel 470-2 extends from an uppermost signal line that is disposed under sixth (VDD) row 418-2 and a lowermost signal line that is disposed under twelfth (VSS) row 417-2. This arrangement is shown in additional detail in FIGS. 13(B) and 13(C), where the right-most line segments of line channel 470-1 are depicted as extending under (VSS) contact pad 417-112 (see FIG. 13(C)), the left-most line segments of line channel 470-1 are depicted as extending under (VDD) contact pad 418-112 (see FIG. 13(B)), the right-most line segments of line channel 470-2 are depicted as extending under VDD contact pad 418-212 (see FIG. 13(C)), and the left-most line segments of line channel 470-1 are depicted as extending under VSS contact pad 417-212 (see FIG. 13(B)).

Figure 14A:
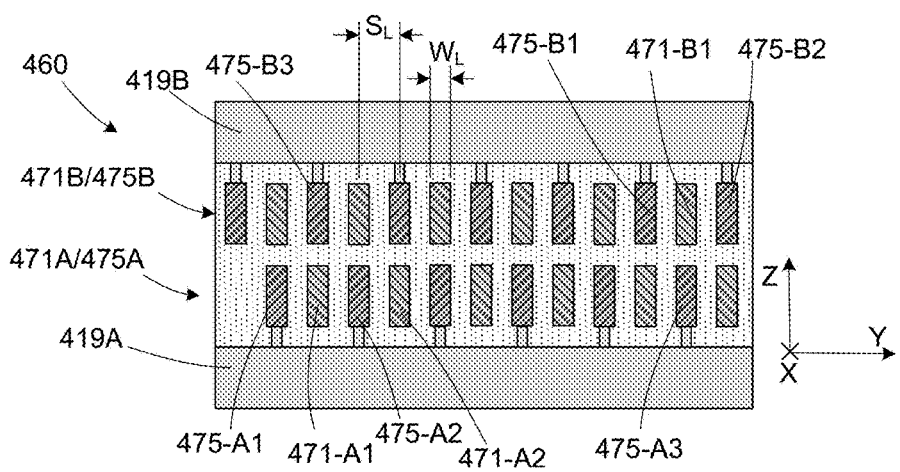
FIGS. 14(A), 14(B), 14(C) and 14(D) are partial cross-sectional views showing alternative signal and shield line configurations utilized in the HBM PHY tiles of the type shown in FIG. 10 according to alternative specific embodiments of the present invention.

The shielding arrangement implemented by HBM PHY tile 460 provides coaxial shielding of the signal line segments by way of disposing each signal line segment between two shield line segments, and also provides partial "sandwich" shielding of each signal line segment by way of offsetting the shield and signal lines in the two metal layers by one track. For example, FIG. 14(A) is an enlarged cross-sectional view showing a portion of HBM PHY tile 460 that includes a lower series of signal line segments 471A and shield line segments 475A and an upper series of signal line segments 471B and shield line segments 475B between a lower VSS mesh structure 419A and an upper VSS mesh structure 419B. In each layer of line segments, each signal line segment is co-axially shielded by way of being disposed between two shield line segments (e.g., 471-A1 is co-axially shielded by way of being disposed between shield line segments 475-A1 and 475-A2). This arrangement allows adjacent pairs of signal line segments in each layer share the VSS signal generated on the shield line segment disposed therebetween (e.g., adjacent signal line segments 471-A1 and 471-A2 share the VSS signal transmitted on shield line segment 475-A2). In addition, lower segment series 471A/475A is offset by one track from upper segment series 471B/475B in that Metal 2 signal line segments are vertically (Z-axis) aligned under Metal 3 shield line segments, and Metal 3 signal line segments are vertically aligned over Metal 2 shield line segments (e.g., signal line segment 471-A1 is located directly below shield line segment 475-B3, and signal line segment 471-B1 is located directly above shield line segment 475-A3). This offset arrangement in combination with the coaxial shielding arrangement produces partial "sandwich" by way of disposing VSS signals on three sides of each signal line (e.g., e.g., 471-A1 is partial sandwich shielded by way of being disposed between shield line segments 475-A1 and 475-A2 and below shield line segment 475-B3).

Figure 14B:
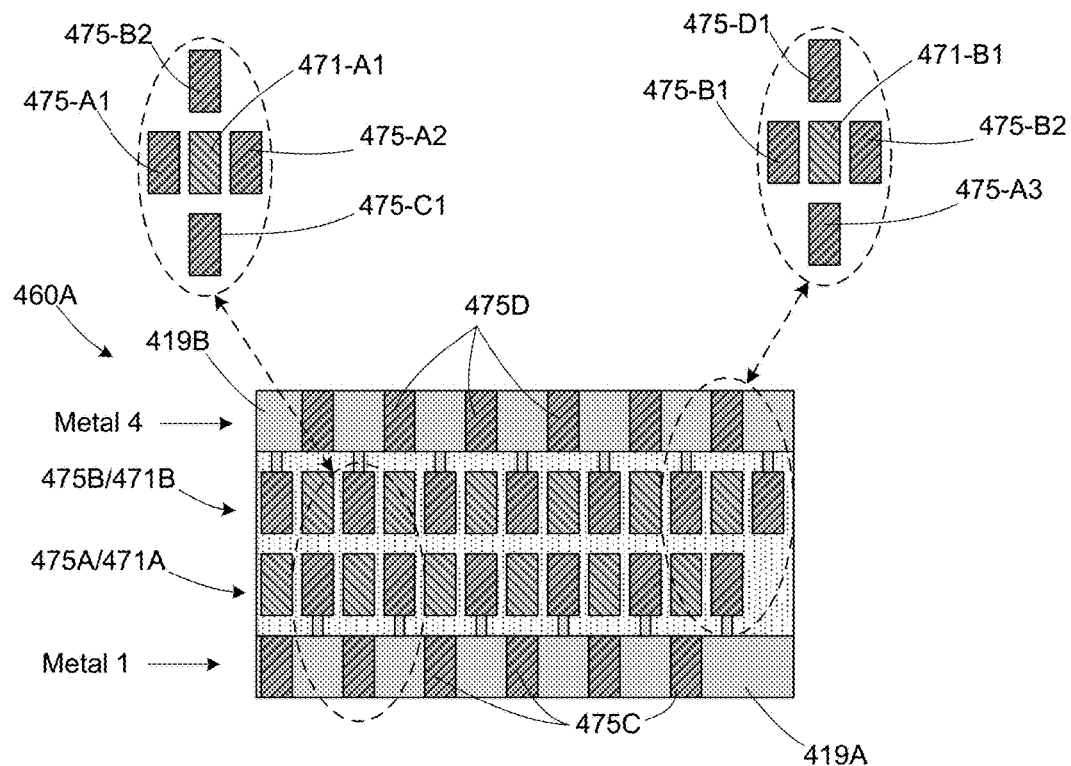

FIG. 14(B) shows an HBM PHY tile 460A including an optional four-sided shielding arrangement in which additional Metal 1 and Metal 4 shield lines are added to the above-described shielding arrangement to provide further shielding protection for the signal lines. Note that portions of HBM PHY tile 460A that are identical to those described above with reference to FIG. 14(A) are identified with the same reference numbers mentioned above. In accordance with the four-sided shielding arrangement, additional parallel lower shield line segments 475C that are formed using the lower metal layer (Metal 1) in an offset arrangement to signal line segments 471A, and additional parallel upper shield line segments 475D that are patterned using the surface (uppermost) metal layer (Metal 4) in an offset arrangement to signal line segments 471B. That is, referring to the bubble disposed in the upper left portion of FIG. 14(B), lower shield line segment 475-C1 is disposed directly under associated signal line segment 471-A1 of (first) line segment group 471A, whereby signal line segment 471-A1 is surrounded on four sides by (underlying) lower shield line segment 475-C1, (sideways positioned) shield line segments 475-A1 and 475-A2 of (first) group 475A, and (overlying) shield line segment 475-B1 of (second) group 475B. In addition, as depicted in the bubble disposed in the upper right portion of FIG. 14(B), upper shield line segment 475-D1 is disposed directly over associated signal line segment 471-B1 of (second) line segment group 471B, whereby signal line segment 471-B1 is surrounded on four sides by upper shield line segment 475-D1, shield line segments 475-B1 and 475-B2, and shield line segment 475-A1. This four-sided shielding arrangement enhances shielding of the signal lines, and is also relatively easy to implement. Alternative embodiments may also be based on the tile-based place-and-route methodology, for example, by way of generating additional lower and upper (third and fourth) shield lines using the appropriate (third) sub-surface and surface metal layers (e.g., Metal 1 and Metal 4) such that each lower (third) shield line couples a lower shield line segment disposed on an HBM (first) PHY tile to an associated lower shield line segment on a xPU PHY (second) tile, and such that each upper (fourth) shield line is configured using the surface (uppermost) metal layer (e.g., Metal 4) such that each upper (fourth) shield line couples an upper shield line segment on the HBM (first) PHY tile to an associated upper shield line segment on the xPU (second) PHY tile 460-21. The four-sided shielding arrangement provides a significant advantage over conventional HBM shielding techniques, for example, when extremely high data rates or extremely long signal lines (e.g., 5 mm or greater) may be required, and do not significantly delay the generation of routing solutions.

Figure 14C:
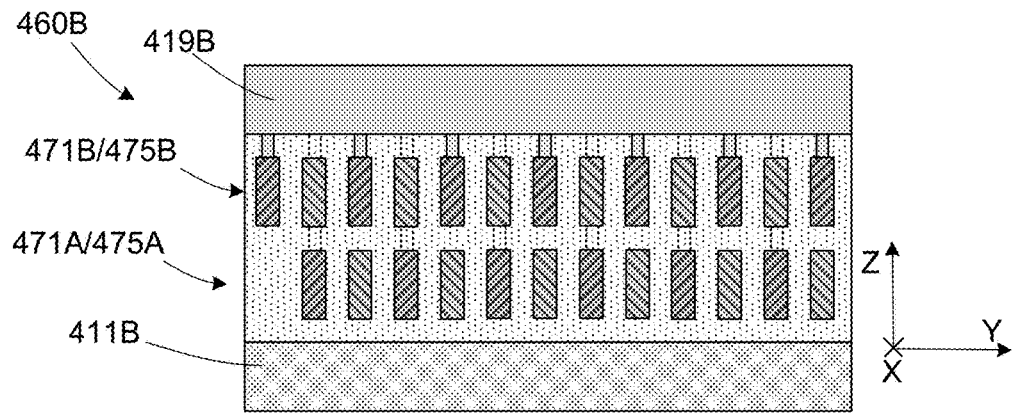
Figure 14D:
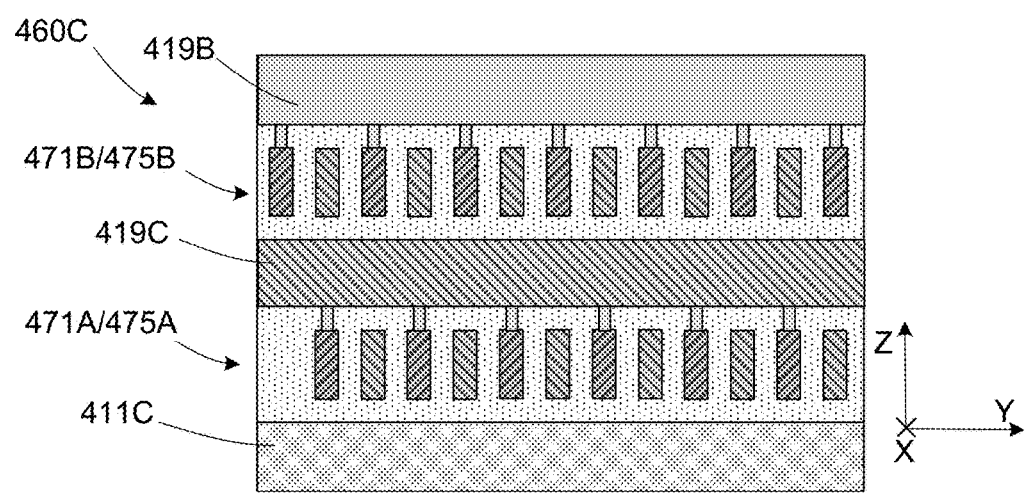

FIGS. 14(C) and 14(D) show two additional HBM PHY tiles 460B and 460C, respectively, including other optional shielding arrangements. HBM PHY tile 460B (FIG. 14(C)) is formed with an alternative arrangement in which a first set of signal lines and shield lines 471A/475A is formed in Metal 1 over interposer substrate 411B, a second set of signal lines and shield lines 471B/475B is formed in Metal 2 in the offset arrangement mentioned above, and an upper VSS mesh structure 419B is formed in Metal 3, where all shield line connections are made to mesh structure 419B as shown. HBM PHY tile 460B (FIG. 14(D)) includes another arrangement in which a first set of signal lines and shield lines 471A/475A is formed in Metal 1 over interposer substrate 411C, a second set of signal lines and shield lines 471B/475B is formed in Metal 3 in the offset arrangement mentioned above, and an upper VSS mesh structure 419B formed in Metal 3, where a solid metal shield plate 419C is formed using Metal 2 between the two sets of shield lines. In other embodiments the shield lines utilized in HBM PHY tile 460B may be omitted, or a mesh structure may be implemented in Metal 2 (i.e., no mesh structure is formed in Metal 4), with all connections to the two layers of shield lines being provided from Metal 2 mesh structure. These alternative arrangements may be selectively utilized to enhance signal transfer characteristics or to simplify fabrication (i.e., by way of using fewer metal layers).

Metal 3 shield lines are added to the above-described shielding arrangement to provide further shielding protection for the signal lines. Note that portions of HBM PHY tile 460A that are identical to those described above with reference to FIG. 14(A) are identified with the same reference numbers mentioned above.

Figure 15A:
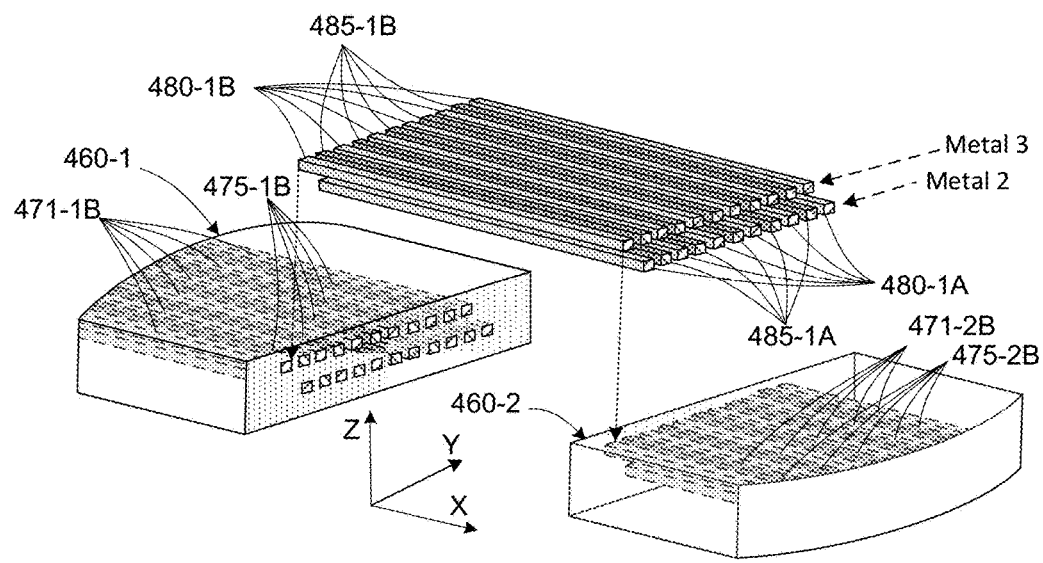
FIGS. 15(A) and 15(B) are partial exploded and assembled perspective views, respectively, depicting the connections formed during routing between corresponding rows of mirrored HBM PHY tiles of the type shown in FIG. 10.
Figure 15B:
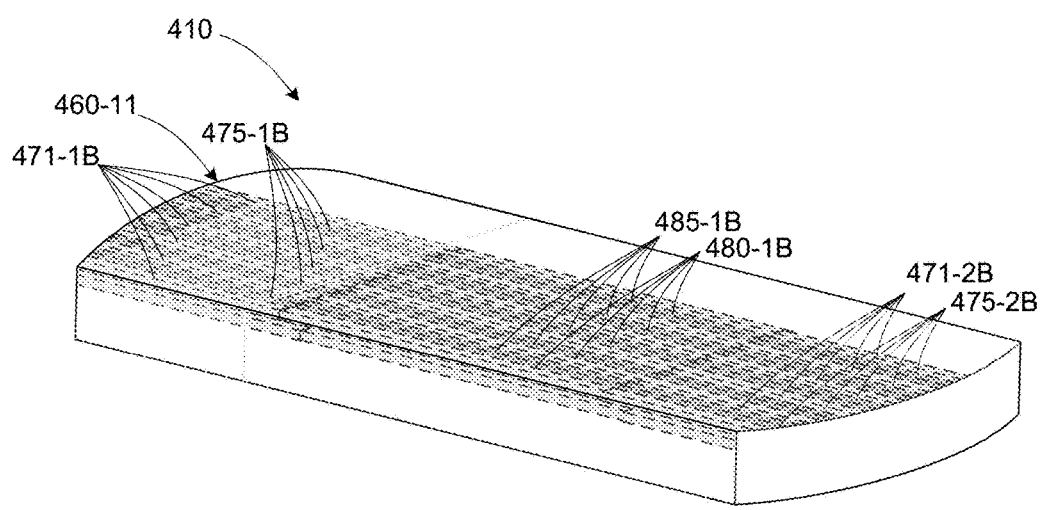

FIGS. 15(A) and 15(B) are partial perspective views depicting a routing process between portions of two associated HBM PHY tiles 460-1 and 460-2, each configured in the manner described above with reference to FIGS. 10 to 13(C). In general, the routing process involves generating parallel signal lines that couple free ends (routing nodes) of associated signal line segments disposed in associated HBM PHYs (e.g., signal line group 480-1B couples signal line segments 471-1B on HBM PHY tile 460-1 with signal line segments 471-2B on HBM PHY tile 460-2) in the manner described above, and at the same time generating parallel shield lines that couple free ends of associated (mirror ordered) shield line segments on HBM PHYs 460-1 and 460-2. As indicated in FIG. 15(A), generating the parallel shield lines includes generating a first shield line group 485-1A using metal layer Metal 2, and generating a second line group 485-1B using metal layer Metal 3. Generating first line group 485-1A involves generating shield lines disposed between adjacent signal lines of group 480-1A that are coupled at one end to corresponding free ends of shield line segments of first group 475-1A on HBM tile 460-1, and on the other end to free ends of associated shield line segments of group 475-2A on HBM tile 460-2. Generating second line group 485-1B involves generating shield lines disposed between adjacent signal lines of group 480-1B that are coupled at one end to corresponding free ends of shield line segments of group 475-1B on HBM tile 460-1 and at the other end to corresponding free ends of shield line segments of group 475-2B on HBM tile 460-2. FIG. 15(B) shows a portion of a completed silicon interposer 410 including signal lines 489-1B and shield lines 485-1B respectively connected between associated signal line segments 471-1B and 471-2B and shield line segments 471-1B and 475-2B.

The above-described routing process is easily modified for four-sided shielding PHY tile configurations (e.g., such as tile 460A described above with reference to FIG. 14(B)) by way of generating additional lower and upper (third and fourth) shield lines using the appropriate (third) sub-surface and surface metal layers (e.g., Metal 1 and Metal 4) such that each lower (third) shield line couples a lower shield line segment disposed on an HBM (first) PHY tile to an associated lower shield line segment on a xPU PHY (second) tile, and such that each upper (fourth) shield line is configured using the surface (uppermost) metal layer (e.g., Metal 4) such that each upper (fourth) shield line couples an upper shield line segment on the HBM (first) PHY tile to an associated upper shield line segment on the xPU (second) PHY tile 460-21. Because these additional parallel shield lines are routed between mirror ordered pins disposed on the same tile edges as those of the other shield lines and signal lines, the additional routing time required to accommodate four-sided shielding configurations is minimal, and may be considered insignificant in cases where the enhanced signal shielding is needed to achieve performance objectives.

In a presently preferred embodiment, PHY tile 460 is configured in a manner that is easily producible with currently available silicon interposer fabrication processes (i.e., having a 400-nanometer Design Rule Manual (DRM)). Referring again to FIG. 14(A), HBM PHY tile 460 is configured such that the line width $W_L$ of each signal and shield line is one micron, with the lines set at a spacing distance $S_L$ of two microns, which conforms with the overall (Y-axis) width restriction of approximately 330 microns for each PHY tile 460 based on HBM JEDEC specifications. Accordingly, PHY tile 460 is very flexible, and electrically reliable due to the conservative design rules. Moreover, by implementing an EDA tool with a modified placement tool that accesses and places HBM PHY tiles and xPU PHY tiles that are consistent with PHY tile 460, the present invention facilitates fully automated routing of the HBM PHY and xPU PHY using only two interconnect layers in a way that is extremely silicon real estate efficient.

According to another embodiment of the present invention, the above-described routing process is further modified to facilitate generating routing solutions for floorplan arrangements including Y-axis alignment offsets without significant increases in routing tool processing time over that needed to process floorplan arrangements that do not include Y-axis offsets. Although exemplary modified routing processes that address Y-axis alignment offsets are described below with reference to the simplified 3×3 array introduced above, those skilled in the art will understand that the principles set forth below are relatively easily transferred to the HBM-based PHY tiles described above.

Figure 16:
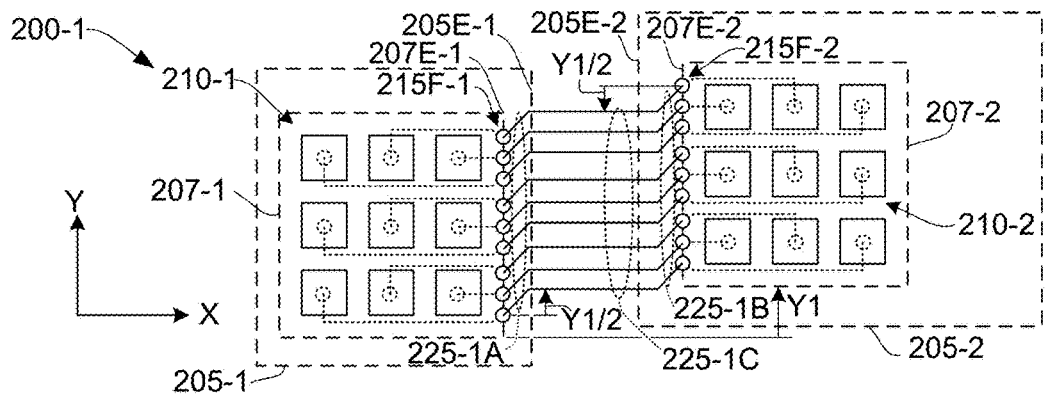
FIG. 16 is a plan views depicting a simplified interposer configuration utilizing 45-degree jogs to address offset alignment issues according to another aspect of the present invention.
Figure 21A:
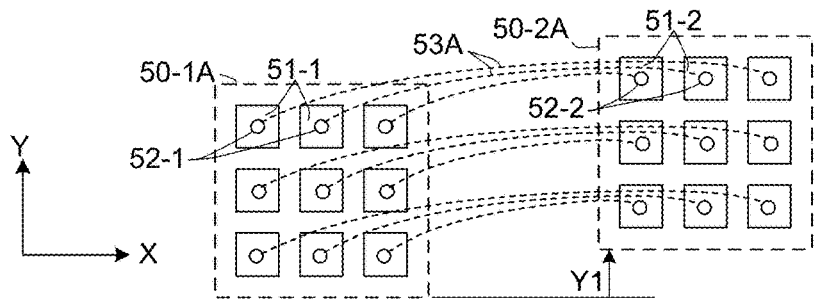
FIGS. 21(A), 21(B), 21(C) and 21(D) are simplified plan views illustrating typical offset alignment problems encountered by current commercially available automatic routing tools.
Figure 21B:
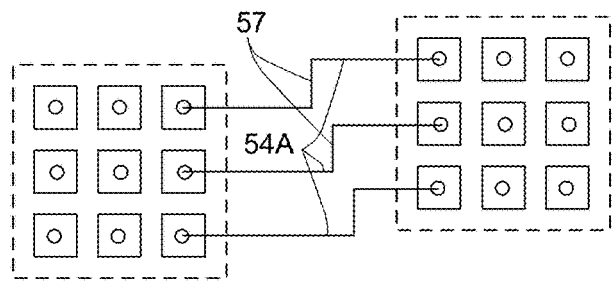
Figure 21C:
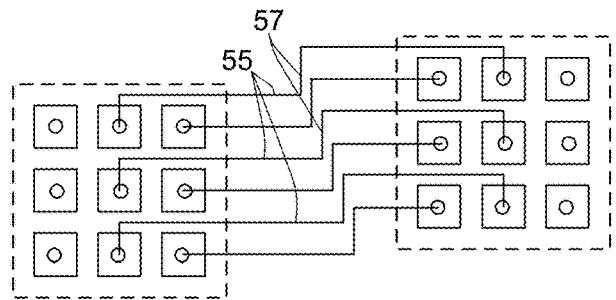
Figure 21D:
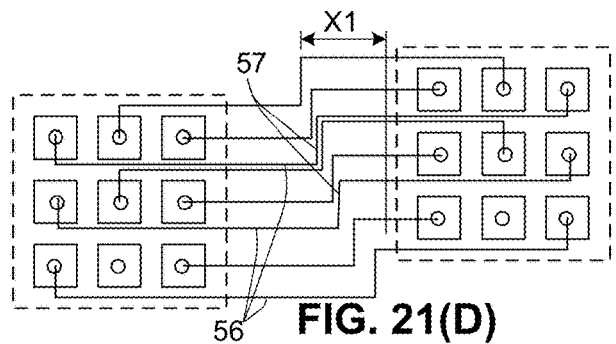

FIG. 16 illustrates a first approach for addressing a Y-axis alignment offset issue similar to that introduced above with reference to prior art FIG. 21(A), where a layout 200-1 includes an memory footprint region 205-1 offset in the Y-axis direction from processor footprint 205-2 by a distance Y1. In this case, PHY footprint sub-regions 207-1 and 207-2, which are located inside memory footprint region 205-1 and processor footprint 205-2 in the manner set forth above, are populated with PHY tiles 210-1 and 210-2, respectively. In the embodiment depicted in FIG. 16, a shape-based router is utilized to calculate offset distance Y1, and to generate a complete routing solution that both corrects for the Y-axis alignment offset and provides all required connections by way of generating a first set of 45° jogs 225-1A that extend from routing pins 215F-1 on tile edges 207E-1 to footprint edge 205E-1 of memory footprint region 205-1, and by generating a second set of 45° jogs 225-1B (if needed) that extend from routing pins 215F-2 on tile edges 207E-2 toward footprint edge 205E-2 of xPU footprint region 205-2, and parallel signal lines 225-1C that extend between the two endpoints of associated 45° jogs. In the illustrated example, 45° jogs 225-1A are configured to make up 50% of offset distance Y1 (i.e., Y1/2), and 45° jogs 225-1B are configured to make up the other 50% of offset distance Y1, although in other embodiments one set of 45° jogs may be extended to make up the entire offset distance. An advantage to the approach shown in FIG. 16 is that both sets of 45° jogs 225-1A and 225-1B remain inside the device footprint (i.e., the endpoints of 45° jogs 225-1A are disposed inside memory footprint region 205-1, and the endpoints of 45° jogs 225-1B are disposed inside xPU footprint region 205-2). In combination with the reduced X-axis offset achieved by the use of 45° jogs (i.e., in comparison to the Manhattan jogs described above with reference to FIGS. 21(A) to 21(D)), the approach illustrated in FIG. 16 facilitates minimal X-axis spacing between the memory and xPU devices by way of "hiding" up to approximately 660 microns of offset distance under an HMB2 die, which facilitates protecting the metal signal lines during subsequent packaging.

Figure 17A:
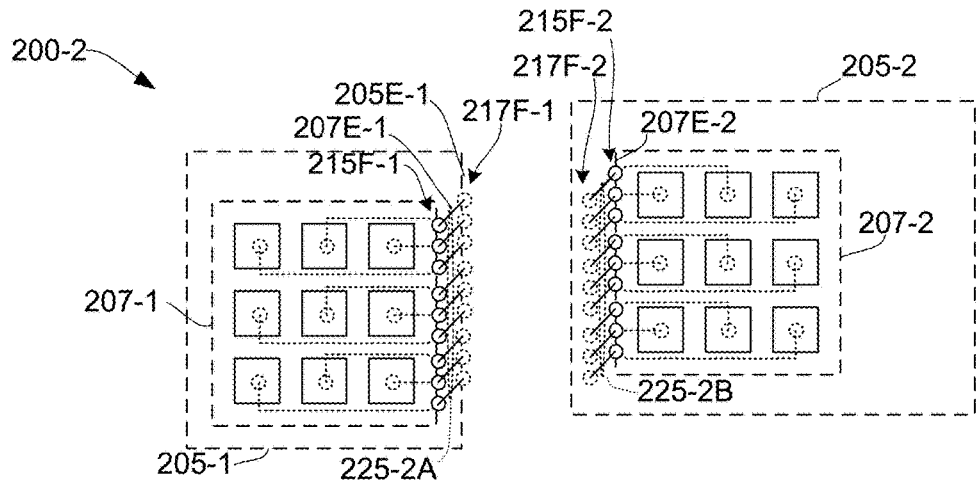
FIGS. 17(A) and 17(B) are plan views depicting a routing process utilized to generate the simplified interposer configuration of FIG. 16 according to another embodiment of the present invention.
Figure 17B:
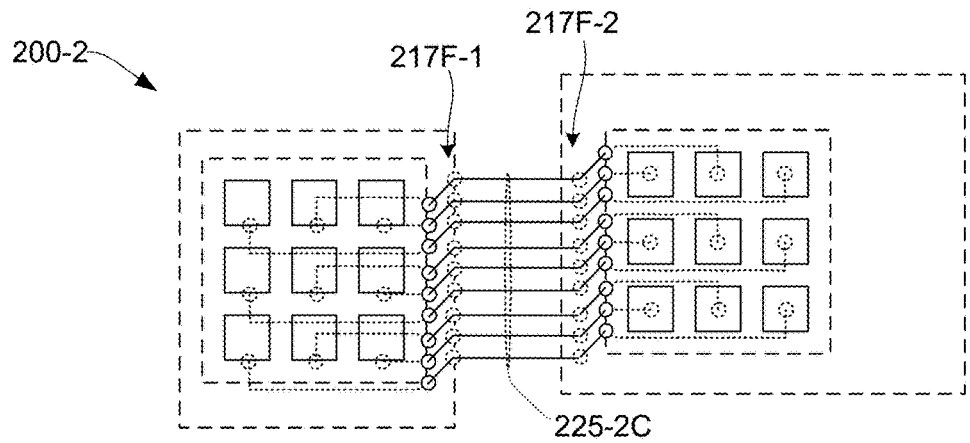

FIGS. 17(A) and 17(B) illustrate a second approach to addressing the Y-axis alignment offset issue in which a shape-based router is utilized to generate a partial routing solution for an interposer layout 200-2, and then an RDL router is used to complete the routing solution. Specifically, as indicated in FIG. 17(A), the shape-based router is utilized to generate a first set of 45° jogs 225-2A that extend from routing pins 215F-1 on tile edges 207E-1 to endpoints 217-1A disposed on footprint edge 205E-1 of memory footprint region 205-1, to generate a second set of 45° jogs 225-2B that extend from routing pins 215F-2 on tile edges 207E-2 to endpoints 217F-2. After the 45° jogs are generated, layout 200-2 is then transferred back into a place-and-route environment for further place and route processing using an RDL router. In this case, as indicated in FIG. 17(B), the RDL router may be utilized to generate signal lines 225-2C between mirror ordered endpoints 217F-1 and 217F-2, thereby completing the routing solution connection the two contact pad arrays.

Figure 18:
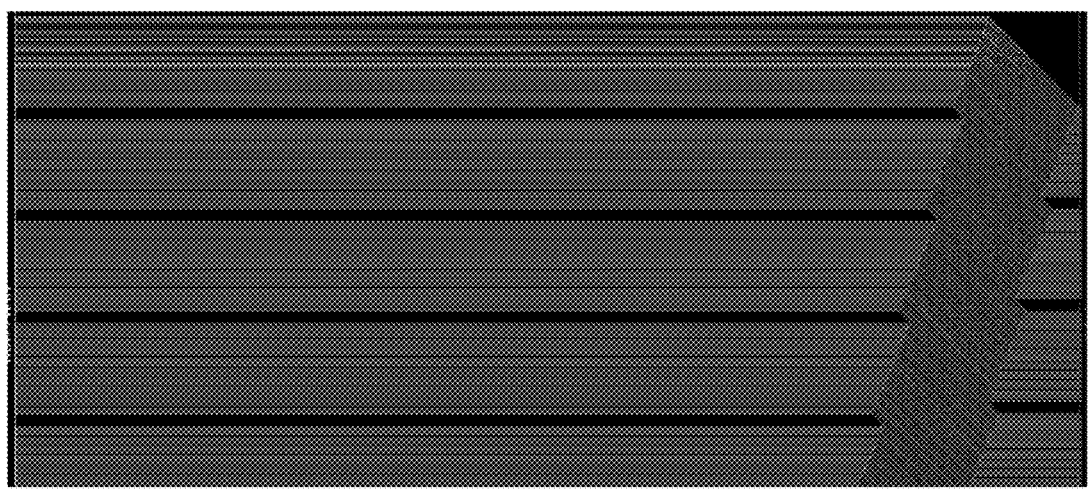
FIG. 18 is a photograph showing multiple sets of signal lines with 45-degree jogs configured in accordance with an exemplary embodiment of the present invention.

FIG. 18 is a diagram showing multiple sets of signal lines, each being part of an associated tile, where the tiles are stacked/arranged in a practical configuration as described above, and where each of the sets of signal lines includes 45° jogs. The illustrated configuration provides an example of how 45° jogs sets implemented using multiple sets of signal lines may be arranged according to an exemplary embodiment.

As set forth above, the tile-based place-and-route methodology and various PHY tile configurations provide several advantages over conventional approaches for dealing with the problem of interconnecting HMB PHYs. The disclosed HBM PHY tile is very flexible, and electrically reliable due to the use of conservative design rules, without losing anything in terms of silicon real estate efficiency. In addition, the combination of the HBM PHY tiles and EDA software tools modified to implement the tile-based place-and-route methodology, provides a fully automated place and route process that utilizes only two interconnect layers, and is extremely silicon real estate efficient.

Although the present invention has been described with respect to certain specific embodiments, it will be clear to those skilled in the art that the inventive features of the present invention are applicable to other embodiments as well, all of which are intended to fall within the scope of the present invention. For example, the present invention is described with specific reference to HBM tiles and an associated tile-based place-and-route methodology primarily directed to the development and production of HBM-based IC devices (i.e., multi-chip devices in which at least two chips communicate by what of HBM-based RAM interface technology) using standard silicon interposers. Although the exemplary embodiments represent presently preferred applications of the tile-based place-and-route methodology involving parallel signal lines implemented by HBM-based technology, the tiles and methodology described herein can be modified within the spirit and scope of the described invention to produce multi-chip IC devices that are fabricated using PHY circuits based on other RAM interface technologies that utilize a different number of parallel signal lines (e.g., a "next-generation" RAM interface technology that utilizes more than 3,000 parallel signal lines).

The invention claimed is:

1. A tile-based place-and-route method for generating an interconnect structure layout such that an interconnect structure fabricated in accordance with the interconnect structure layout is configured to support parallel data transmissions between a first physical layer (PHY) contact pad array disposed on a memory device and a second PHY contact pad array disposed on a processor device, each of said first and second PHY contact pad arrays including spaced-apart device contact pads arranged in associated standardized two-dimensional patterns defined by a selected RAM interface technology such that said parallel data transmissions involve transmitting data from each said device contact pad of the first PHY contact pad array to an associated device contact pad in the second PHY contact pad array, said tile-based place-and-route method comprising, using a processor to perform the following:

placing at least one first tile and at least one second tile in corresponding first footprint regions of said interconnect structure layout, and second each of said first and second tiles comprising layout descriptions including a plurality of interconnect contact pads and a plurality of signal line segments, said at least one first tile and said at least one second tile forming a mirrored tile set, each said signal line segment having a fixed end coupled to a corresponding said interconnect contact pad and a free end disposed on a tile edge of said each first and second tile, wherein placing includes:

orienting said at least one first tile:
such that first said interconnect contact pads disposed on said at least one first tile operably conform with the first PHY contact pad array, and
such that a first said tile edge of said at least one first tile is aligned parallel to a first side edge of the first footprint region such that the free ends of all first said signal line segments disposed on said first tile are disposed between said first interconnect contact pads and said first side edge; and orienting said at least one second tile:
such that second said interconnect contact pads disposed on said at least one second tile operably align with the second PHY contact pad array,
such that a second said tile edge of said at least one second tile is aligned parallel to a second side edge of the second footprint region such that the free ends of all second said signal line segments are disposed between said second interconnect contact pads and said second side edge, and
such that the free ends of the second signal line segments are arranged in a mirrored order relative to the free ends of the first signal line segments; and routing the first interconnect contact pads to the second interconnect contact pads using a plurality of parallel signal lines extending between the first side edge of the first footprint region and the second side edge of the second footprint region, wherein said routing includes coupling each said parallel signal line between the free end of one of said first signal line segments and the free end of an associated said second signal line segment, whereby said each parallel signal line couples one of said first interconnect contact pad to an associated one of said second interconnect contact pads by way of said corresponding first and second signal line segments, and whereby said plurality of parallel signal lines enables parallel data transmission between associated pairs of said first and second interconnect contact pads, and wherein said tile-based place-and-route method further comprises storing the interconnect structure layout in non-volatile memory in a manner that is usable during subsequent generation of fabrication masks used during the fabrication of said interconnect structure.

2. The method of claim 1, further comprising assigning said first footprint region and said second footprint region to corresponding locations of said interconnect structure layout such that said first and second side edges are parallel and face each other across an intervening section of said interconnect structure layout.

3. The method of claim 1, wherein placing said at least one first tile in said first footprint region comprises assigning a plurality of first tiles to corresponding sub-regions of said first footprint region such that said first tile edges of the plurality of first tiles are substantially co-linear and parallel to the first side edge of the first footprint region, whereby the free ends of the first signal line segments in all of the plurality of first tiles are disposed parallel to first side edge.

4. The method of claim 3, wherein assigning said plurality of first tiles comprises assigning an identical layout description to each said corresponding sub-region of said first footprint region.

5. The method of claim 1, wherein placing said at least one second tile in said second footprint region comprises placing mirror-image versions of said plurality of first tiles into corresponding sub-regions of said second footprint region.

6. The method of claim 1, wherein placing said at least one second tile in said second footprint region comprises placing a mirror-image version of said at least one first tile in said second footprint region.

7. The method of claim 1, wherein routing the first interconnect contact pads to the second interconnect contact pads comprises utilizing one of a digital routing tool and an analog routing tool.

8. The method of claim 1,
wherein said plurality of interconnect contact pads of said at least one first tile are configured using an uppermost metal layer, and wherein said plurality of signal line segments are configured using one or more sub-surface metal layers, and
wherein routing comprises configuring each said parallel signal line using said one or more sub-surface metal layers.

9. The method of claim 8,
wherein said plurality of interconnect contact pads include a first group of said interconnect contact pads and a second group of said interconnect contact pads, said second group being disposed between said first group and said first said tile edge,
wherein a first segment group including a group of said signal line segments respectively coupled to said first group of said interconnect contact pads is formed using a first said sub-surface metal layer, and wherein a second segment group of said signal line segments respectively coupled to said second group of said interconnect contact pads is formed using a second said sub-surface metal layer, said second sub-surface metal layer being disposed between said first sub-surface metal layer and said uppermost metal layer, and
wherein routing comprises configuring each said parallel signal line coupled to said first segment group using said first sub-surface metal layer, and configuring each said parallel signal line coupled to said second segment group using said second sub-surface metal layer.

10. The method of claim 9,
wherein each signal line segment of said first segment group is laterally offset from each signal line segment of said second segment group by a spacing distance, and
wherein routing comprises configuring said parallel signal lines coupled to said first and second segment groups such that said parallel signal lines coupled to said first segment group are laterally offset from said parallel signal lines coupled to said second segment group by said spacing distance.

11. The method of claim 10,
wherein said first and second tiles respectively further comprise a plurality of parallel shield line segments including a first group of said shield line segments respectively disposed between adjacent pairs of said signal line segments in said first segment group and a second group of said shield line segments respectively disposed between adjacent pairs of said signal line segments in said second segment group, and
wherein routing further comprises generating parallel shield lines including a first line group and a second line group, said first line group including first shield lines configured using said first sub-surface metal layer such that each said first shield line couples one of said shield line segments of said first group on said first tile to an associated shield line segment of said first group on said second tile, and said second line group including second shield lines configured using said second sub-surface metal layer such that each said second shield line couples one of said shield line segments of said second group on said first tile to an associated said shield line segment of said second group on said second tile.

12. The method of claim 11,
wherein said first and second tiles respectively further comprise a plurality of parallel lower shield line segments and a plurality of parallel upper shield line segments, each said lower shield line segment being disposed directly under an associated signal line segment in said first line segment group, and each said upper shield line segment being disposed directly over an associated signal line segment in said second line segment group, and
wherein routing further comprises generating third shield lines and fourth shield lines, each said third shield line configured using a third sub-surface metal layer disposed below the first sub-surface metal layer such that said each third shield line couples one of said lower shield line segments on said first tile to an associated lower shield line segment on said second tile, and each said fourth shield line being configured using said uppermost metal layer such that said each fourth shield line couples one of said upper shield line segments on said first tile to an associated said upper shield line segment on said second tile.

13. The method of claim 1, wherein routing the first interconnect contact pads to the second interconnect contact pads comprises utilizing a shape-based routing tool.

14. The method of claim 13, wherein utilizing said shape-based routing tool comprises generating 45° jog line segments.

15. An EDA tool configured to implement the tile-based place-and-route method of claim 1.

16. A HBM-based IC device comprising a plurality of tiles formed in accordance with the tile-based place-and-route method of claim 1.

17. An improved processor-based place-and-route tool configured to automatically implement a method for fabricating an interconnect structure comprising:
placing first and second PHY tiles on first and second footprint regions, respectively, in a floorplan of the interconnect structure such that first interconnect contact pads disposed on said first PHY tile operably align with a first PHY contact pad array, and such that a first tile edge of said first PHY tile is aligned parallel to a first side edge of the first footprint region such that free ends of first signal line segments disposed on said first PHY tile are disposed between said first interconnect contact pads and said first side edge, and such that second interconnect contact pads disposed on said second PHY tile operably align with a second PHY contact pad array, such that a second tile edge of said second PHY tile is aligned parallel to a second side edge of the second footprint region such that the free ends of second signal line segments disposed on said second PHY tile are disposed between said second interconnect contact pads and said second side edge, and such that the free ends of the second signal line segments are arranged in a mirrored order relative to the free ends of the first signal line segments; and
routing the first interconnect contact pads to the second interconnect contact pads using a plurality of parallel signal lines extending between the first side edge of the first footprint region and the second side edge of the second footprint region, wherein said routing includes coupling each said parallel signal line between the free end of one of said first signal line segments and the free end of an associated said second signal line segment, whereby said each parallel signal line couples one of said first interconnect contact pad to an associated one of said second interconnect contact pads by way of said corresponding first and second signal line segments, and whereby said plurality of parallel signal lines enables parallel data transmission between associated pairs of said first and second interconnect contact pads when the interconnect structure is manufactured.

* * * * *